(12) United States Patent
Okada et al.

(10) Patent No.: US 7,829,391 B2
(45) Date of Patent: Nov. 9, 2010

(54) ACTIVE MATRIX SUBSTRATE, METHOD OF MAKING THE SUBSTRATE, AND DISPLAY DEVICE

(75) Inventors: Yoshihiro Okada, Souraku-gun (JP); Yuichi Saito, Tenri (JP); Shinya Yamakawa, Ikoma (JP); Atsushi Ban, Nara (JP); Masaya Okamoto, Souraku-gun (JP); Hiroyuki Ohgami, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/658,555

(22) Filed: Feb. 11, 2010

(65) Prior Publication Data

US 2010/0167443 A1    Jul. 1, 2010

Related U.S. Application Data

(62) Division of application No. 12/283,893, filed on Sep. 16, 2008, now Pat. No. 7,696,516.

(30) Foreign Application Priority Data

Aug. 28, 2000   (JP)   ............................. 2000-258042
May 22, 2001   (JP)   ............................. 2001-152779

(51) Int. Cl.
    *H01L 21/82*   (2006.01)
(52) U.S. Cl. ..................... 438/128; 438/149; 438/151
(58) Field of Classification Search ............... 438/48, 438/128, 149, 151; 257/59, 72, 88
    See application file for complete search history.

(56) References Cited

U.S. PATENT DOCUMENTS 5,519,521 A   5/1996   Okimoto et al.

(Continued)

FOREIGN PATENT DOCUMENTS

JP   61-108171   5/1986

(Continued)

OTHER PUBLICATIONS

Kim, et al., "Novel Four-Mask-Count Process Architecture for TFT-LCDs", SID 00 Digest, pp. 1006-1009 (2000).

*Primary Examiner*—Thien F Tran
(74) *Attorney, Agent, or Firm*—Edwards Angell Palmer & Dodge LLP; David G. Conlin; David A. Tucker

(57) ABSTRACT

An active matrix substrate includes base substrate, gate lines, data lines, thin-film transistors and pixel electrodes. The gate lines are formed on the base substrate. The data lines are formed over the gate lines. Each of the data lines crosses all of the gate lines with an insulating film interposed therebetween. The thin-film transistors are formed over the base substrate. Each of the thin-film transistors is associated with one of the gate lines and operates responsive to a signal on the associated gate line. Each of the pixel electrodes is associated with one of the data lines and one of the thin-film transistors and is electrically connectable to the associated data line by way of the associated thin-film transistor. Each of the pixel electrodes and the associated thin-film transistor are connected together by way of a conductive member. Each of the pixel electrodes crosses one of the gate lines, while the conductive member for the pixel electrode crosses another one of the gate lines that is adjacent to the former gate line.

2 Claims, 41 Drawing Sheets

| U.S. PATENT DOCUMENTS | | | | | |
|---|---|---|---|---|---|
| 6,545,730 | B1 | 4/2003 | Hwang | | |
| 6,797,982 | B2 | 9/2004 | Okada et al. | | |
| 7,126,157 | B2 | 10/2006 | Okada et al. | | |
| 7,459,723 | B2 | 12/2008 | Okada et al. | | |

FOREIGN PATENT DOCUMENTS

| JP | 63-279228 | 11/1988 |
|---|---|---|
| JP | 02-245738 | 10/1990 |
| JP | 08-008432 | 1/1996 |
| KR | 1996-32059 | 9/1996 |
| KR | 1997-28690 | 6/1997 |
| KR | 2000-0021351 | 4/2000 |
| KR | 2000-31390 | 6/2000 |
| KR | 2000-38544 | 7/2000 |

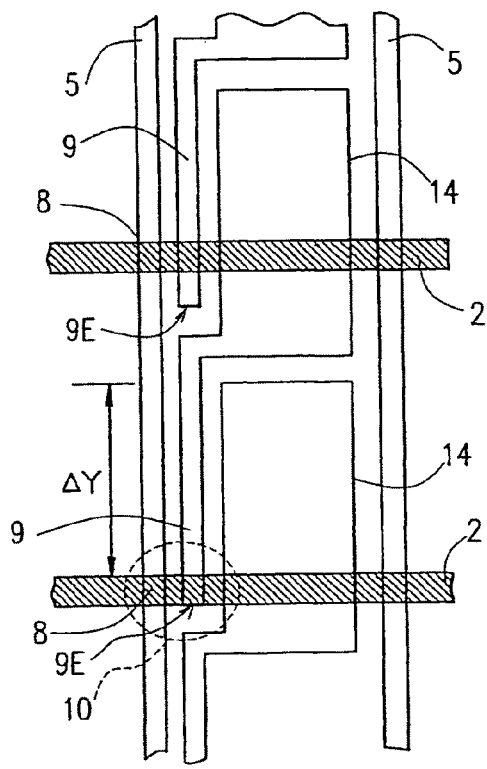
FIG.4A
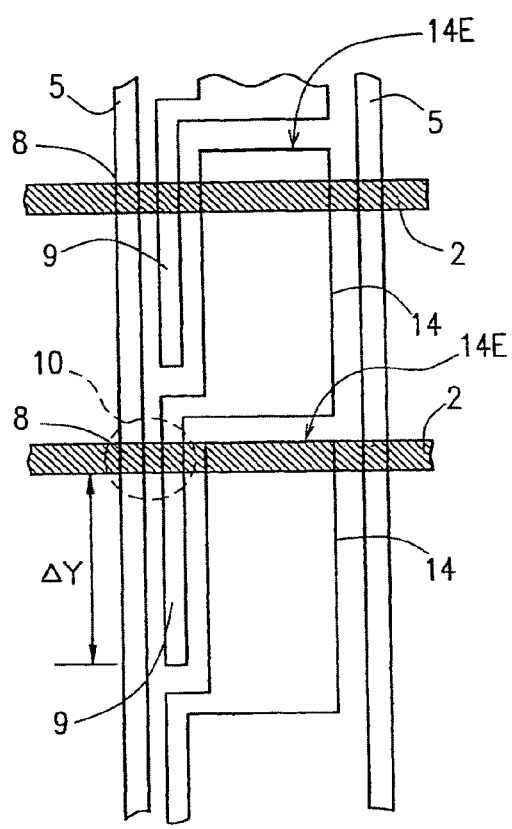
FIG.4B
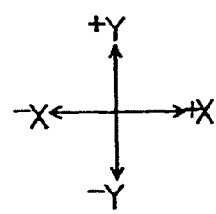

$\triangle Y = \triangle y1 + \triangle y2$
$= Ppitch - Gwidth - PPgap - Wcs - GCgap - DDgap - Ycon$ $$\Delta C = \Delta c1 + \Delta c2$$
$$= Pss - Ws - Wd - 3 \cdot SDgap - Wch$$

$$\Delta P = \Delta p1 + \Delta p2$$
$$= Pss - PPgap$$

$$\Delta Y = \Delta y1 + \Delta y2$$
$$= Ppitch - Gwidth - PPgap - Wcs - GCgap - DDgap - Ycon$$

$$\Delta C = \Delta c1 + \Delta c2$$
$$= Pss - Ws - Wd - 3 \cdot SDgap - Wch$$

$$\Delta P = \Delta p1 + \Delta p2$$
$$= Pss - PPgap$$

$$\Delta Y = \Delta y1 + \Delta y2$$
$$= Ppitch - Gwidth - PPgap - DGgap - Ycon$$

$\Delta C = \Delta c1 + \Delta c2$
$= Pss - Ws - 2 \cdot SDgap - Wch$ $\Delta P = \Delta p1 + \Delta p2$
$= Pss - PPgap$ $\Delta Y = \Delta y1 + \Delta y2$
$= (Ppitch - Gwidth - Wcs - DDgap - DGgap)/2$ $\Delta Y = \Delta y1 + \Delta y2$
$= (Ppitch - Gwidth - Wcs - Ws - 3 \cdot SDgap)/2$ $\Delta Y = \Delta y1 + \Delta y2$
$= (Ppitch - Gwidth - Wcs - 2 \cdot Ws - 3 \cdot SDgap)/2$

ACTIVE MATRIX SUBSTRATE, METHOD OF MAKING THE SUBSTRATE, AND DISPLAY DEVICE

This is a divisional patent application of U.S. patent application Ser. No. 12/283,893 filed 16 Sep. 2008 now U.S. Pat. No. 7,696,516, by Yoshihiro OKADA, Yuichi SAITO, Shinya YAMAKAWA, Atsushi BAN, Masaya OKAMOTO, and Hiroyuki OHGAMI (the same inventors as of this divisional application), entitled ACTIVE MATRIX SUBSTRATE, METHOD OF MAKING THE SUBSTRATE AND DISPLAY DEVICE, now allowed, that in turn is a divisional application of U.S. patent application Ser. No. 11/450,810 filed 8 Jun. 2006, by Yoshihiro OKADA, Yuichi SAITO, Shinya YAMAKAWA, Atsushi BAN, Masaya OKAMOTO, and Hiroyuki OHGAMI (the same inventors as of this divisional application), entitled ACTIVE MATRIX SUBSTRATE, METHOD OF MAKING THE SUBSTRATE AND DISPLAY DEVICE, now U.S. Pat. No. 7,459,723 issued 2 Dec. 2008, that in turn is a divisional patent application of U.S. patent application Ser. No. 10/921,620 filed 19 Aug. 2004, by Yoshihiro OKADA, Yuichi SAITO, Shinya YAMAKAWA, Atsushi BAN, Masaya OKAMOTO, and Hiroyuki OHGAMI (the same inventors as of this divisional application), entitled ACTIVE MATRIX SUBSTRATE, METHOD OF MAKING THE SUBSTRATE AND DISPLAY DEVICE, now U.S. Pat. No. 7,126,157, issued 24 Oct. 2006, that in turn is a divisional patent application of U.S. patent application Ser. No. 09/939,479 filed 24 Aug. 2001, by Yoshihiro OKADA, Yuichi SAITO, Shinya YAMAKAWA, Atsushi BAN, Masaya OKAMOTO, and Hiroyuki OHGAMI (the same inventors as of this divisional application), entitled ACTIVE MATRIX SUBSTRATE, METHOD OF MAKING THE SUBSTRATE AND DISPLAY DEVICE, now U.S. Pat. No. 6,797,982, issued 28 Sep. 2004, which are all incorporated by reference herein in their entireties.

BACKGROUND OF THE INVENTION

The present invention relates to an active matrix substrate and a method of making the substrate and also relates to a display device including the active matrix substrate and a method for fabricating the display device.

Recently, liquid crystal display devices (LCDs) have been further broadening their applications. LCDs were normally used indoors as image display devices for desktop computers or TV, sets. But now LCDs are often used as video or information display devices for various types of mobile electronic units including cell phones, notebook or laptop computers, portable TV sets, digital cameras and digital camcorders and for car-mounted electronic units like a car navigation system.

Some types of LCDs are addressed using matrix electrodes. Those matrix-addressed LCDs are roughly classifiable into the two categories of passive- and active-matrix-addressed LCDs. In an active-matrix-addressed LCD, pixels are arranged in columns and rows as its name signifies, and each of those pixels is provided with a switching element. And by controlling those switching elements using data and gate lines that are arranged to cross each other, the LCD of this type can supply desired signal charge (i.e., data signal) to a selected one of the pixel electrodes.

Hereinafter, a known active-matrix-addressed LCD will be described with reference to FIGS. 43 and 44. FIG. 43 illustrates a schematic configuration for a known LCD of that type. FIG. 44 illustrates a cross-sectional structure for a typical liquid crystal panel.

As shown in FIG. 43, the LCD includes liquid crystal panel 50 and gate and source drive circuits 51 and 52 with gate and source drivers 53. The panel 50 spatially modulates incoming light. The gate drive circuit 51 selectively drives switching elements in the liquid crystal panel 50, while the source drive circuit 52 supplies a signal to each pixel electrode in the panel 50.

As shown in FIG. 44, the panel 50 includes: a pair of transparent insulating substrates 54 and 55 of glass; a liquid crystal layer 38 interposed between the substrates 54 and 55; and a pair of polarizers 56 placed on the outer surfaces of the substrates 54 and 55. The liquid crystal layer 38 may be a twisted nematic liquid crystal layer, for example.

On the inner surface of the substrate 54 facing the liquid crystal layer 38, pixel electrodes 114 are arranged in matrix. A common transparent electrode 36 is formed on the inner surface of the substrate 55. In this construction, a desired voltage can be applied to a selected part of the liquid crystal layer 38 using the pixel electrodes 114 and common transparent electrode 36. Each of the pixel electrodes 14 is connected to the source drive circuit 52 by way of its associated thin-film transistor (TFT) 110 and data line (not shown in FIG. 44). As shown in FIG. 44, the TFTs 110 are formed on the substrate 54. The switching operation of the TFTs 110 is controllable using gate lines (not shown in FIG. 44, either), which are connected to the gate drive circuit 51 and formed on the substrate 54.

On the inner surface of the substrate 55 facing the liquid crystal layer 38, black matrix 35, R, G and B color filters and common transparent electrode 36 have been formed.

The inner surface of the substrates 54 and 55 facing the liquid crystal layer 38 is covered with an alignment film 37. And in the liquid crystal layer 38, spacers 40 with a size of several µm are dispersed.

The substrate 54 including these members thereon is collectively called an "active matrix substrate", while the substrate 55 with those members thereon is called a "counter substrate".

Hereinafter, various structures for known active matrix substrates will be described.

FIG. 45A illustrates a layout for a unit pixel region defined for a known active matrix substrate, while FIG. 45B illustrates a cross section of the unit pixel region taken along the line A-A' shown in FIG. 45A.

In the example illustrated in FIGS. 45A and 45B, multiple gate lines 102 and multiple data lines 105 are formed over a glass substrate 121 so as to cross each other. More specifically, the gate lines 102 belong to a first layer on the glass substrate 121, while the data lines 105 belong to a second layer located over the first layer. And the gate and data lines 102 and 105 are electrically isolated from each other by an insulating film 104 belonging to a third intermediate layer between the first and second layers.

In each rectangular region surrounded by the gate and data lines 102 and 105, a pixel electrode 114 has been formed by patterning a transparent conductive film, for example. The pixel electrode 114 receives signal charges from associated one of the data lines 105 by way of a TFT 110 that has been formed near the intersection between the associated data line 105 and one of the gate lines 102. A storage capacitance line 113 has been formed under the pixel electrode 114 to extend parallel to the gate lines 102. Accordingly, a storage capacitance is created between the pixel electrode 114 and storage capacitance line 113.

As shown in FIG. 45B, the TFT 110 includes gate electrode 103, gate insulating film 104, intrinsic (i-) semiconductor layer 106, doped semiconductor layer 107 and source/drain electrodes 108 and 109. The gate electrode 103 is a branch extended vertically from the gate line 102 as shown in FIG. 45A. The gate electrode 103 is covered with the gate insulating film 104. The semiconductor layer 106 is located right over the gate electrode 103 with the gate insulating film 104 interposed therebetween. The doped semiconductor layer 107 exists on the i-semiconductor layer 106. And the source/drain electrodes 108 and 109 are electrically connected to source/drain regions defined in the i-semiconductor layer 106 by way of the doped semiconductor layer 107. As shown in FIG. 45A, the source electrode 108 is a branch extended vertically from the data line 105 and forms part of the data line 105.

The drain electrode 109 is a conductive member that electrically connects the drain region of the TFT 110 and the pixel electrode 114 together. The drain electrode 109, as well as the data lines 105 and source electrode 108, is formed by patterning a metal film. That is to say, in the illustrated example, the data lines 105 and source/drain electrodes 108 and 109 belong to the same layer, and their layout is determined by a mask pattern for use in a photolithographic process.

The source/drain electrodes 108 and 109 are connected together via a channel region defined in the i-semiconductor layer 106. And the electrical continuity of the channel region is controllable by the potential level at the gate electrode 103. Where the TFT 110 is of n-channel type, the TFT 110 can be turned ON by raising the potential level at the gate electrode 103 to the inversion threshold voltage of the transistor 110 or more. Then, the source/drain electrodes 108 and 109 are electrically continuous to each other, thereby allowing charges to be exchanged between the data line 105 and pixel electrode 114.

To operate the TFT 110 properly, at least part of the source/drain electrodes 108 and 109 should overlap with the gate electrode 103. Normally, the gate electrode 103 has a line width of about 10 μm or less. Accordingly, in a photolithographic process for forming the data lines 105 and source/drain electrodes 108 and 109, these members 105, 108 and 109 should be aligned accurately enough with the gate electrode 103 already existing on the substrate 121. Normally, an alignment accuracy required is on the order of ±several micrometers or even less.

Also, the size of the area where the gate and drain electrodes 103 and 109 overlap with each other defines a gate-drain capacitance $C_{gd}$, which is one of key parameters determining the resultant display performance. That is to say, if the gate-drain capacitance $C_{gd}$ values are not distributed uniformly enough within the substrate plane, then the display quality will deteriorate noticeably. For that reason, the alignment accuracy of an exposure system is controlled at ±1 μm or less in an actual manufacturing process to minimize the misalignment.

As can be seen, extremely high alignment accuracy is recently required in making active matrix substrates. To meet that heavy demand, high-precision exposure systems have been developed and actually operated. Before those high-alignment-accuracy exposure systems were available, however, a layout for an active matrix substrate used to be modified in some way or other to increase the alignment margin as much as possible and thereby raise the production yield.

FIG. 46A illustrates a layout that was proposed for an active matrix substrate when exposure systems still had low alignment accuracy. In the arrangement shown in FIG. 46A, the drain electrode 109 of a TFT 110 extends from a pixel electrode 114 parallel to a data line 105 and crosses a gate line 102. The TFT 110 is formed at and around the intersection between the data and gate lines 105 and 102. In the example illustrated in FIGS. 46A and 46B, the gate and data lines 102 and 105 have no branches, the gate line 102 itself serves as a gate electrode and part of the data line 105 serves as a source electrode 108.

An active matrix substrate with this structure is made in the following manner.

First, transparent conductive film 161 and doped semiconductor layer 107 are deposited in this order over a glass substrate 101, and then patterned using a first mask, thereby forming data lines 105, drain electrodes 109 and pixel electrodes 114.

Next, i-semiconductor layer 106, gate insulating film 104 and metal thin film 102 are deposited in this order over the structure prepared in the previous process step. Then, the metal thin film 102, gate insulating film 104 and i-semiconductor layer 106 are sequentially patterned using a second mask, thereby forming gate lines 102 and storage capacitance lines 113 out of the metal thin film 102.

In this method, even if the gate lines 102 are subsequently formed over, and somewhat misaligned with, the data lines 105 and drain electrodes 109 that were formed first, the gate lines 102 still can overlap both the data lines 105 and the drain electrodes 109 in sufficiently large areas. As a result, the unwanted variation in gate-drain capacitance $C_{gd}$ is suppressible.

In the structure illustrated in FIGS. 46A and 46B, however, the i-semiconductor layer 106 exists in thin stripes under the gate lines 102 and crosses all the data lines 105. Accordingly, when a scan signal (or select signal) is input to one of the gate lines 102 to turn the TFT 110 ON, part of the semiconductor layer 106 located between the drain electrode 109 and the data line 105 on the left-hand side of the drain electrode 109 naturally serves as a channel region for the TFT 110. In addition, another part of the semiconductor layer 106 located between the drain electrode 109 and the data line 105 on the right-hand side of the drain electrode 109 also serves as a channel region for a parasitic transistor unintentionally. In that case, crosstalk should occur between two horizontally adjacent pixels. As a result, the display contrast of an active-matrix-addressed LCD with such a structure, which should be high enough otherwise, decreases disadvantageously.

To solve this problem, an active matrix substrate with the structure shown in FIG. 47 was proposed as disclosed in Japanese Laid-Open Publication No. 61-108171. The active matrix substrate shown in FIG. 47 has basically the same structure as the counterpart shown in FIGS. 45A and 45B. The structure shown in FIG. 47 is different from that shown in FIGS. 45A and 45B in that the gate lines 102 have no branches (i.e., gate electrodes) but that the gate lines 102 themselves serve as gate electrodes in thin stripes. Also, in the structure shown in FIG. 47, the drain electrode 109 extends parallel to the data lines 105. In such a structure, even if the data lines 105 and drain electrode 109 are somewhat misaligned with the gate electrode (i.e., part of the gate line 102), the TFT 110 still can operate properly and the overlap area between the drain electrode 109 and gate line 102 does not change. Consequently, the variation in capacitance $C_{gd}$ is suppressible.

The structure shown in FIG. 47 can increase the alignment margin up to about 10-20 μm. However, most of the exposure systems currently used for making active matrix substrates realize an alignment accuracy of less than ±1 μm. For that reason, the structure shown in FIG. 47 is rarely used now. Instead, the structure shown in FIGS. 45A and 45B is actually adopted much more often to increase the aperture ratio and to make the layout more easily modifiable when failures are found.

In another known type of structure (see Japanese Laid-Open Publication No. 63-279228), pixel electrodes are formed in a layer different from the layer where data lines belong so that the pixel electrodes, formed on an interlevel dielectric film, overlap the data lines. In such a structure, no horizontal gap is needed between the pixel electrodes and data lines because the pixel electrodes are included in a layer located over the layer where the data lines belong. As a result, the pixel electrodes can have their aperture ratio increased and an LCD including such a substrate can have its power dissipation reduced.

Recently, to reduce the weight of electronic units, LCDs fabricated on a plastic substrate, lighter in weight than a glass substrate, are sometimes modeled.

However, the sizes of a plastic substrate are changeable considerably during a fabrication process. Also, any size of a plastic substrate is changeable differently depending on a particular combination of process conditions. So an LCD on a plastic substrate currently operates too much inconsistently to put it to actual use.

A rate at which a plastic substrate changes its size (i.e., expands or shrinks) horizontally to its principal surface (which will be herein referred to as a "substrate expandability") heavily depends on the process temperature or the amount of water absorbed into the plastic substrate. For example, the temperature-dependent expandability of a glass substrate is 3 to 5 ppm/° C., while that of a plastic substrate is as much as 50 to 100 ppm/° C. Also, a plastic substrate is expandable at as high a rate as 3000 ppm when absorbs water.

The substrate expandability reaching 3000 ppm is the maximum value in all the process steps of the fabrication process thereof. To estimate the mask misalignment actually observable in a photolithographic process, the present inventor modeled TFTs on a plastic substrate and measured how much the substrate was expandable or shrinkable in the interval between two photolithographic process steps that were performed under mutually different combinations of conditions. As a result, I found that the substrate was expandable or shrinkable between the two photolithographic process steps requiring mask alignment at about 500 to 1000 ppm.

If a plastic substrate with a diagonal size of 5 inches is expandable or shrinkable at that high rate, then the size of the substrate is changeable by 64 to 128 µm. And when the substrate size is changeable in such a wide range, no TFTs made by any known method of making an active matrix substrate are operable properly.

I estimated alignment margins allowable by the known structure shown in FIG. 47. FIG. 48 illustrates how an active matrix substrate with the basic structure shown in FIG. 47 should be laid out where an alignment margin, substantially equal to the line width of the data lines 105, is allowed for the substrate. Using this layout, I carried out a computer simulation to obtain substrate expandability that an active matrix substrate with the known structure shown in FIG. 47 and a diagonal size of 5 inches can cope with. The results are as follows:

TABLE 1

| Pixel pitch (µm) | Alignment margin (µm) | Expandability (ppm) |
|---|---|---|
| 350 | 24 | 378 |
| 300 | 19 | 299 |
| 250 | 14 | 220 |
| 200 | 9 | 142 | where the exposure system is supposed to have an alignment accuracy of ±0 µm. As shown in Table 1, an active matrix substrate including pixels with a pixel pitch of 250 µm, for example, allows an alignment margin of only ±14 µm or less. An active matrix substrate allowing such a narrow alignment margin can barely cope with a substrate expandability of 220 ppm or less.

As can be seen from the foregoing description, none of the known structures allows for preparing an active matrix substrate using a plastic substrate. So there has been no other choice than using a glass substrate with low shock resistance and of a hardly reducible weight for an active matrix substrate.

SUMMARY OF THE INVENTION

An object of this invention is to provide (1) an active matrix substrate, which can avoid various misalignment-related problems even if a greatly expandable substrate of plastic, for example, is used as a base substrate for the active matrix substrate and (2) a method of making a substrate of that type.

Another object of this invention is to provide an active matrix substrate in which an array of thin-film transistors has been formed on a plastic substrate.

Still another object of this invention is to provide a display device that has been fabricated using the active matrix substrate of the present invention.

An active matrix substrate according to the present invention includes base substrate, gate lines, data lines, thin-film transistors and pixel electrodes. The gate lines are formed on the base substrate. Each of the data lines crosses all of the gate lines with an insulating film interposed therebetween. The thin-film transistors are formed over the base substrate. Each of the thin-film transistors is associated with one of the gate lines and operates responsive to a signal on the associated gate line. Each of the pixel electrodes is associated with one of the data lines and one of the thin-film transistors and is electrically connectable to the associated data line by way of the associated thin-film transistor. In this active matrix substrate, each said pixel electrode and the associated thin-film transistor are connected together by way of a conductive member. And each said pixel electrode crosses one of the gate lines, while the conductive member for the pixel electrode crosses another one of the gate lines that is adjacent to the former gate line.

Another active matrix substrate according to the present invention includes base substrate, gate lines, storage capacitance lines, data lines, thin-film transistors and pixel electrodes. The gate lines and storage capacitance lines are formed on the base substrate. Each of the data lines crosses all of the gate and storage capacitance lines with an insulating film interposed therebetween. The thin-film transistors are formed over the base substrate. Each of the thin-film transistors is associated with one of the gate lines and operates responsive to a signal on the associated gate line. Each of the pixel electrodes is associated with one of the data lines and one of the thin-film transistors and is electrically connectable to the associated data line by way of the associated thin-film transistor. In this active matrix substrate, each said pixel electrode and the associated thin-film transistor are connected together by way of a conductive member. And each said pixel electrode crosses not only one of the gate lines but also one of the storage capacitance lines, while the conductive member for the pixel electrode crosses not only another one of the gate lines that is adjacent to the former gate line but also another one of the storage capacitance lines that is adjacent to the former storage capacitance line.

Still another active matrix substrate according to the present invention includes base substrate, gate lines, storage capacitance lines, data lines, thin-film transistors, lower-level pixel electrodes and upper-level pixel electrodes. The gate lines and storage capacitance lines are formed on the base substrate. Each of the data lines crosses all of the gate and storage capacitance lines with a first insulating film interposed therebetween. The thin-film transistors are formed over the base substrate. Each of the thin-film transistors is associated with one of the gate lines and operates responsive to a signal on the associated gate line. Each of the lower-level pixel electrodes is associated with one of the data lines and one of the thin-film transistors and is electrically connectable to the associated data line by way of the associated thin-film transistor. The upper-level pixel electrodes are located over the lower-level pixel electrodes with a second insulating film interposed therebetween. Each of the upper-level pixel electrodes is associated with, and electrically connectable to, one of the lower-level pixel electrodes by way of an associated contact hole. In this active matrix substrate, each said lower-level pixel electrode and the associated thin-film transistor are connected together by way of a conductive member. The data lines, the conductive members and the lower-level pixel electrodes have all been formed by patterning the same conductive film. And each said lower-level pixel electrode crosses not only one of the gate lines but also one of the storage capacitance lines, while the conductive member for the lower-level pixel electrode crosses not only another one of the gate lines that is adjacent to the former gate line but also another one of the storage capacitance lines that is adjacent to the former storage capacitance line.

Yet another active matrix substrate according to the present invention includes base substrate, gate lines, data lines, thin-film transistors, lower-level pixel electrodes and upper-level pixel electrodes. The gate lines are formed on the base substrate. Each of the data lines crosses all of the gate lines with a first insulating film interposed there-between. The thin-film transistors are formed over the base substrate. Each of the thin-film transistors is associated with one of the gate lines and operates responsive to a signal on the associated gate line. Each of the lower-level pixel electrodes is associated with one of the data lines and one of the thin-film transistors and is electrically connectable to the associated data line by way of the associated thin-film transistor. The upper-level pixel electrodes are located over the lower-level pixel electrodes with a second insulating film interposed therebetween. Each of the upper-level pixel electrodes is associated with, and electrically connectable to, one of the lower-level pixel electrodes by way of an associated contact hole. In this active matrix substrate, each said upper-level pixel electrode and the associated lower-level pixel electrode together makes up a pixel electrode, which is connected to the thin-film transistor, associated with the lower-level pixel electrode, by way of a conductive member. The data lines, the conductive members and the lower-level pixel electrodes have all been formed by patterning the same conductive film. And each said lower-level pixel electrode crosses one of the gate lines, while the conductive member for the lower-level pixel electrode crosses another one of the gate lines that is adjacent to the former gate line.

Yet another active matrix substrate according to the present invention includes base substrate, gate lines, storage capacitance lines, data lines, thin-film transistors, lower-level pixel electrodes and upper-level pixel electrodes. The gate lines and storage capacitance lines are formed on the base substrate. Each of the data lines crosses all of the gate and storage capacitance lines with a first insulating film interposed therebetween. The thin-film transistors are formed over the base substrate. Each of the thin-film transistors is associated with one of the gate lines and operates responsive to a signal on the associated gate line. Each of the lower-level pixel electrodes is associated with one of the data lines and one of the thin-film transistors and is electrically connectable to the associated data line by way of the associated thin-film transistor. The upper-level pixel electrodes are located over the lower-level pixel electrodes with a second insulating film interposed therebetween. Each of the upper-level pixel electrodes is associated with, and electrically connectable to, one of the lower-level pixel electrodes by way of an associated contact hole. In this active matrix substrate, each said upper-level pixel electrode and the associated lower-level pixel electrode together makes up a pixel electrode, which is connected to the thin-film transistor, associated with the lower-level pixel electrode, by way of a conductive member. The data lines, the conductive members and the lower-level pixel electrodes have all been formed by patterning the same conductive film. When one of the gate lines crosses associated ones of the lower-level pixel electrodes, one of the storage capacitance lines, which is adjacent to the gate line, crosses associated ones of the conductive members. On the other hand, when one of the gate lines crosses associated ones of the conductive members, one of the storage capacitance lines, which is adjacent to the gate line, crosses associated ones of the lower-level pixel electrodes.

In one embodiment of the present invention, the active matrix substrate may further include source electrodes, each said source electrode branching from one of the data lines and crossing one of the gate lines. An intersection of each said conductive member with associated one of the gate lines may be located between an intersection of one of the data lines that is closest to the conductive member and the gate line and an intersection of one of the source electrodes that is closest to the conductive member and the gate line.

In another embodiment of the present invention, a distance between each said conductive member and the data line closest to the conductive member may be substantially equal to a distance between the conductive member and the source electrode closest to the conductive member.

In still another embodiment, each said thin-film transistor may have its channel located substantially at the mid-point between two adjacent ones of the data lines.

In yet another embodiment, the channel of each said thin-film transistor may be covered with one of the upper-level pixel electrodes.

In yet another embodiment, a semiconductor layer for each said thin-film transistor may have been self-aligned with the gate line associated with the thin-film transistor. The data lines and associated ones of the conductive members may cross the semiconductor layer.

In yet another embodiment, the data lines and the conductive members may extend across the semiconductor layer. The channel regions in the semiconductor layer may be covered with a channel protective layer that has been self-aligned with the associated gate line.

In yet another embodiment, side faces of the channel protective layer, which are parallel to a direction in which the data lines and the conductive members extend, may be aligned with outer side faces of the data lines and the conductive members.

In yet another embodiment, the other side faces of the channel protective layer, which are parallel to a direction in which the gate lines extend, may be spaced apart from each other by a distance smaller than the line width of the gate lines.

In yet another embodiment, each said conductive member may extend from the pixel electrode, connected to the conductive member, parallel to the data lines. A distance between a far end of the conductive member and an opposite far end of the pixel electrode, connected to the conductive member, may be longer than a pitch of the gate lines but less than twice as long as the gate line pitch.

In yet another embodiment, each of the data lines, the conductive members and the pixel electrodes may include a conductive layer that has been formed by patterning the same conductive film.

In yet another embodiment, each of the data lines, the conductive members and the pixel electrodes may include a transparent conductive layer that has been formed by patterning the same transparent conductive film. An opaque film may cover the transparent conductive layer included in each said data line.

In yet another embodiment, the opaque film may be made of a metal that has an electrical resistivity lower than that of the transparent conductive layer.

In yet another embodiment, in a display area, no parts of the gate and data lines may protrude parallel to the surface of the base substrate.

In yet another embodiment, the gate lines may be made of a metal with opacity.

In yet another embodiment, each said gate line may have a slit-like opening that transmits light at least in respective areas where the thin-film transistors are formed.

In yet another embodiment, each said gate line may be divided into multiple line portions at least in respective areas where the thin-film transistors are formed.

In yet another embodiment, when a negative photosensitive resin layer, which has been formed to cover the gate lines, is partially exposed to light that has been incident thereon through the backside of the base substrate, each said line portion may have such a line width as exposing substantially all of the negative photosensitive resin layer, which is located over the line portion, to the light by utilizing diffraction of the light.

In yet another embodiment, the data lines may be laid out over the base substrate so as to allow the base substrate to expand or shrink less horizontally to the data lines than vertically to the data lines.

In yet another embodiment, the gate lines may be extended beyond the display area, and the extension of each said gate line may have a length greater than the gate line pitch.

In yet another embodiment, color filters may have been formed over the pixel electrodes.

In yet another embodiment, the base substrate may be made of plastic.

In yet another embodiment, the base substrate may include, as an integral part thereof, an optical member for changing the optical path or polarization of incident light.

Yet another active matrix substrate according to the present invention includes plastic substrate, first, second and third gate lines, data line, first and second pixel electrodes and first and second thin-film transistors. The first gate line is formed on the plastic substrate. The second gate line is also formed on the plastic substrate and placed parallel to the first gate line. The third gate line is also formed on the plastic substrate and placed parallel to the second gate line. The data line crosses the first, second and third gate lines with an insulating film interposed therebetween. The first pixel electrode crosses the first gate line, while the second pixel electrode crosses the second gate line. The first thin-film transistor is self-aligned with the second gate line, while the second thin-film transistor is self-aligned with the third gate line. In this active matrix substrate, the first pixel electrode is connected to the first thin-film transistor by way of a first conductive member that crosses the second gate line. The second pixel electrode is connected to the second thin-film transistor by way of a second conductive member that crosses the third gate line.

A display device according to the present invention includes: an active matrix substrate according to any of the embodiments of the present invention; a counter substrate facing the active matrix substrate; and a light modulating layer interposed between the active matrix and counter substrates.

A portable electronic unit according to the present invention includes the display device of the present invention.

An inventive method of making an active matrix substrate includes the steps of: a) forming a plurality of gate lines on a base substrate; b) depositing an insulating film that covers the gate lines; and c) depositing a semiconductor layer over the insulating film. The method further includes the step of d) forming a positive resist layer over the semiconductor layer. The method further includes the step of e) exposing the positive resist layer to light that has been incident thereon through the backside of the base substrate and then developing the positive resist layer exposed, thereby defining a first resist mask over the gate lines so that the first resist mask is aligned with the gate lines. The method further includes the step of f) removing parts of the semiconductor layer, which are not covered with the first resist mask, thereby forming a striped semiconductor layer, including portions to be semiconductor regions for thin-film transistors, so that the striped semiconductor layer is self-aligned with the gate lines. The method further includes the steps of: g) removing the first resist mask; and h) depositing a conductive film over the striped semiconductor layer. And the method further includes the step of i) patterning the conductive film using a second resist mask, thereby forming not only a data line and a pixel electrode, which both cross a first one of the gate lines, but also a conductive member, which extends from the pixel electrode parallel to the data line and crosses a second one of the gate lines that is adjacent to the first gate line, and then patterning the striped semiconductor layer, thereby defining the semiconductor regions for the thin-film transistors below the data line and the conductive member.

In one embodiment of the present invention, the step i) may include defining a resist pattern, including relatively thick and relatively thin portions, as the second resist mask. The relatively thick portions will define the data line and the conductive member, while the relatively thin portion will define a region between the data line and the conductive member. The step i) may further include: etching away parts of the conductive film and the striped semiconductor layer that are not covered with the resist pattern; removing the relatively thin portion from the resist pattern; and etching away another part of the conductive film, which has been covered with the relatively thin portion of the resist pattern, thereby forming the data line and the conductive member.

Another inventive method of making an active matrix substrate includes the steps of: a) forming a plurality of gate lines on a base substrate; b) depositing an insulating film that covers the gate lines; and c) depositing a semiconductor layer over the insulating film. The method further includes the step of d) forming a positive resist layer over the semiconductor layer. The method further includes the step of e) exposing the positive resist layer to light that has been incident thereon through the backside of the base substrate and then developing the positive resist layer exposed, thereby defining a first resist mask over the gate lines so that the first resist mask is aligned with the gate lines. The method further includes the step of f) removing parts of the semiconductor layer, which are not covered with the first resist mask, thereby forming a striped semiconductor layer, including portions to be semiconductor regions for thin-film transistors, so that the striped semiconductor layer is self-aligned with the gate lines. The method further includes the step of: g) removing the first resist mask. The method further includes the step of h) depositing a transparent conductive film over the striped semiconductor layer; and i) depositing an opaque film over the transparent conductive film. The method further includes the step of j) patterning the opaque and transparent conductive films using a second resist mask, thereby forming not only a data line and a pixel electrode, which both cross a first one of the gate lines, but also a conductive member, which extends from the pixel electrode parallel to the data line and crosses a second one of the gate lines that is adjacent to the first gate line, and then patterning the striped semiconductor layer, thereby defining the semiconductor regions for the thin-film transistors below the data line and the conductive member. The method further includes the step of k) coating the surface of the base substrate with a negative photosensitive resin material. And the method further includes the step of l) exposing the negative photosensitive resin material to light that has been incident thereon through the backside of the base substrate, and then developing the negative photosensitive resin material exposed, thereby removing non-exposed parts of the negative photosensitive resin material and forming a black matrix.

In one embodiment of the present invention, in the step l), parts of the negative photosensitive resin material, which cover the data line, the conductive member and the semiconductor regions for the thin-film transistors, may be exposed to light that passes through areas where the gate lines and the opaque film do not exist, thereby covering an area where the pixel electrode does not exist with the black matrix.

In another embodiment of the present invention, parts of the opaque film, which are not covered with the black matrix, may be etched away, thereby defining a translucent region over the pixel electrode.

In still another embodiment, the step j) may include defining a resist pattern, including relatively thick and relatively thin portions, as the second resist mask. The relatively thick portions will define the data line and the conductive member, while the relatively thin portion will define a region between the data line and the conductive member. The step j) may further include: etching away parts of the opaque film, the transparent conductive film and the striped semiconductor layer that are not covered with the resist pattern; removing the relatively thin portion from the resist pattern; and etching away another part of the opaque film and the transparent conductive film, which has been covered with the relatively thin portion of the resist pattern, thereby forming the data line and the conductive member.

Still another inventive method of making an active matrix substrate includes the steps of: a) forming a plurality of gate lines on a base substrate; b) depositing an insulating film that covers the gate lines; and c) depositing a semiconductor layer over the insulating film. The method further includes the step of d) forming a channel protective layer over the semiconductor layer. The method further includes the step of e) forming a first positive resist layer over the channel protective layer. The method further includes the step of f) exposing the first positive resist layer to light that has been incident thereon through the backside of the base substrate and then developing the first positive resist layer exposed, thereby defining a first resist mask over the gate lines so that the first resist mask is aligned with the gate lines. The method further includes the step of g) removing parts of the channel protective layer, which are not covered with the first resist mask, thereby patterning and self-aligning the channel protective layer with the gate lines so that the patterned channel protective layer has a line width narrower than that of the gate lines. The method further includes the steps of: h) depositing a contact layer over the patterned channel protective layer and the semiconductor layer; and i) forming a second positive resist layer over the contact layer. The method further includes the step of j) exposing the second positive resist layer to light that has been incident thereon through the backside of the base substrate and then developing the second positive resist layer exposed, thereby defining a second resist mask over the gate lines so that the second resist mask is aligned with the gate lines. The method further includes the step of k) removing parts of the contact and semiconductor layers, which are not covered with the second resist mask, thereby forming a striped contact layer and a striped semiconductor layer, including portions to be semiconductor regions for thin-film transistors, so that the striped contact and semiconductor layers are both self-aligned with the gate lines. The method further includes the steps of: l) removing the second resist mask; and m) depositing a conductive film over the striped contact layer. And the method further includes the step of n) patterning the conductive film using a third resist mask, thereby forming not only a data line and a pixel electrode, which both cross a first one of the gate lines, but also a conductive member, which extends from the pixel electrode parallel to the data line and crosses a second one of the gate lines that is adjacent to the first gate line, and then patterning the striped contact layer, the pattered channel protective layer and the striped semiconductor layer, thereby defining the semiconductor regions for the thin-film transistors below the data line and the conductive member so that the upper surface of the semiconductor regions is partially covered with the patterned channel protective layer.

In one embodiment of the present invention, the step n) may include defining a resist pattern, including relatively thick and relatively thin portions, as the third resist mask. The relatively thick portions will define the data line and the conductive member, while the relatively thin portion will define a region between the data line and the conductive member. The step n) may further include: etching away parts of the conductive film, the striped contact layer, the patterned channel protective layer and the striped semiconductor layer that are not covered with the resist pattern; removing the relatively thin portion from the resist pattern; and etching away another part of the conductive film and contact layer, which has been covered with the relatively thin portion of the resist pattern, thereby forming the data line and the conductive member that are separated from each other.

Yet another inventive method of making an active matrix substrate includes the steps of: a) forming a plurality of gate lines on a base substrate; b) depositing an insulating film that covers the gate lines; and c) depositing a semiconductor layer over the insulating film. The method further includes the step of d) forming a channel protective layer over the semiconductor layer. The method further includes the step of e) forming a positive resist layer over the channel protective layer. The method further includes the step of f) exposing the positive resist layer to light that has been incident thereon through the backside of the base substrate and then developing the positive resist layer exposed, thereby defining a first resist mask over the gate lines so that the first resist mask is aligned with the gate lines. The method further includes the step of g) removing parts of the channel protective layer, which are not covered with the first resist mask, thereby patterning and self-aligning the channel protective layer with the gate lines.

The method further includes the steps of: h) depositing a contact layer over the patterned channel protective layer and the semiconductor layer; and i) depositing a conductive film over the contact layer. And the method further includes the step of j) patterning the conductive film using a second resist mask, thereby forming not only a data line and a pixel electrode, which both cross a first one of the gate lines, but also a conductive member, which extends from the pixel electrode parallel to the data line and crosses a second one of the gate lines that is adjacent to the first gate line, and then patterning the contact layer, the patterned channel protective layer and the semiconductor layer, thereby defining semiconductor regions for thin-film transistors below the data line and the conductive member so that the upper surface of the semiconductor regions are covered with the patterned channel protective layer.

In one embodiment of the present invention, the step j) may include defining a resist pattern, including relatively thick and relatively thin portions, as the second resist mask. The relatively thick portions will define the data line and the conductive member, while the relatively thin portion will define a region between the data line and the conductive member. The step j) may further include: etching away parts of the conductive film, the contact layer, the patterned channel protective layer and the semiconductor layer that are not covered with the resist pattern; removing the relatively thin portion from the resist pattern; and etching away another part of the conductive film and contact layer, which has been covered with the relatively thin portion of the resist pattern, thereby forming the data line and the conductive member that are separated from each other.

In another embodiment of the present invention, before the contact layer is deposited in the step h), the semiconductor layer may be patterned and self-aligned with the gate lines by exposing the semiconductor layer to light that has been incident thereon through the backside of the base substrate.

In still another embodiment, when the part of the conductive film and contact layer, which has been covered with the relatively thin portion of the resist pattern, is etched away after the relatively thin portion of the resist pattern has been removed, an exposed part of the semiconductor layer may be etched away to leave the semiconductor regions for the thin-film transistors under the patterned channel protective layer.

Yet another inventive method of making an active matrix substrate includes the steps of: a) depositing a semiconductor film over a base substrate; and b) depositing a first conductive film over the semiconductor film. The method further includes the step of c) patterning the first conductive and semiconductor films, thereby forming a plurality of data lines, a plurality of pixel electrodes and a plurality of conductive members so that parts of the semiconductor film, located between each said data line and associated ones of the conductive members, are not removed but left. In this step c), each said conductive member extends from associated one of the pixel electrodes along associated one of the data lines. The method further includes the step of d) depositing an insulating film over the base substrate. The method further includes the step of e) depositing a second conductive film over the insulating film. And the method further includes the step of f) patterning the second conductive film, thereby forming a plurality of gate lines, which cross the data lines, the pixel electrodes and the conductive members, and etching away the parts of the semiconductor film located between each said data line and the associated conductive members entirely except some of the parts of the semiconductor film that are located under the gate lines.

In one embodiment of the present invention, the step c) may include defining a resist mask including relatively thick and relatively thin portions. The relatively thick portions will define the data lines, the pixel electrodes and the conductive members, while each of the relatively thin portions will define a region between associated one of the data lines and associated ones of the conductive members. The step c) may further include: etching away parts of the first conductive and semiconductor films that are not covered with the resist mask; removing the relatively thin portions from the resist mask; and etching away other parts of the first conductive film, which have been covered with the relatively thin portions of the resist mask.

Yet another inventive method of making an active matrix substrate includes the steps of: a) forming a gate electrode on a base substrate; b) forming a gate insulating film that covers the gate electrode; and c) depositing a semiconductor layer over the gate insulating film. The method further includes the step of d) forming a positive resist layer over the semiconductor layer. The method further includes the step of e) exposing the positive resist layer to light that has been incident thereon through the backside of the base substrate and then developing the positive resist layer exposed, thereby defining a first resist mask over the gate electrode so that the first resist mask is aligned with the gate electrode. The method further includes the step of f) removing parts of the semiconductor layer, which are not covered with the first resist mask, thereby patterning and self-aligning the semiconductor layer with the gate electrode so that the patterned semiconductor layer includes a semiconductor region for a thin-film transistor. The method further includes the step of g) removing the first resist mask. The method further includes the step of h) depositing a conductive film over the patterned semiconductor layer. And the method further includes the step of i) patterning the conductive film using a second resist mask, thereby forming source and drain electrodes, which both cross the gate electrode, and then further patterning the patterned semiconductor layer, thereby defining the semiconductor region for the thin-film transistor below the source and drain electrodes.

In one embodiment of the present invention, the step i) may include defining a resist pattern, including relatively thick and relatively thin portions, as the second resist mask. The relatively thick portions will define the source and drain electrodes, while the relatively thin portion will define a region between the source and drain electrodes. The step i) may further include: etching away parts of the conductive film and the patterned semiconductor layer that are not covered with the resist pattern; removing the relatively thin portion from the resist pattern; and etching away another part of the conductive film, which has been covered with the relatively thin portion of the resist pattern, thereby forming the source and drain electrodes.

In another embodiment of the present invention, the source electrode may be a part of a data line that extends linearly and crosses the gate electrode, while the drain electrode may extend from a pixel electrode parallel to the data line.

Yet another inventive method of making an active matrix substrate includes the steps of: a) forming a gate electrode on a base substrate; b) forming a gate insulating film that covers the gate electrode; and c) depositing a semiconductor layer over the gate insulating film. The method further includes the step of d) forming a channel protective layer over the semiconductor layer. The method further includes the step of e) forming a first positive resist layer over the channel protective layer. The method further includes the step of f) exposing the first positive resist layer to light that has been incident thereon through the backside of the base substrate and then developing the first positive resist layer exposed, thereby defining a first resist mask over the gate electrode so that the first resist mask is aligned with the gate electrode. The method further includes the step of g) removing parts of the channel protective layer, which are not covered with the first resist mask, thereby patterning and self-aligning the channel protective layer with the gate electrode. The method further includes the step of h) depositing a contact layer over the patterned channel protective layer and the semiconductor layer. The method further includes the step of i) defining a second resist mask over the gate electrode. The method further includes the step of j) removing parts of the contact and semiconductor layers, which are not covered with the second resist mask, thereby patterning and self-aligning the contact layer, the patterned channel protective layer and the semiconductor layer, including a portion to be a semiconductor region for a thin-film transistor, with the gate electrode. The method further includes the step of k) removing the second resist mask. The method further includes the step of l) depositing a conductive film over the patterned contact layer. And the method further includes the step of m) patterning the conductive film using a third resist mask, thereby forming source and drain electrodes, which both cross the gate electrode, and further patterning the patterned contact, channel protective and semiconductor layers, thereby defining the semiconductor region for the thin-film transistor below the source and drain electrodes so that the upper surface of the semiconductor region is partially covered with the patterned channel protective layer.

In one embodiment of the present invention, the step m) may include defining a resist pattern, including relatively thick and relatively thin portions, as the third resist mask. The relatively thick portions will define the source and drain electrodes, while the relatively thin portion will define a region between the source and drain electrodes. The step m) may further include: etching away parts of the conductive film and the patterned contact and semiconductor layers that are not covered with the resist pattern; removing the relatively thin portion from the resist pattern; and etching away another part of the conductive film and contact layer, which has been covered with the relatively thin portion of the resist pattern, thereby forming the source and drain electrodes that are separated from each other.

In another embodiment of the present invention, the channel protective layer may be patterned to have a width narrower than that of the semiconductor region.

Yet another inventive method of making an active matrix substrate includes the steps of: a) forming a gate electrode on a base substrate; b) forming a gate insulating film that covers the gate electrode; and c) depositing a semiconductor layer over the gate insulating film. The method further includes the step of d) forming a channel protective layer over the semiconductor layer. The method further includes the step of e) forming a positive resist layer over the channel protective layer. The method further includes the step of f) exposing the positive resist layer to light that has been incident thereon through the backside of the base substrate and then developing the positive resist layer exposed, thereby defining a first resist mask over the gate electrode so that the first resist mask is aligned with the gate electrode. The method further includes the step of g) removing parts of the channel protective layer, which are not covered with the first resist mask, thereby patterning and self-aligning the channel protective layer with the gate electrode. The method further includes the step of h) depositing a contact layer over the patterned channel protective layer and the semiconductor layer. The method further includes the step of i) depositing a conductive film over the contact layer. And the method further includes the step of j) patterning the conductive film using a second resist mask, thereby forming source and drain electrodes, which both cross the gate electrode, and further patterning the contact, channel protective and semiconductor layers, thereby defining a semiconductor region for a thin-film transistor below the source and drain electrodes so that the upper surface of the semiconductor region is partially covered with the patterned channel protective layer.

In one embodiment of the present invention, the step j) may include defining a resist pattern, including relatively thick and relatively thin portions, as the second resist mask. The relatively thick portions will define the source and drain electrodes, while the relatively thin portion will define a region between the source and drain electrodes. The step j) may further include: etching away parts of the conductive film and the contact and semiconductor layers that are not covered with the resist pattern; removing the relatively thin portion from the resist pattern; and etching away another part of the conductive film and contact layer, which has been covered with the relatively thin portion of the resist pattern, thereby forming the source and drain electrodes that are separated from each other.

In another embodiment of the present invention, before the contact layer is deposited in the step h), the semiconductor layer may be patterned and self-aligned with the gate electrode by exposing the semiconductor layer to light that has been incident thereon through the backside of the base substrate.

In still another embodiment, when the part of the conductive film and contact layer, which has been covered with the relatively thin portion of the resist pattern, is etched away after the relatively thin portion of the resist pattern has been removed, an exposed part of the semiconductor layer may be etched away to leave the semiconductor region for the thin-film transistor under the channel protective layer.

A thin-film transistor according to the present invention includes substrate, gate electrode, gate insulating film, semiconductor layer, source electrode and drain electrode. The gate electrode is formed on the substrate. The gate insulating film is formed over the gate electrode. The semiconductor layer is formed over the gate electrode with the gate insulating film interposed therebetween. The source electrode crosses the semiconductor layer. And the drain electrode crosses the semiconductor layer. In this thin-film transistor, side faces of the semiconductor layer, which are parallel to a direction in which the source and drain electrodes extend, are aligned with outer side faces of the source and drain electrodes.

In one embodiment of the present invention, the other side faces of the semiconductor layer, which are parallel to a direction in which the gate electrode extends, may be aligned with side faces of the gate electrode.

In another embodiment of the present invention, a contact layer may exist between the source electrode and the semiconductor layer and between the drain electrode and the semiconductor layer.

Another thin-film transistor according to the present invention includes substrate, gate electrode, gate insulating film, semiconductor layer, channel protective layer, source electrode and drain electrode. The gate electrode is formed on the substrate. The gate insulating film is formed over the gate electrode. The semiconductor layer is formed over the gate electrode with the gate insulating film interposed therebetween. The channel protective layer is formed on the semiconductor layer. The source electrode crosses the channel protective layer. And the drain electrode crosses the channel protective layer. In this thin-film transistor, side faces of the channel protective layer, which are parallel to a direction in which the source and drain electrodes extend, are aligned with outer side faces of the source and drain electrodes.

In one embodiment of the present invention, the other side faces of the channel protective layer, which are parallel to a direction in which the gate electrode extends, may be spaced apart from each other by a distance smaller than the line width of the gate electrode.

In another embodiment of the present invention, side faces of the semiconductor layer, which are parallel to the direction in which the gate electrode extends, may be aligned with the side faces of the gate electrode.

In still another embodiment, the other side faces of the semiconductor layer, which are parallel to the direction in which the source and drain electrodes extend, may be aligned with the outer side faces of the source and drain electrodes.

In yet another embodiment, a contact layer may exist between the source electrode and the semiconductor layer and between the drain electrode and the semiconductor layer.

BRIEF DESCRIPTION OF THE DRAWINGS

FIG. 4A illustrates an exemplary layout effectively applicable to the substrate 100 where the plastic substrate expands in an interval after the gate lines have been formed and before the drain and pixel electrodes are formed by a patterning process; and FIG. 4B illustrates an exemplary layout effectively applicable to the substrate 100 where the plastic substrate shrinks in that interval.

DETAILED DESCRIPTION OF THE INVENTION

Embodiment 1

Hereinafter, a first embodiment of the inventive active matrix substrate will be described with reference to FIGS. 1 through 3C.

Figure 1:
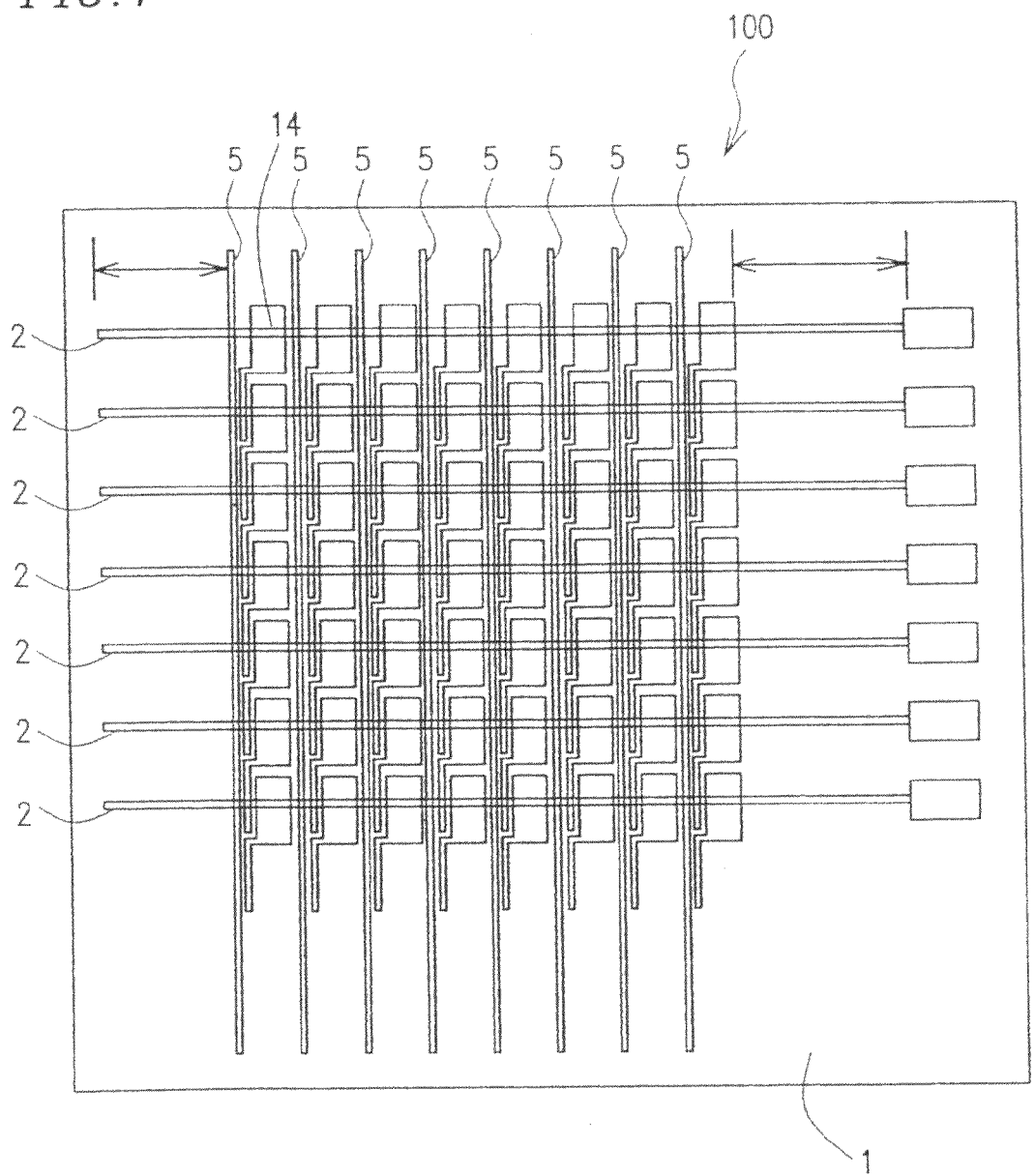
FIG. 1 is a plan view schematically illustrating a layout for an active matrix substrate 100 according to a first embodiment of the present invention.

First, referring to FIG. 1, a layout for an active matrix substrate 100 according to the first embodiment is illustrated schematically.

The active matrix substrate 100 includes: an insulating substrate 1 of a plastic like polyether sulfone (PES), which will be herein referred to as a "plastic substrate"; and an array of thin-film transistors (TFTs) formed on the plastic substrate 1. The array of TFTs will be herein referred to as a "TFT array".

Over the plastic substrate 1, multiple gate lines 2 and multiple data lines 5 are arranged so as to cross each other at right angles. The gate lines 2 belong to a first layer located on the plastic substrate 1, while the data lines 5 belong to a second layer located over the first layer. Also, the gate and data lines 2 and 5 are mutually isolated electrically by an insulating film (not shown in FIG. 1) interposed between the first and second layers. In FIG. 1, just seven gate lines 2 and eight data lines 5 are illustrated for the sake of simplicity. Actually, though, a huge number of gate lines 2 and a great many data lines 5 are arranged on the substrate 1 to form a matrix.

In the areas where the gate and data lines 2 and 5 cross each other, TFTs (not shown in FIG. 1) have been formed. In addition, a plurality of pixel electrodes 14, each of which is electrically connected to associated one of the data lines 5 by way of associated one of the TFTs, are arranged so as to overlap the gate lines 2.

Figure 2:
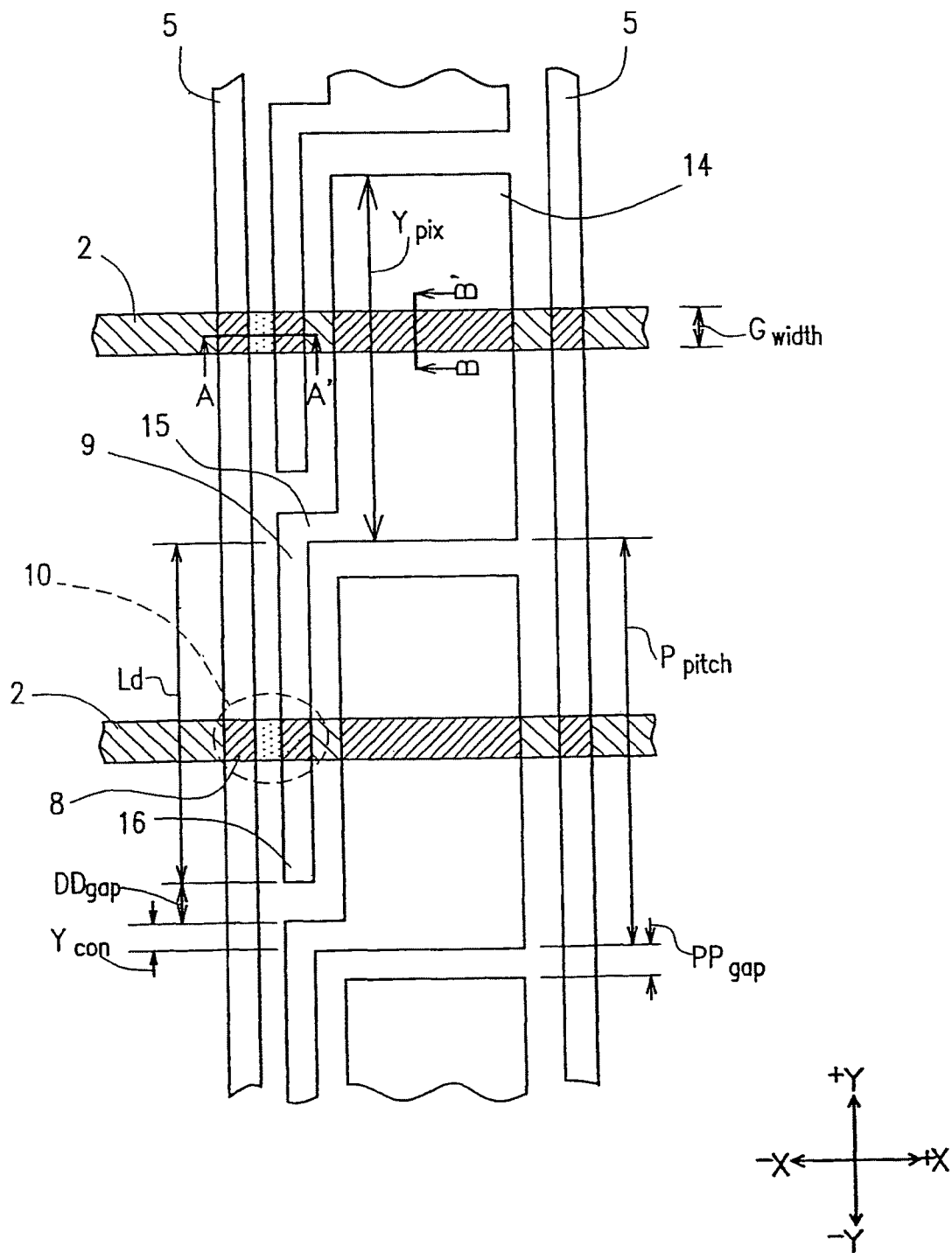
FIG. 2 is a plan view illustrating part of the display area of the active matrix substrate 100 to a larger scale.

Next, referring to FIG. 2, shown is a layout for part of the display area of the active matrix substrate 100 to a larger scale. Specifically, FIG. 2 illustrates two vertically adjacent pixel regions belonging to the same column of pixels.

As shown in FIG. 2, a long conductive member 9 has been extended parallel to the data lines 5 from the pixel electrode 14 that has been disposed to overlap one of the gate lines 2. The direction in which the conductive member 9 extends is Y-direction in FIG. 2. The conductive member 9 serves as a drain electrode for the TFT 10 and electrically connects the pixel electrode 14 and TFT 10 together.

In the illustrated embodiment, a semiconductor layer for each TFT 10 is self-aligned with the associated gate line 2, and the data lines 5 and conductive members (or drain electrodes) 9 are arranged to extend across the semiconductor layer. As shown in FIG. 2, the drain electrode 9, connected to the TFT 10 circled, crosses the lower one of two vertically adjacent gate lines 2, while the pixel electrode 14, connected to the drain electrode 9, crosses the upper gate line 2. That is to say, each pair of drain and pixel electrodes 9 and 14 crosses mutually different and vertically adjacent gate lines 2. In the example illustrated in FIGS. 1 and 2, the gate lines 2 are selectively driven sequentially from +Y toward -Y. Accordingly, the pixel electrode 14 is disposed to cross the upper gate line 2 that is selectively driven earlier than the lower gate line 2. On the other hand, the drain electrode 9, extending from the pixel electrode 14, is disposed to cross the lower gate line 2 that is selectively driven next to the upper gate line 2. In this case, a storage capacitance is formed between the pixel electrode 14 and the gate line 2 located under the pixel electrode 14. In the example shown in FIGS. 1 and 2, the lines 2 are supposed to be driven from +Y toward -Y by a line sequential method. Alternatively, the gate lines 2 may also be driven from +Y toward -Y by an interlaced method or from -Y toward +Y by a line sequential method.

Figure 3A:
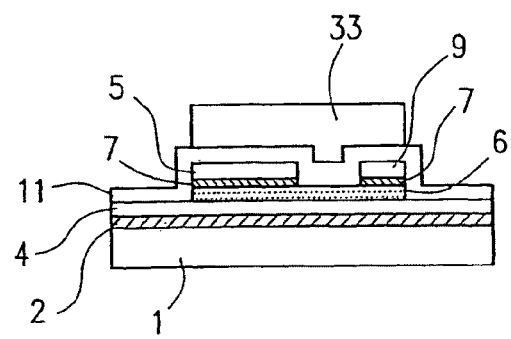
FIGS. 3A and 3B are cross-sectional views of the substrate 100 respectively taken along the lines A-A' and B-B' shown in FIG. 2.
Figure 3B:
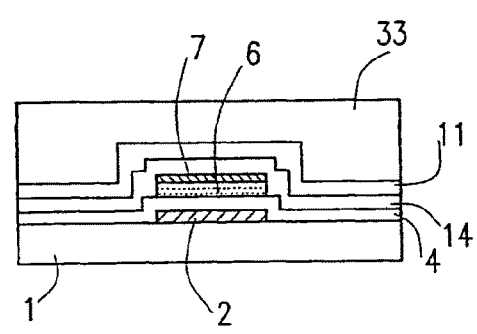
Figure 3C:
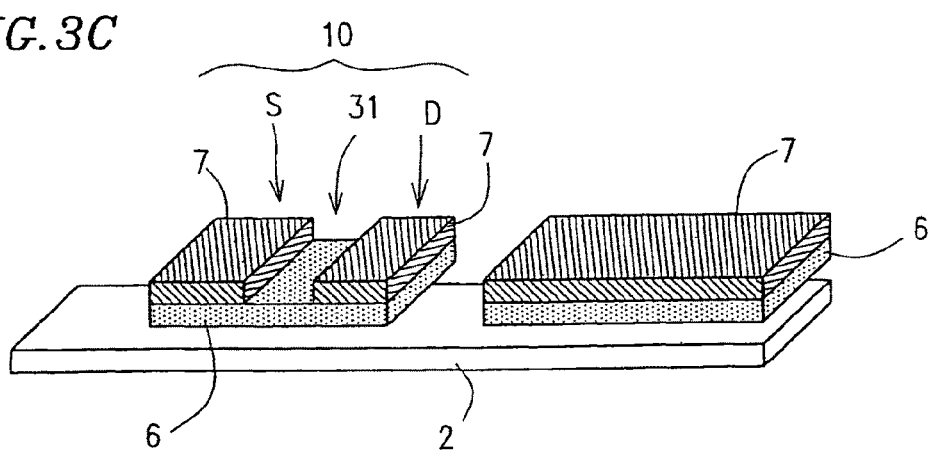
FIG. 3C is a perspective view illustrating semiconductor layers on the gate line.

Next, referring to FIGS. 3A through 3B, illustrated are cross-sectional views of the substrate 100 respectively taken along the lines A-A' and B-B' shown in FIG. 2. FIG. 3C is a perspective view illustrating the gate line 2 and parts of the semiconductor layers 6 and 7 for the TFT 10 that are located on the gate line 2.

As shown in FIG. 3A, the TFT 10 of the first embodiment has a multilayer structure including gate line 2 (serving as its gate electrode), gate insulating film 4, i-semiconductor layer 6 and doped semiconductor layer 7 that have been stacked in this order on the substrate 1. In the illustrated embodiment, the i-semiconductor layer 6 is made of non-doped amorphous silicon, while the doped semiconductor layer 7 is made of $n^+$-type microcrystalline silicon that has been heavily doped with an n-type dopant such as phosphorus (P). The data line 5 and drain electrode 9 are electrically connected to source/drain regions in the semiconductor layer 6 by way of the doped semiconductor layer 7 acting as a contact layer. As can be easily understood, part of the data line 5 (i.e., that part crossing the gate line 2) extending linearly serves as a source electrode 8 for the TFT 10.

As shown in FIG. 3C, part 31 of the semiconductor layer 6 located between the source/drain regions S and D serves as a channel region, over which no doped semiconductor layer 7 exists. In the illustrated embodiment, the TFT 10 is implemented as a channel-etched bottom-gate thin-film transistor. The upper surface of the channel region in the semiconductor layer 6 is etched shallow when that part of the doped semiconductor layer 7 is removed.

In the illustrated embodiment, side faces of the semiconductor layers 6 and 7, which are parallel to the direction in which the gate line 2 extends, are "aligned" with the side faces of the gate line 2. This structure is realized by a self-alignment process utilizing backside exposure technique as will be described later. On the other hand, the other side faces of the semiconductor layers 6 and 7 are "aligned" with the outer side faces of the data line 5 and drain electrode 9. A structure like this is realized if not only the data line 5 and drain electrode 9 but also the semiconductor layers 6 and 7, located under the data line 5 and drain electrode 9, are formed by a patterning process using the same mask. As used herein, an "aligned" state herein refers to not just an ideal situation where a pattern edge belonging to one layer is completely matched with an associated pattern edge belonging to another layer but also a situation where these edges are just roughly matched, and somewhat misaligned, with each other. This "misalignment" is not caused by mask-to-mask placement error, but rather by a possible variation in the width of etched portions of multiple layers being patterned using the same mask (e.g., resist mask).

In view of this possible misalignment, an "aligned" state herein refers to a situation where multiple patterns belonging to mutually different layers are matched with each other to such a degree as not being affected by a mask-to-mask placement error.

Next, referring to FIG. 3B, it can be seen that the semiconductor layers 6 and 7 also exist over the gate line 2 even in a region where the pixel electrode 14 has been formed. However, as shown in FIG. 3C, part of the semiconductor layers 6 and 7 existing in the region where the pixel electrode 14 has been formed is spaced apart from another part of the semiconductor layers 6 and 7 for the TFT 10. Thus, the former part of the semiconductor layers 6 and 7 does not constitute any parasitic transistor. Accordingly, no crosstalk will be observable between a pair of pixels belonging to the same row (or gate line).

In the illustrated embodiment, the data lines 5, drain electrodes 9 and pixel electrodes 14 are all made of a transparent conductive layer that has been obtained by patterning a single transparent electrode film, and all belong to the same layer. Also, the data lines 5, drain electrodes 9 and pixel electrodes 14 are covered with a passivation film 11, on which color filters 33 are formed.

Figure 46A:
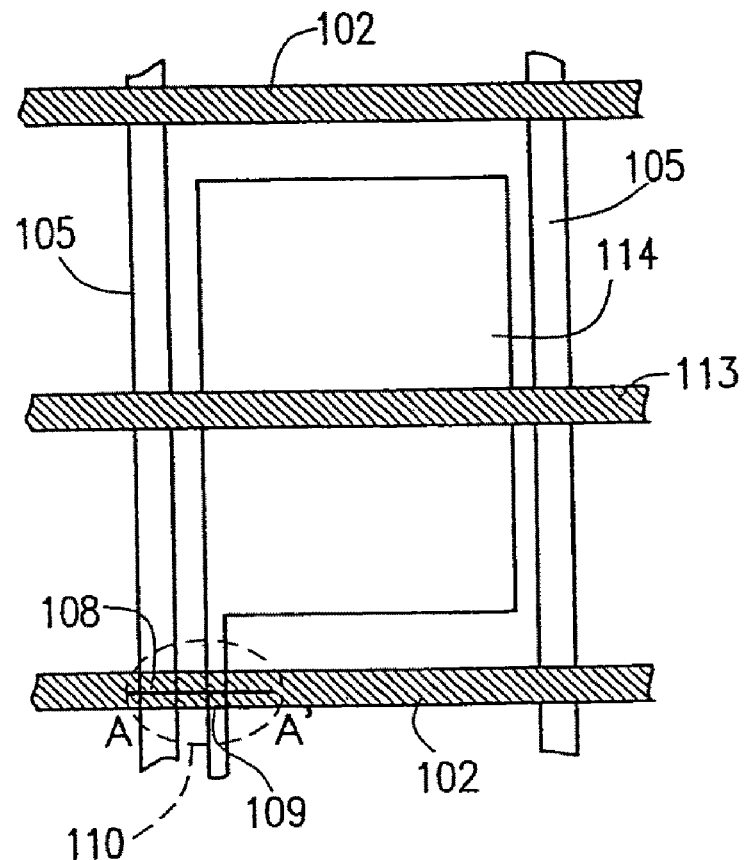
FIG. 46A is a plan view illustrating a layout for a unit pixel region defined on another known active matrix substrate.
Figure 46B:
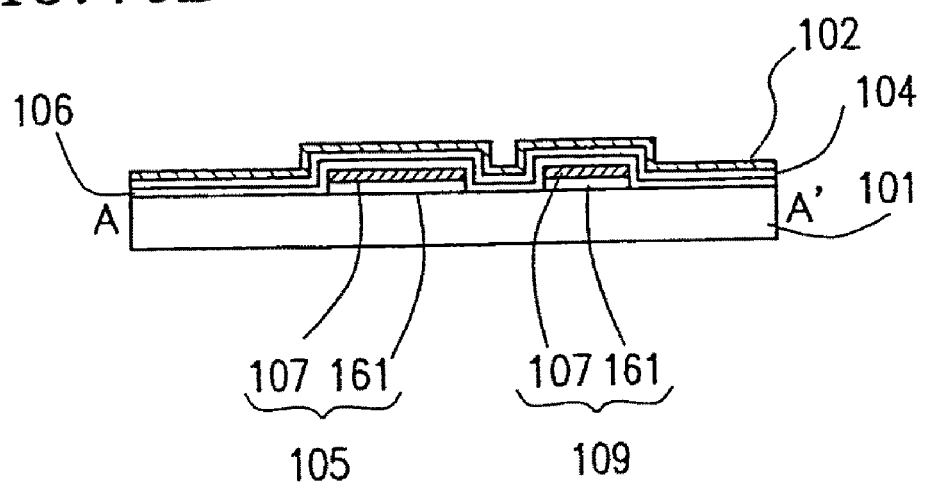
FIG. 46B is a cross-sectional view of the pixel region taken along the line A-A' shown in FIG. 46A.
Figure 47:
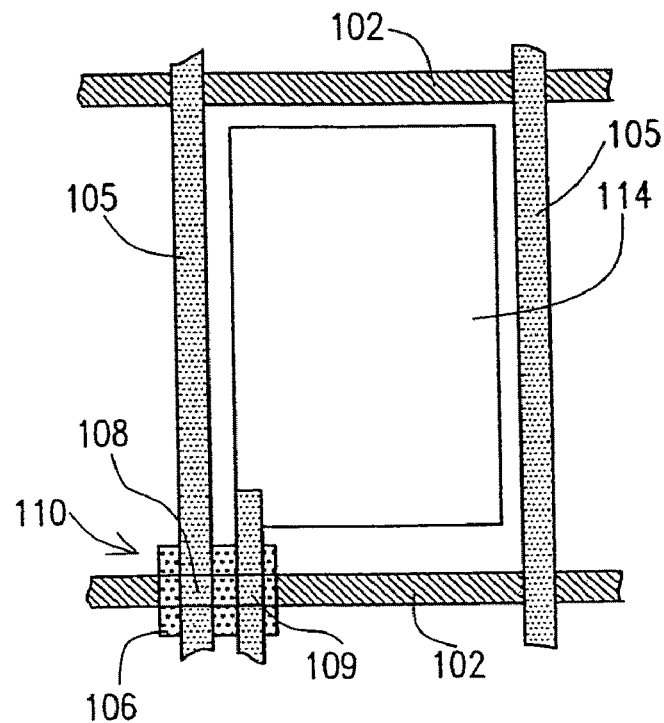
FIG. 47 is a plan view illustrating a layout for a unit pixel region defined on still another known active matrix substrate.

Referring back to FIG. 2, the drain electrode 9, connecting the pixel electrode 14 to the TFT 10, extends parallel to the data lines 5 from the pixel electrode 14 and crosses the lower gate line 2. The TFT 10 to be connected to the drain electrode 9 is selectively driven (or switched) through the lower gate line 2. The drain electrode 9 should be laid out so as not to cross any gate lines 2 other than the associated one (i.e., the lower gate line 2 shown in FIG. 2). That is to say, the distance between the lower end of the drain electrode 9 (i.e., the end in the −Y direction shown in FIG. 2) and the opposite edge of the pixel electrode 14 (i.e., the edge in the +Y direction shown in FIG. 2) is set longer than, but less than twice as long as, the gate line pitch. In a known active matrix substrate on the other hand, the distance between the end of the drain electrode 109 and the opposite edge of the pixel electrode 114 is shorter than the gate line pitch as shown in FIG. 46A.

Next, it will be further detailed with reference to FIG. 2 how the drain and pixel electrodes 9 and 14 should be laid out.

The drain electrode 9 shown in FIG. 2 is made up of connection 15 and extension 16. More specifically, the connection 15 is a short portion that protrudes from the left one of the two corners of the pixel electrode 14 facing the −Y direction (i.e., lower left corner) toward the data line 5 in the −X direction). On the other hand, the extension 16 is an elongated portion that extends parallel to the data lines 5 downward (i.e., in the −Y direction) from the connection 15. Suppose the distance between the lower end of the drain electrode 9 facing the −Y direction and the edge of the associated pixel electrode 14 facing the −Y direction is defined as the "length $L_d$" of the drain electrode 9. Then, the length $L_d$ of the drain electrode 9 is given by $$L_d = P_{pitch} - DD_{gap} - Y_{con} \quad (1)$$

where $P_{pitch}$ is the pixel pitch, $DD_{gap}$ is the gap between the drain electrodes 9 and $Y_{con}$ is the width of the connection 15.

After the gate lines 2 have been formed at a predetermined pitch on the plastic substrate 1, the plastic substrate 1 might expand or shrink too much to expect the actual gate line pitch. Even so, according to the arrangement shown in FIG. 2, the data lines 5, drain electrodes 9 and pixel electrodes 14 can be laid out to cross the gate lines 2 just as originally designed.

The greater the length $L_d$ of the drain electrode 9, the greater the margin allowed for aligning the drain electrode 9 (or pixel electrode 14) with the gate line 2. Where the pixel pitch $P_{pitch}$ is constant, the $DD_{gap}$ and $Y_{con}$ values should be as small as possible to increase the length $L_d$ of the drain electrode 9. However, the $DD_{gap}$ and $Y_{con}$ values cannot be reduced to less than certain lower limits because these values are defined by the photolithography and etching techniques applicable to the process step of patterning the transparent conductive film. To electrically isolate the pixel electrodes 14 from each other as intended and to prevent the connection 15 from decreasing its width too much or being cut off unintentionally, a sufficient etching margin should be left for the patterning process step.

Normally, the gap $PP_{gap}$ between adjacent pixel electrodes 14 is set to a minimum possible value to increase the aperture ratio as much as possible. Accordingly, to maximize the length $L_d$ of the drain electrode 9, the drain electrode gap. $DD_{gap}$ should be set equal to the pixel electrode gap $PP_{gap}$. Then, the length $L_d$ of the drain electrode 9 is given by $$L_d = P_{pitch} - PP_{gap} - Y_{con} \quad (2)$$

The layout illustrated in FIG. 2 substantially meets this Equation (2). However, the length $L_d$ of the drain electrode 9 does not have to be given by Equation (2), but rather may be any value so long as a necessary alignment margin is affordable.

It should be noted that the size $Y_{pix}$ of the pixel electrode 14 as measured along the Y-axis is given by $$Y_{pix} = P_{pitch} - PP_{gap} \quad (3)$$

As for the example illustrated in FIG. 2, the following Equation (4) can be derived from Equations (2) and (3):

$$L_d = Y_{pix} - Y_{con} \quad (4)$$

The alignment margin ΔY for the gate line 2 and drain electrode 9 (or pixel electrode 14) is given by $$\Delta Y = L_d - PP_{gap} - G_{width} \quad (5)$$

where $G_{width}$ is the width of the gate line 2.

If it is known that the plastic substrate 1 shrinks or expands after the gate lines 2 have been formed and before a photolithographic process is carried out to form the drain electrodes 9 (or pixel electrodes 14), then the pixels at the farthest (i.e., upper or lower) end of the display area should preferably be allowed the greatest alignment margin.

FIG. 4A illustrates an exemplary layout applicable to a situation where the plastic substrate 1 expands. In the layout illustrated in FIG. 4A, the TFT 10 and its associated gate line 2 are overlapped with the edge 9E of the drain electrode 9 and the vicinity thereof in the pixel located at the end of the display area in the −Y direction. In the example shown in FIG.

4A, when the plastic substrate 1 expands, the gate line pitch will exceed the pixel pitch. Accordingly, the closer to the farthest end in the +Y direction a pixel, the greater the shift of the intersection between the drain electrode 9 and its associated gate line 2 from the edge 9E of the drain electrode 9. In the layout of this embodiment, however, the alignment margin ΔY allowed is great enough to almost always exceed that intersection shift. Thus, even in the pixel (not shown) located at the farthest end of the display area in the +Y direction, the drain electrode 9 (or pixel electrode 14) still can cross the associated gate line 2 within the predetermined range.

On the other hand, FIG. 4B illustrates a situation where the plastic substrate 1 shrinks. In the layout shown in FIG. 4B, the gate line 2 is overlapped with the edge 14E of the pixel electrode 14 and the vicinity thereof in the pixel located at the end of the display area in the −Y direction. In the example shown in FIG. 4B, when the plastic substrate 1 shrinks, the gate line pitch will get smaller than the pixel pitch. Accordingly, the closer to the farthest end in the +Y direction a pixel, the greater the shift of the intersection between the pixel electrode 14 and its associated gate line 2 from the edge 14E of the pixel electrode 14. In the layout of this embodiment, however, the alignment margin ΔY allowed is great enough to almost always exceed that intersection shift. Thus, even in the pixel (not shown) located at the farthest end of the display area in the +Y direction, the drain electrode 9 (or pixel electrode 14) still can cross the associated gate line 2 within the predetermined range.

Figure 5:
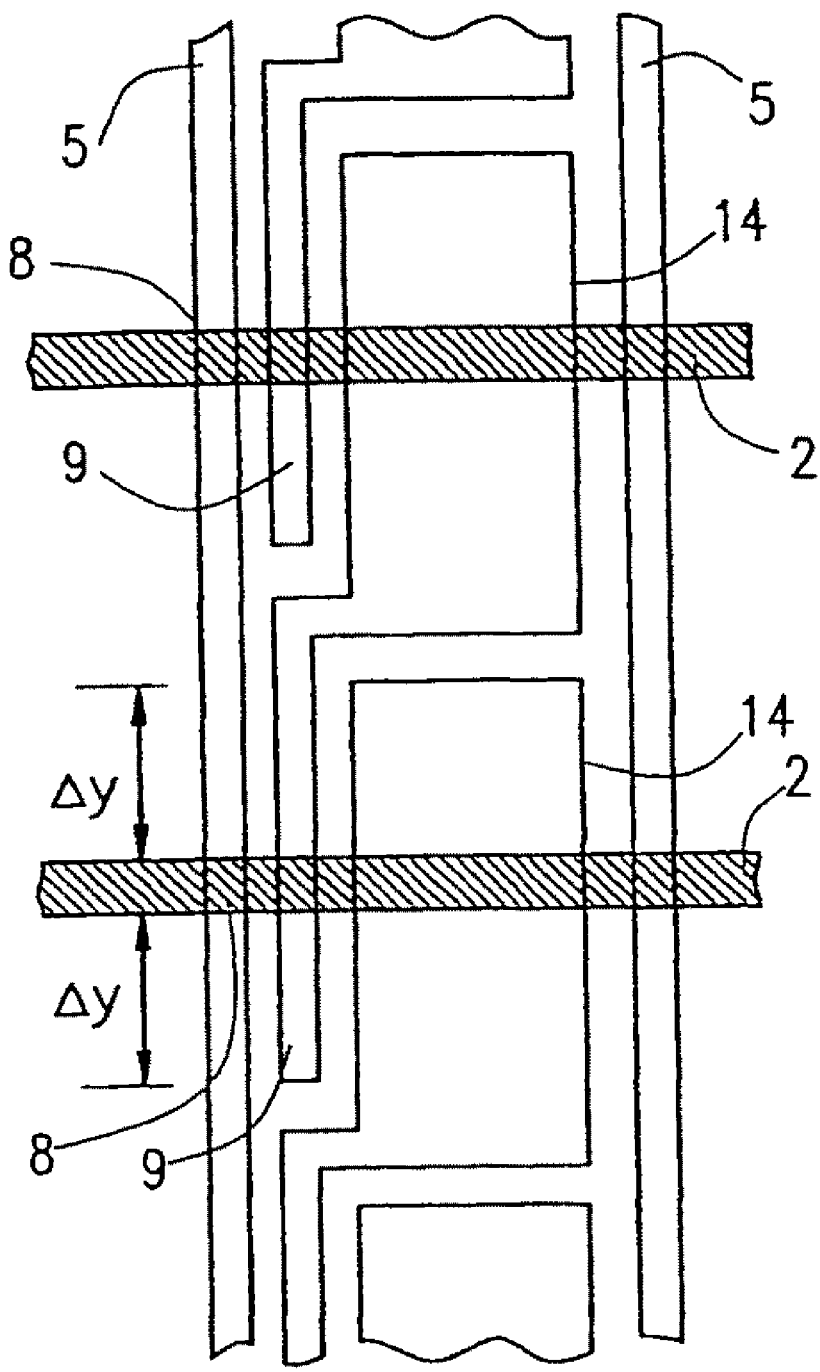
FIG. 5 illustrates an exemplary layout applicable to the substrate 100 even if it is not clear whether the plastic substrate expands or shrinks in the interval after the gate lines have been formed and before the drain and pixel electrodes are formed by the patterning process.

To cope with both expansion and shrinkage of the plastic substrate 1, the vertical center of each drain electrode 9 should be as close to the centerline of the associated gate line 2 as possible around the center area of the plastic substrate 1 as shown in FIG. 5.

In this case, the alignment margin ±Δy is given by $$\pm \Delta y = \pm (\Delta Y/2 - dY) \quad (6).$$

where dY is the alignment accuracy of the exposure system used.

As described above, in the layout for the first embodiment, even if the gate line pitch has increased or decreased considerably due to the expansion or shrinkage of the plastic substrate 1, a sufficient alignment margin is still allowed. Accordingly, no matter where the TFTs 10 are formed on the substrate, the variation in transistor characteristics is suppressible and the non-uniformity of parasitic capacitance distribution can be eliminated from the substrate plane.

It should be noted that there is no concern about misalignment among the data lines 5, drain electrodes 9 and pixel electrodes 14 because these members 5, 9 and 14 are all formed by patterning the same transparent conductive film.

In a known active matrix substrate, the intersection 80 between a data line 105 and a gate line 102 normally has its width decreased to reduce the parasitic capacitance formed around the intersection 80. In contrast, in the layout of the first embodiment, the side faces of the gate and data lines 2 and 5 have no concave or convex portions within the display area as shown in FIG. 2. In such a layout, even if the data lines 5 have been misaligned with the gate lines 2, variations in characteristics of the TFTs 10, including gate-drain capacitance $C_{gd}$, ON-state current, capacitance at the gate/data line intersection and storage capacitance, are still suppressible.

Hereinafter, a method of making the active matrix substrate 100 will be described in detail with reference to FIGS. 6A through 6D and FIGS. 7A through 7L. FIGS. 6A through 6D are plan views illustrating two pixel regions in two main process steps. FIGS. 7A through 7L illustrate cross-sectional views taken along the lines A-A' and B-B' shown in FIGS. 6A through 6D.

Figure 6A:
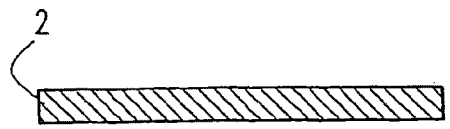
FIGS. 6A through 6D are plan views illustrating two pixel regions in main process steps.
Figure 6A:
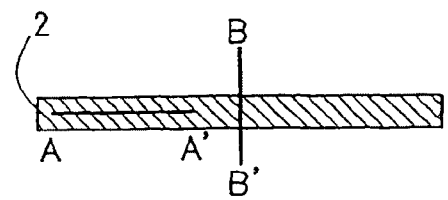
Figure 7A:
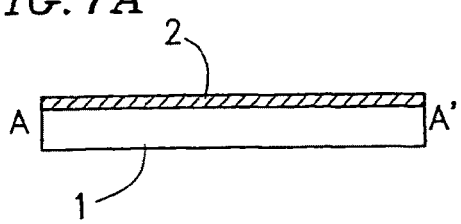
FIGS. 7A through 7L are cross-sectional views taken along the lines A-A' and B-B' shown in FIGS. 6A through 6D.
Figure 7A:
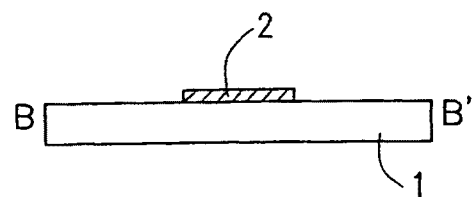

First, as shown in FIGS. 6A and 7A, multiple gate lines 2 are formed on a plastic substrate 1. The gate lines 2 may be formed by depositing a tantalum (Ta) film, for example, to a thickness of about 200 nm on the plastic substrate 1 by a sputtering process, for instance, and then by patterning the Ta film by photolithographic and etching processes. The pattern of the gate lines 2 is defined by a (first) mask for use in the photolithographic process. The width $G_{width}$ of the gate lines 2 may be about 4.0 to 20 μm, for example. On the other hand, the pitch of the gate lines 2 (i.e., gate line pitch) may be set to somewhere between about 150 and about 200 μm in the photolithographic process. However, the gate line pitch will have varied from the setting by about 500 to 1000 ppm until another photolithographic process is carried out to form the pixel electrodes 14 and so on. This is because the plastic substrate 1 expands or shrinks due to heat or moisture through the subsequent fabrication process steps as described above.

Figure 7B:
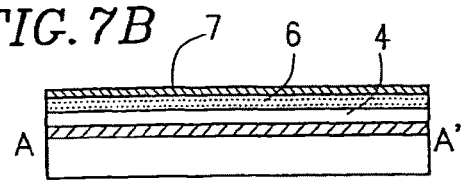
Figure 7B:
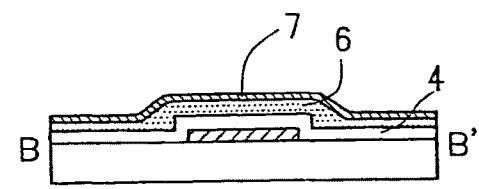

Next, as shown in FIG. 7B, a gate insulating film 4 of silicon nitride ($SiN_x$) is deposited to a thickness of about 200 to 500 nm over the plastic substrate 1, including the gate lines 2, by a chemical vapor deposition (CVD) process, for example. Then, non-doped amorphous silicon layer (i.e., an intrinsic semiconductor layer) 6 and another semiconductor layer 7, doped with an n-type dopant like phosphorus (P), are stacked in this order to respective thicknesses of about 100 to 200 μm and about 10 to 50 μm over the gate insulating film 4. The i-semiconductor layer 6 may also be made of polycrystalline or microcrystalline silicon, not amorphous silicon. Also, the semiconductor layer 6 may contain a very small amount of inevitable impurities.

Figure 7C:
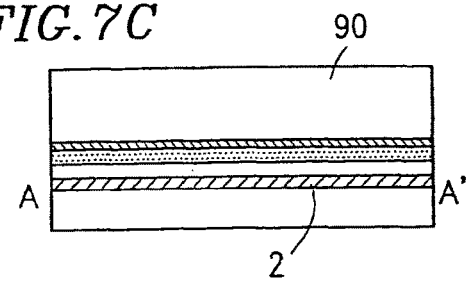
Figure 7C:
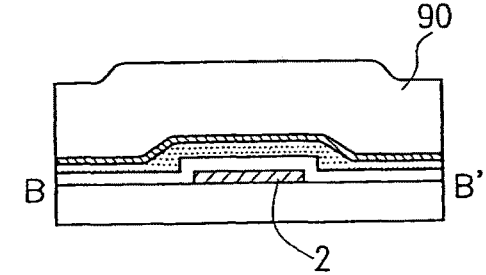
Figure 7D:
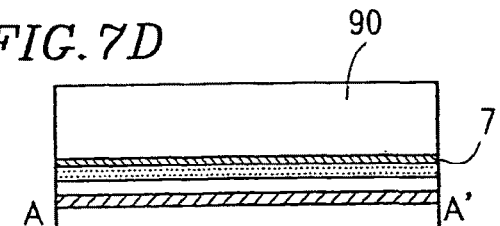
Figure 7D:
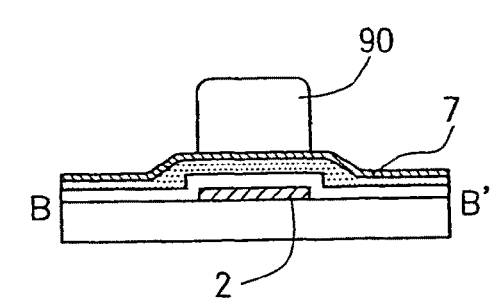
Figure 7E:
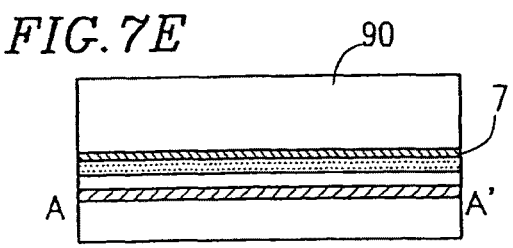
Figure 7E:
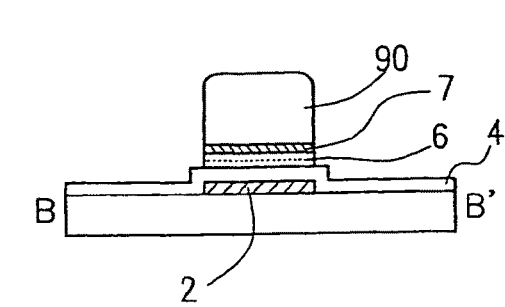

Subsequently, as shown in FIG. 7C, a photolithographic process is carried out. Specifically, a positive resist film 90 is applied onto the doped semiconductor layer 7 and then exposed to light that has been incident thereon through the backside of the plastic substrate 1. In this process step, the gate lines 2 with opacity serve as a sort of optical mask. Accordingly, parts of the resist film 90 that are located over the gate lines 2 are not exposed to the light, while the other parts thereof, under which no gate lines 2 exist, are exposed to the light. Thereafter, the resist film 90 exposed is developed. As a result, a resist mask 90 having the same planar layout as that of the gate lines 2 is formed over the gate lines 2 as shown in FIG. 7D. Then, the doped and intrinsic semiconductor layers 7 and 6 are etched in this order while being masked with this resist mask 90, thereby patterning and self-aligning the semiconductor layers 6 and 7 with the gate lines 2 as shown in FIG. 7E.

Figure 6B:
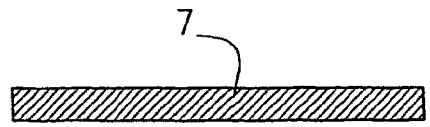
Figure 6B:
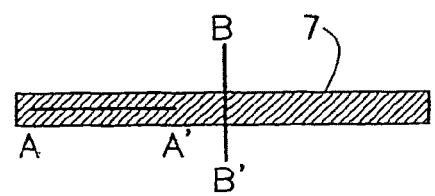

FIG. 6B is a plan view illustrating the doped semiconductor layer 7 that has been patterned and self-aligned with the gate lines 2. Although not shown in FIG. 6B, the i-semiconductor layer 6 and gate lines 2 are located right under the doped semiconductor layer 7. At this point in time, the semiconductor layers 6 and 7 have not yet been divided into multiple portions for pixels, but extend in thin stripes over the gate lines 2. It should be noted that the semiconductor layers 6 and 7 may have their width increased or decreased (i.e., not equal to the width of the gate lines 2) by controlling the exposure and/or etching conditions.

In the illustrated embodiment, the semiconductor layers 6 and 7 are patterned by the backside exposure process, so the resultant TFTs 10 will be located over the gate lines 2 (see FIG. 2). Normally, where semiconductor layers for TFTs are formed after the gate lines have been formed, the pattern of the semiconductor layers should be aligned highly accurately with the gate lines. However, a plastic substrate will often expand or shrink considerably to increase the misalignment between the gate lines and semiconductor layers. For that reason, a TFT array on a plastic substrate is hard to realize by any known process. In contrast, where the backside exposure process is carried out in accordance with the method of this embodiment, there is no need to carry out the process step of aligning the pattern of the semiconductor layer 6 with the gate lines 2. So the alignment margin does not have to be considered anymore.

In the illustrated embodiment, the gate lines are made of Ta. Alternatively, the gate lines may also be made of any other electrically, conductive material with opacity. Anyway, the material adopted should have some opacity to carry out the backside exposure process successfully. Examples of other preferable gate line materials include Al, Al alloys, stack of Mo and Al films, stack of TiN, Al and Ti films and stack of TaN, Ta and TaN films. These materials are preferable because they have relatively low electrical resistivities and are adaptable to this fabrication process very easily.

Figure 7F:
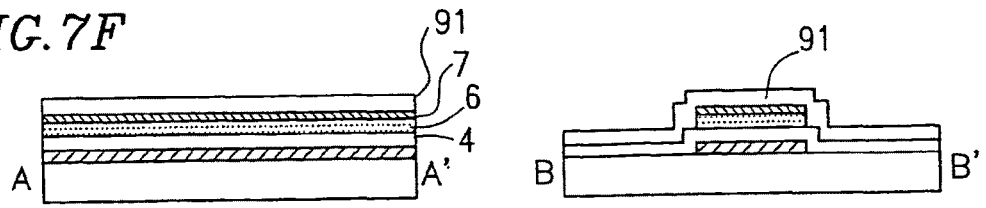

Next, the resist film 90 is removed from the upper surface of the doped semiconductor layer 7. Then, as shown in FIG. 7F, a transparent conductive film 91 of indium tin oxide (ITO) is deposited over the plastic substrate 1. The trans-parent conductive film 91 does not have to be made of ITO, but may be made of any other electrically conductive material that can transmit visible light sufficiently. For example, the transparent conductive film 91 may be made of IXO.

Thereafter, photolithographic and etching processes will be carried out, thereby patterning the transparent conductive film 91 into data lines 5, drain electrodes 9 and pixel electrodes 14. The layout of the data lines 5, drain electrodes 9 and pixel electrodes 14 is defined by a (second) mask for use in this photolithographic process. Hereinafter, it will be described in detail how to perform this patterning process using the second mask.

Figure 6C:
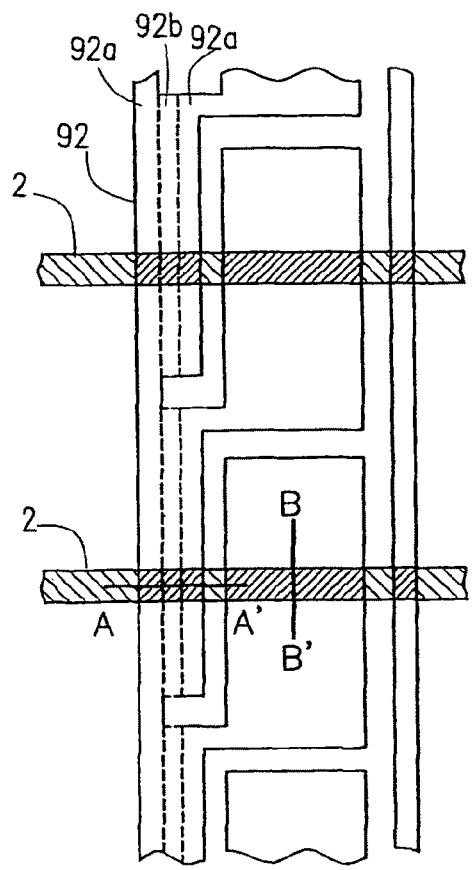
Figure 6D:
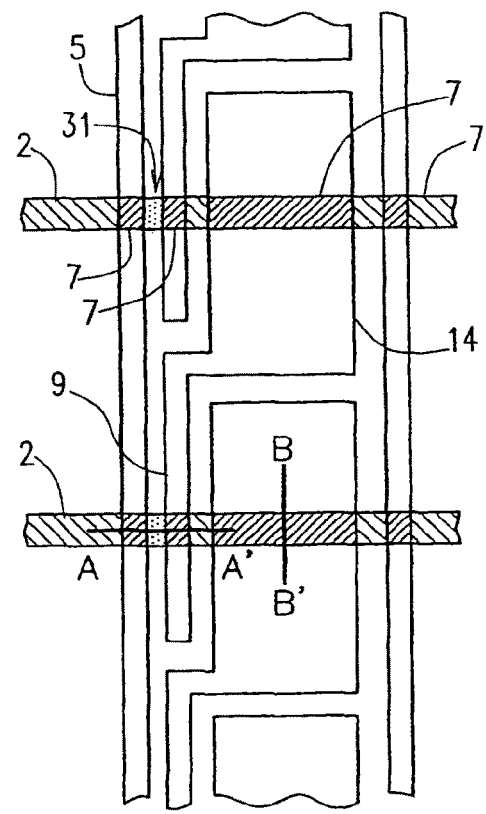
Figure 7G:
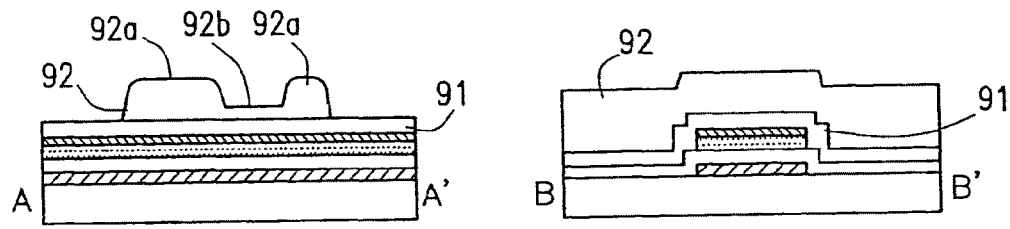

First, the resist mask 92 shown in FIGS. 6C and 7G is defined for the photolithographic process. As shown in FIG. 7G, the resist mask 92 includes: relatively thick portions 92a defining the data lines 5, drain electrodes 9 and pixel electrodes 14; and relatively thin portions 92b defining the region between the data line 5 and drain electrodes 9. The thick resist portions 92a may have a thickness of about 1.5 to 3.0 μm, while the thin resist portion 92b may have a thickness of about 0.3 to 1.0 μm.

Figure 8A:
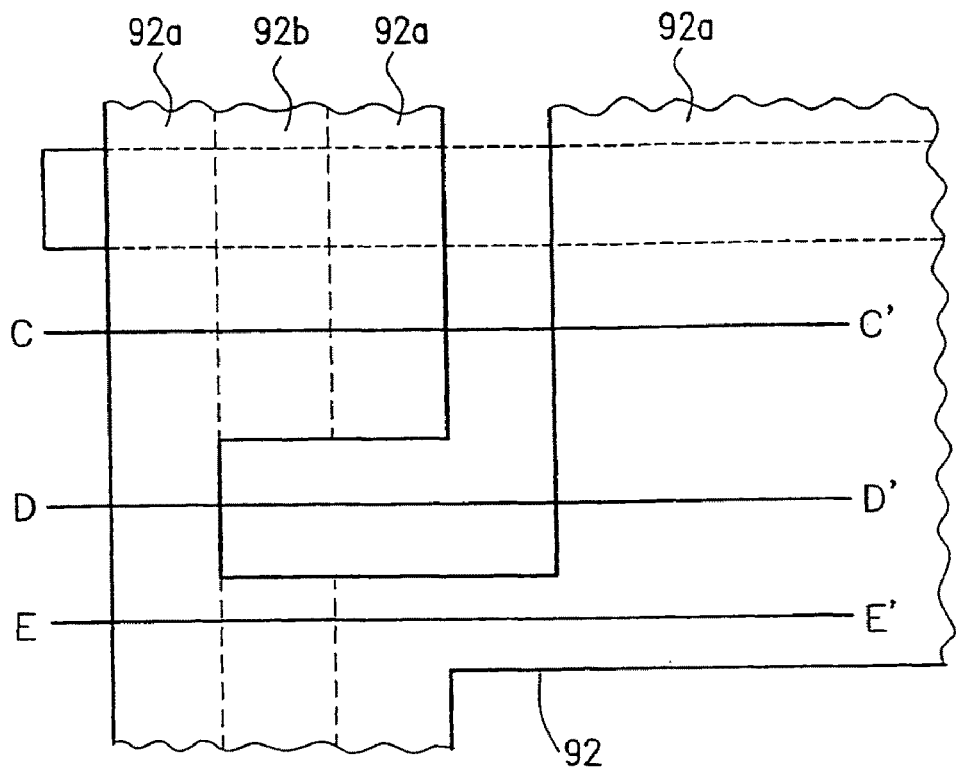
FIG. 8A is a plan view illustrating part of a resist mask for use in defining the data lines, drain electrodes and pixel electrodes to a larger scale.
Figure 8B:
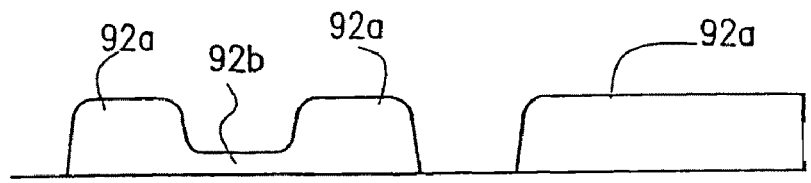
FIGS. 8B, 8C and 8D are cross-sectional views of the mask respectively taken along the lines C-C', D-D' and E-E' shown in FIG. 13A.
Figure 8C:
Figure 8D:
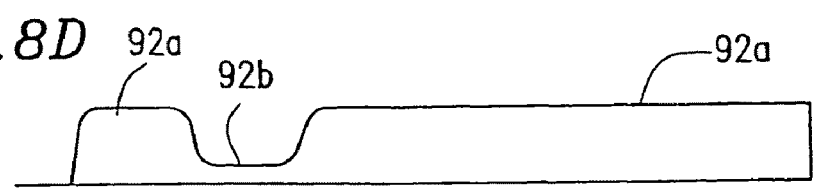
Figure 9:
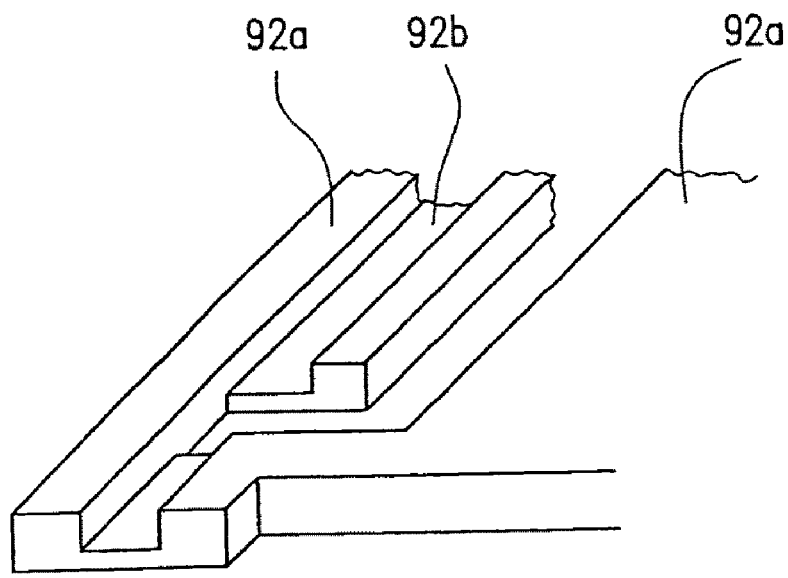
FIG. 9 is a perspective view schematically illustrating the resist mask shown in FIG. 8A.

The shape of this resist mask 92 will be further detailed with reference to FIGS. 8A through 8D and FIG. 9. FIG. 8A is a plan view illustrating part of the resist mask 92 to a larger scale. The part of the resist mask 92 shown in FIG. 8A corresponds to the data line 5, the lower end of the drain electrode 9 and the nearest corner of the pixel electrode 14. FIGS. 8B, 8C and 8D are cross-sectional views of the resist mask 92 respectively taken along the lines C-C', D-D' and E-E' shown in FIG. 8A. FIG. 9 is a perspective view schematically illustrating the resist mask 92 shown in FIGS. 8A through 8D.

This resist mask 92 can be defined by selectively exposing parts of the resist film on the substrate 1, which are located between the data line 5 and drain electrodes 9, to an appropriate quantity of light. Such an exposure process is called a "half-exposure process". If the optical mask used includes slit patterns at appropriate positions, the exposure of this type is easily realizable by utilizing the interference effects of light.

Figure 7H:
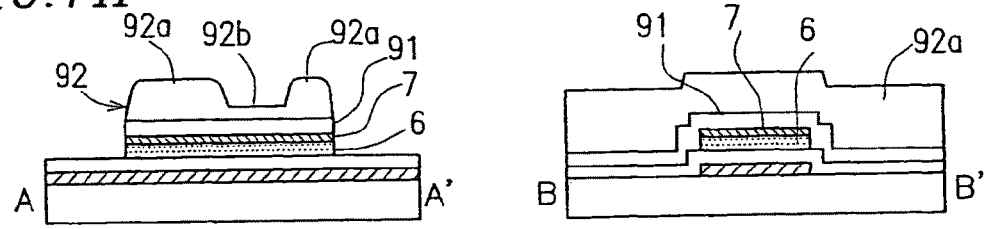

In the illustrated embodiment, the transparent conductive film 91, doped semiconductor layer 7 and i-semiconductor layer 6 are sequentially etched using the resist mask 92 in such a special shape. FIG. 7H illustrates a cross section of the substrate when this etching process is finished. At this point in time, the channel region 31 of the TFT 10 is covered with the relatively thin portion 92b of the resist, mask 92. Accordingly, the respective parts of the transparent conductive film 91 and doped semiconductor layer 7, which are located over the channel region 31, are not yet etched at all. As a result of this etching process, the semiconductor layer 6, which has been striped until this process step, is now divided into multiple island-like portions. However, respective parts of the transparent conductive film 91 to be the data line 5 and drain electrode 9 have not yet been separated from each other.

Figure 7I:
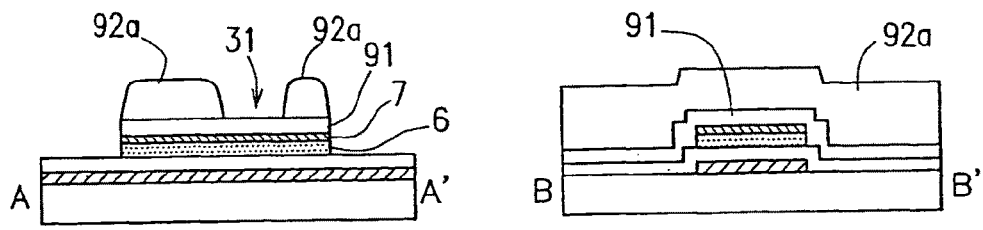
Figure 7J:
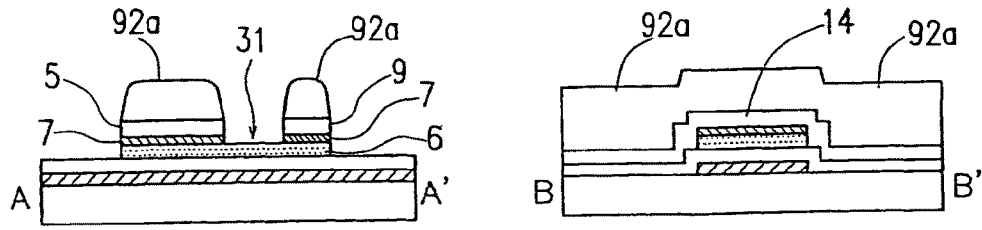
Figure 10:
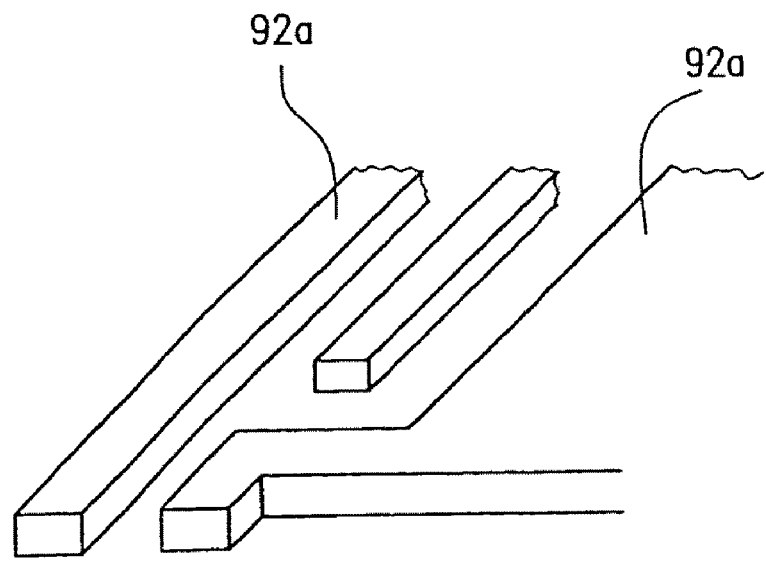
FIG. 10 is a perspective view schematically illustrating how the resist mask shown in FIG. 8A looks after having been ashed.

Subsequently, the resist mask 92 has its thickness reduced (e.g., the surface parts of the resist mask 92 are ashed with oxygen plasma), thereby removing the thin resist portion 92b, which has covered the channel 31 of the TFT 10, as shown in FIG. 7I. When the resist mask 92 is ashed with oxygen plasma to reduce the thickness thereof, the side faces of the resist mask 92 are also ashed away to a depth approximately equal to the thickness of the thin resist portion 92b. However, the thin resist portion 92b has a thickness of about 0.3 to 1.0 μm, so the side size shift resulting from this ashing process is also about 0.3 to 1.0 μm. The size shift within the substrate plane is variable by at most about ±20%. Accordingly, the final size is also variable by at most about ±0.2 μm. But this size shift would hardly affect the transistor characteristics because the transistors have a channel width of as long as about 5 to 10 μm. FIG. 10 is a perspective view illustrating part of the resist mask 92 ashed.

After the thin resist portion 92b, which has covered the channel region 31 of the TFT 10, has been removed in this manner, the transparent conductive film 91 and doped semiconductor layer 7 are etched again. As a result, the structure shown in FIGS. 6D and 7J can be obtained. That is to say, by performing this etching process, respective parts of the transparent conductive film 91, which have been located between another part thereof to be the data line 5 and other parts thereof to be the drain electrodes 9, are removed. Consequently, the transparent conductive film 91 is patterned into the data lines 5 and drain electrodes 9 that have already been separated from each other. As a result of this etching process, part of the doped semiconductor layer 7, which has been located over the channel region 31, is also removed, and the exposed surface of the i-semiconductor layer 6 is also etched partially. Thereafter, the resist mask 92 (92a) is removed to obtain the structure shown in FIG. 7K (see also FIGS. 3A through 3C).

According to the first embodiment, in patterning the transparent conductive film 91, the striped semiconductor layers 6 and 7, located between the transparent conductive film 91 and gate lines 2, are patterned into a plurality of islands for respective pixels as shown in FIG. 6C. Thereafter, the data line 5 and drain electrodes 9 are totally separated by a self-aligned process, thereby completing the TFTs 10. In this manner, the semiconductor layers 6 and 7 can be self-aligned with the data line 5 and drain electrodes 9, and a mask layer defining the data line 5 and drain electrodes 9 does not have to be aligned with a mask layer defining the semiconductor layers 6 and 7.

Figure 7K:
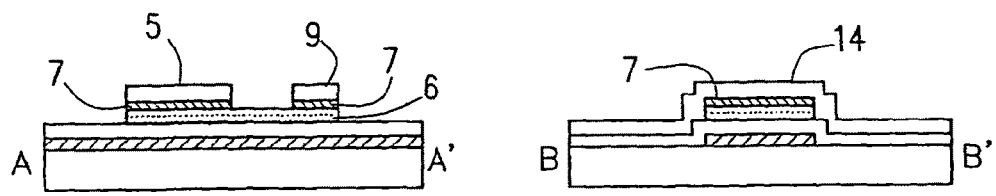
Figure 7L:
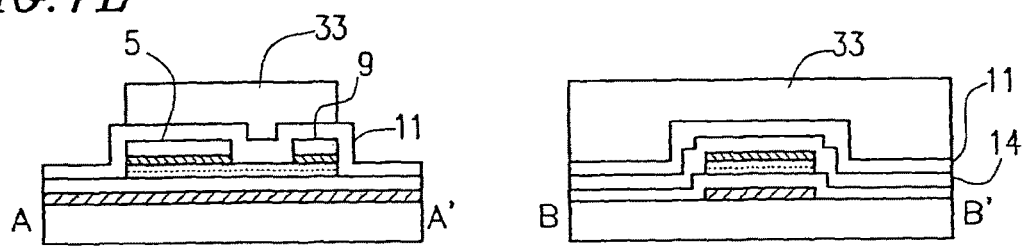

Subsequently, the TFTs 10 are covered with a passivation film 11 and then color filters 33 are electrodeposited on the pixel electrodes 14 as shown in FIGS. 7K and 7L, respectively. In the prior art, color filters are formed on the counter substrate. In that case, however, if the plastic substrate expands or shrinks, the color filters shift greatly with respect to the pixel electrodes 14. As a result, normal images cannot be displayed anymore. To avoid such a problem, the color filters 33 are formed on, and self-aligned with, the pixel electrodes 14 in accordance with this embodiment. Hereinafter, it will be described with reference to FIG. 11 how to electrodeposit the color filters in this embodiment.

Figure 11:
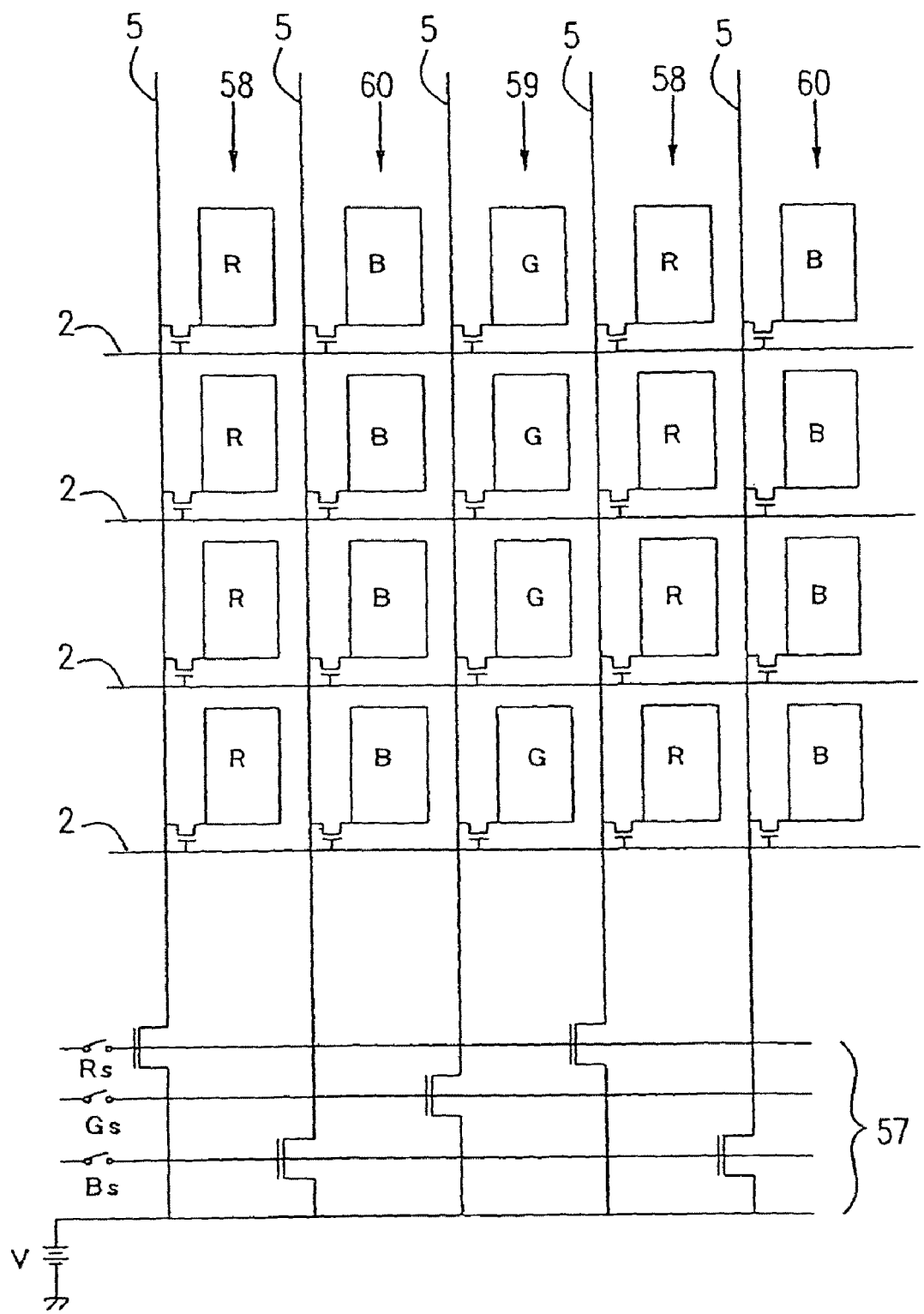
FIG. 11 is a circuit diagram illustrating how to electrodeposit color filters for the first embodiment.

To electrodeposit color filters in the three primary colors of red (R), green (G) and blue (B), the electrodeposition process should be performed three times for these three colors. That is to say, the electrodeposition process should be carried out once to form the color filters in each of the three primary colors. In the illustrated embodiment, a switching circuit 57 is disposed around the display area of the active matrix substrate as shown in FIG. 11 to selectively electrodeposit the color filters in each color using the switching circuit 57. The switching circuit 57 is comprised of TFTs and lines, which may be formed when the TFTs and lines are formed for the display area by the foregoing process.

First, it will be described how to electrodeposit the red color filters. In this case, a control signal in logical one state, for example, is input to associated ones of the TFTs through a control signal line Rs, thereby turning the TFTs ON. On the other hand, a control signal in logical zero state, for example, is input to the other TFTs through the other two control signal lines Gs and Bs, thereby turning the TFTs OFF. Then, a voltage V is applied to the switching circuit 57 to initiate the electrodeposition reaction. In the meantime, a signal with such a level as turning ON the TFTs 10 in the display area is input through each of the gate lines 2. As a result, the voltage V is applied to multiple columns 58 of pixel electrodes 14, on which the color red will be displayed, and a red dye is electrodeposited on the pixel electrodes 14 belonging to the columns 58. In this case, the color filters 33 are also formed on the data lines 5 and drain electrodes 9 to which the voltage V has been applied (see FIG. 7L).

The same electrodeposition process will be carried out to form color filters in each of the other two colors. Then, green and blue dyes will be electrodeposited on columns 59 of pixel electrodes 14 on which the color green will be displayed and on columns 60 of pixel electrodes 14 on which the color blue will be displayed, respectively. In this manner, the color filters in the three primary colors can be formed selectively and self-aligned with the pixel electrodes 14. As a result, a striped color filter layer, consisting of the color filters 33 in the three primary colors, is formed.

If the color filters 33 are made of an insulator, then a decreased effective voltage is applicable to the liquid crystal layer of an LCD in operation. To avoid such a decrease in effective voltage, the color filters are made of a conductor in the illustrated embodiment.

As described above, this embodiment needs only two photolithographic processes requiring mask alignment because self-aligned processes are carried out more often. Accordingly, even if the substrate expands or shrinks, only the mask alignment for the latter photolithographic process to be carried out on the previously defined pattern is affected by such expansion or shrinkage. In addition, by adopting a novel layout for the drain and pixel electrodes 9 and 14 as shown in FIG. 2, the semiconductor layer 6 for the TFTs 10 can be connected to the drain electrodes 9 just as intended even if the plastic substrate 1 expands or shrinks considerably.

Figure 12:
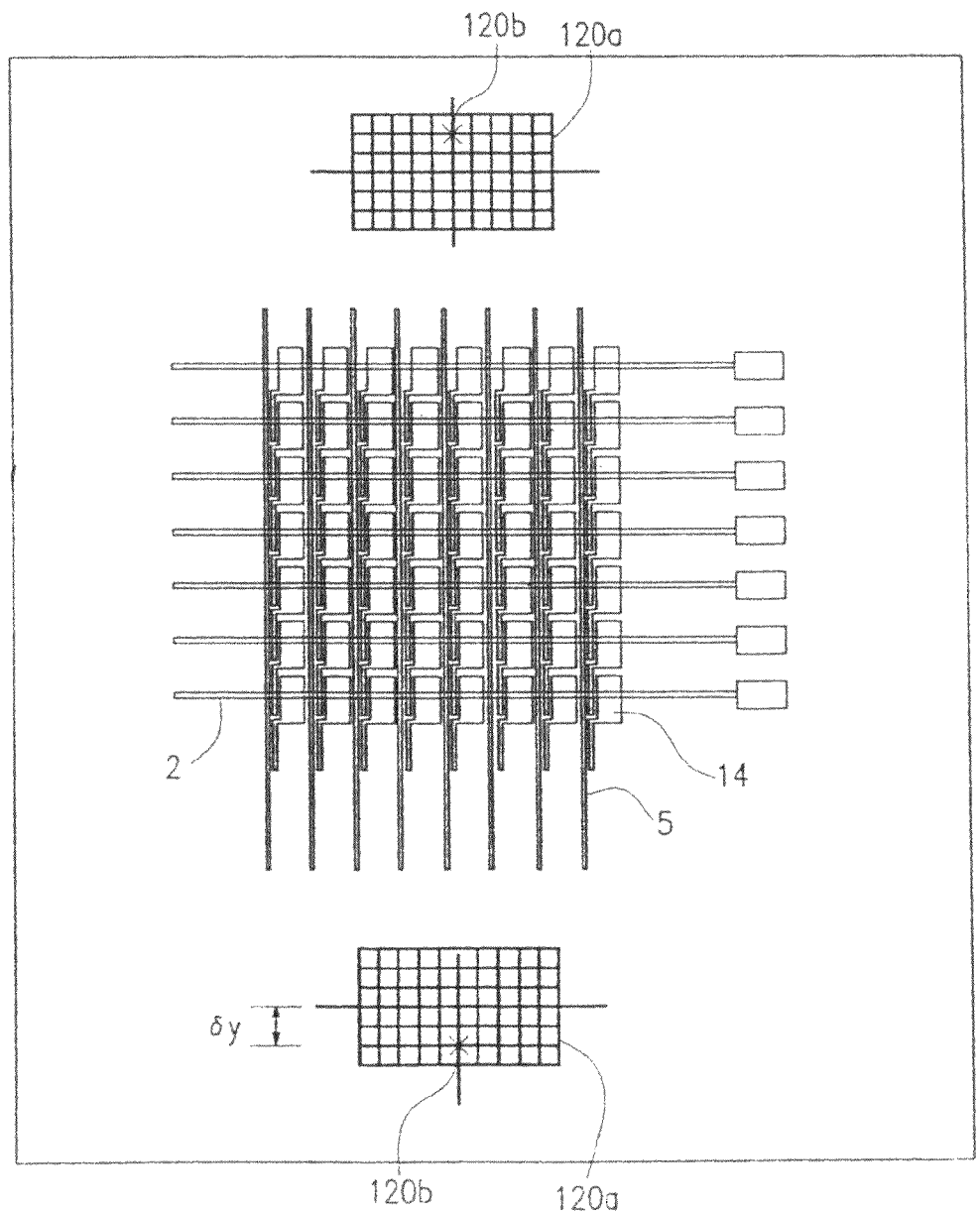
FIG. 12 is a plan view illustrating exemplary alignment markers for the first embodiment.

Unlike the glass substrate, the plastic substrate is greatly expandable and shrinkable. Accordingly, if the mask alignment is tentatively performed using alignment marks similar to known ones, no pair of alignment marks for two different layers can be aligned with each other successfully. Thus, according to this embodiment, alignment markers 120a and 120b with the patterns shown in FIG. 12 are used. In the example illustrated in FIG. 12, each marker 120a formed by the first mask is a two-dimensional lattice pattern of a size about twice (or more than twice) as long as the alignment margin $\Delta y$ given by Equation (6). On the other hand, each marker 120b formed by the second mask is a pattern (e.g., a cross pattern) that can clearly show exactly where the marker 120b is located with respect to the associated marker 120a formed by the first mask.

Using these alignment markers 120a and 120b, the shift of the pattern defined by the second mask from that defined by the first mask can be known. And based on this shift obtained, the location of the second mask is finely adjusted. For example, the mask alignment may be carried out so that the shift between the upper pair of alignment markers 120a and 120b is substantially equal to the shift between the lower pair of markers 120a and 120b.

Example

As an example of the present invention, an active matrix substrate was modeled using a plastic substrate of PES with a thickness of about 0.2 mm and a diagonal size of 5 inches. In this example, the unit pixel regions had a size of 300 μm×100 μm, the gate lines had a width $G_{width}$ of 10 μm, the pixel electrode gap $PP_{gap}$ was 5 μm, the connection had a width $Y_{con}$ of 5 μm and the drain electrodes had a length $L_d$ of 290 μm. The exposure system used had an alignment accuracy of ±5 μm. Substituting these values into Equation (5), $\Delta Y = L_d - PP_{gap} - G_{width} = 290 - 5 - 10 = 275$ μm.

In this example, to cope with either expansion or shrinkage of the plastic substrate, the vertical center of each drain electrode was approximately aligned with the centerline of its associated gate line in the center surface region of the plastic substrate. As a result, the alignment margin allowed by this example was ±132.5 μm ($\Delta y = \Delta Y/2 - dY = 137.5 - 5 = 132.5$ μm).

When a photolithograpic process was performed using the second mask, the pattern (or markers), which had been defined on the plastic substrate using the first mask, shifted from the markers defined by the second mask by 42 μm apiece. This pattern shift is equivalent to a substrate shrinkage of 661 ppm. In this example, however, an alignment margin of ±132.5 μm was allowed. Accordingly, properly operable TFTs could be formed everywhere on the substrate. That is to say, that pattern shift did not affect the performance of the active matrix substrate at all.

Figure 48:
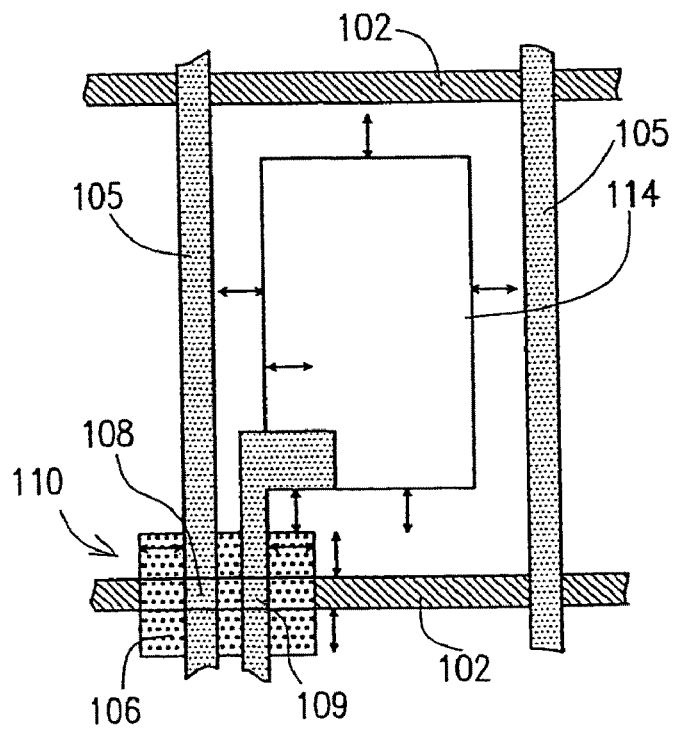
FIG. 48 is a plan view illustrating a layout for use to define a relationship between the pixel pitch and the alignment margin for yet another known active matrix substrate.
Figure 49:
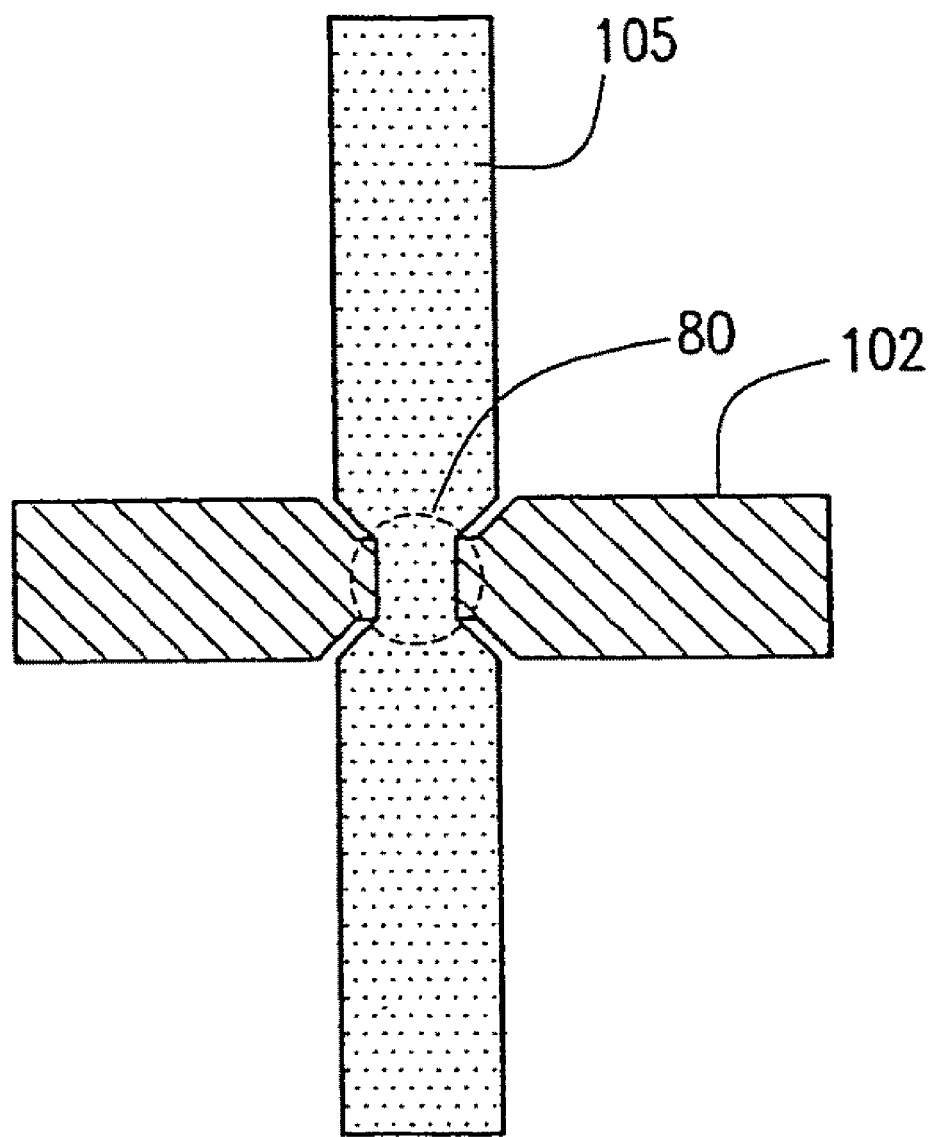
FIG. 49 is a plan view illustrating an intersection between the gate and data lines 102 and 105 in a known active matrix substrate.

In the known structure shown in FIG. 48 on the other hand, the maximum permissible substrate shrinkage is as small as ±14 μm and it is impossible to make an active matrix substrate using a plastic substrate.

The following Table 2 shows the alignment margins $\Delta y$ and substrate shrinkage values corresponding to respective pixel pitches for the known and inventive structures:

TABLE 2

| | Prior Art | | This invention | |
|---|---|---|---|---|
| Pixel Pitch (μm) | Alignment Margin (μm) | Expansion or Shrinkage (ppm) | Alignment Margin (μm) | Expansion or Shrinkage (ppm) |
| 350 | 19 | 299 | 157.5 | 2480 |
| 300 | 14 | 220 | 132.5 | 2087 |
| 250 | 9 | 142 | 107.5 | 1693 |
| 200 | 4 | 63 | 82.5 | 1299 | where the alignment accuracy of the exposure system used is supposed to be ±5 μm.

Figure 13:
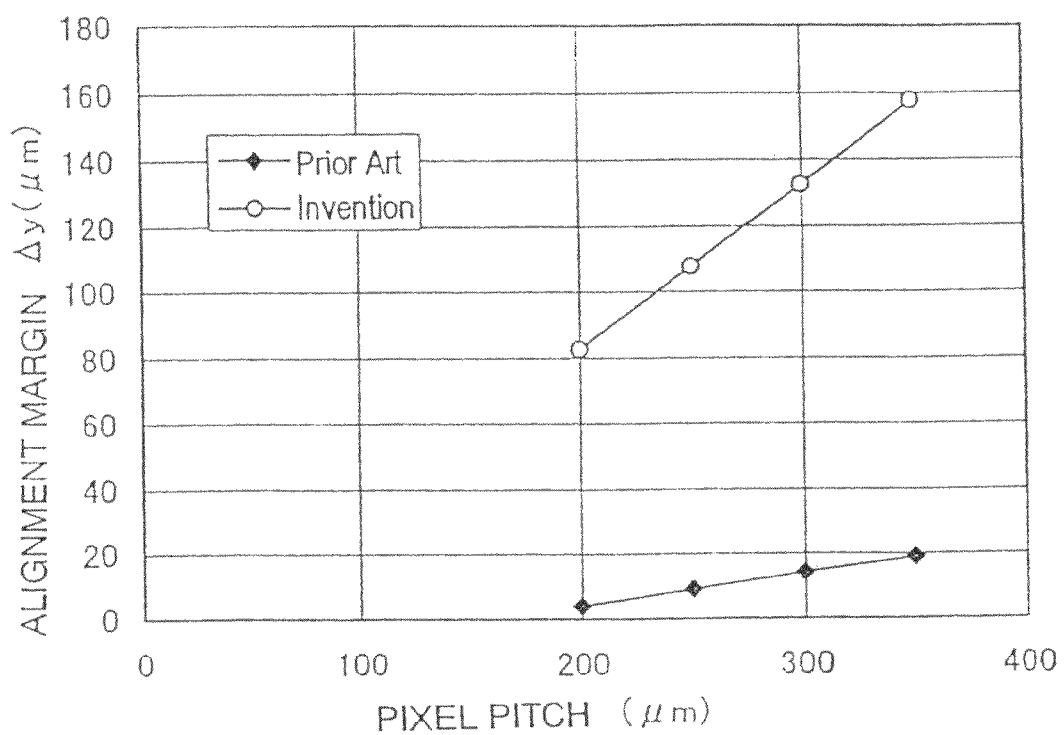
FIG. 13 is a graph illustrating relationships between the alignment margin (or substrate expansion/shrinkage margins) Δy and the pixel pitch.

FIG. 13 illustrates relationships between the alignment margin (or substrate expansion/shrinkage margin) $\Delta y$ and the pixel pitch. As can be seen from FIG. 13, this example allowed a margin much greater than that realized by any other known structure. Accordingly, even if the pixel pitch is set rather short, a plastic substrate still can be used according to this example.

As described above, according to this embodiment, even if the substrate used is expandable or shrinkable by more than 500 ppm between photolithograpic processes requiring mask alignment, all elements belonging to any layer, including the color filter layer, can be so laid out as to meet an appropriate positional relationship. Thus, this embodiment realizes an active matrix liquid crystal display device using a plastic substrate.

If the active matrix substrate of this embodiment is used in combination with a normally white mode liquid crystal layer to fabricate a liquid crystal display device, then backlight will leak through the transparent data lines and their surroundings. More specifically, the backlight likely leaks through part of the data line 5, gap between the data line 5 and drain electrode 9, gap between adjacent pixel electrodes 14 and gap between adjacent drain electrodes 9, thus decreasing the contrast of the displayed image. In contrast, if this LCD is allowed to perform a display operation in a normally black mode, then the pixel electrodes 14 to which no voltage is applied, the gap between each adjacent pair of drain electrodes 9 and the gap between each adjacent pair of pixel electrodes 14 will be displayed in black. On the other hand, the data lines 5 to which an intermediate voltage is applied will be displayed in half tones. Thus, the decrease in display contrast is suppressible.

Embodiment 2

In the first embodiment, the data lines 5, drain electrodes 9 and pixel electrodes 14 are formed by patterning a transparent conductive film of ITO, for example. Accordingly, although the data lines 5 do not have to be transparent, the data lines 5, as well as the pixel electrodes 14, are also made of the transparent conductive film. Generally speaking, a transparent conductive film has a resistivity higher than that of a metal film. For example, an ITO film has a resistivity of 200 to 400 µΩcm. Accordingly, if the data lines 5 of ITO are too long, then the signal transmitted therethrough is likely delayed excessively. For that reason, as for the active matrix substrate 100 of the first embodiment, the maximum allowable size thereof would be 5 inches diagonally.

Also, if a black matrix is formed on the counter substrate facing the active matrix substrate 100, then the openings of the black matrix are likely misaligned with the pixel electrodes 14 because the plastic substrate expands or shrinks. Nevertheless, if no black matrix is provided at all to avoid this misalignment, then the TFTs 10 will be exposed to externally incident light, thus possibly increasing their OFF-state leakage currents. Should the TFTs 10 increase their OFF-state leakage currents, the retention voltage to be applied by the pixel electrodes 14 and counter electrode to the liquid crystal layer would decrease, thus lowering the contrast of the displayed image. Also, were it not for the black matrix, the backlight would leak out through the transparent data lines and their surroundings as described above. Then, the LCD could not perform its display operation in a normally white mode. Even if the LCD is supposed to operate in a normally black mode, the resultant contrast will also decrease slightly over the data lines 5.

To solve these problems, according to this embodiment, a black matrix is formed on the active matrix substrate by a self-aligned process.

Figure 14:
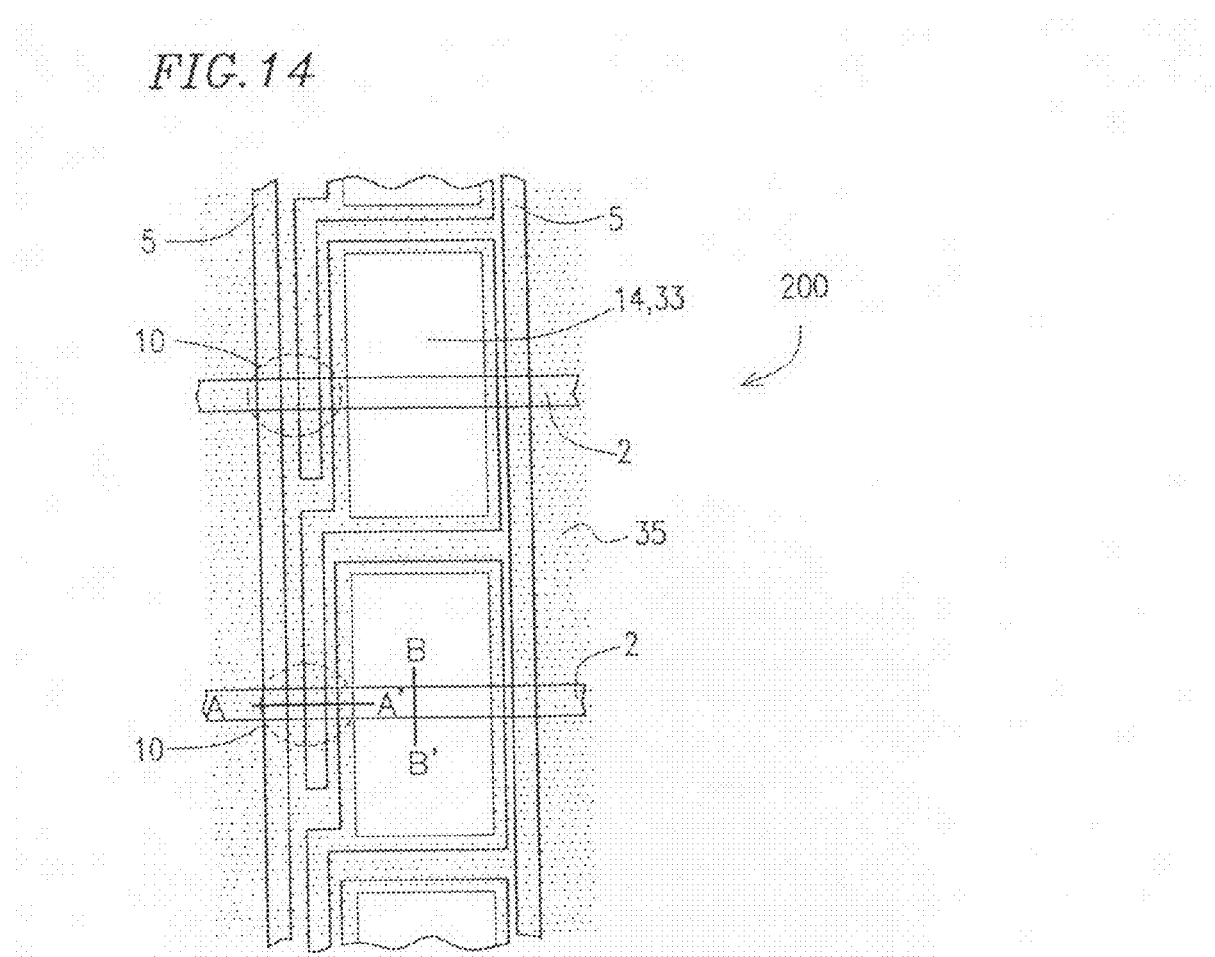
FIG. 14 is a plan view schematically illustrating a layout for an active matrix substrate 200 according to a second embodiment of the present invention.
Figure 15A:
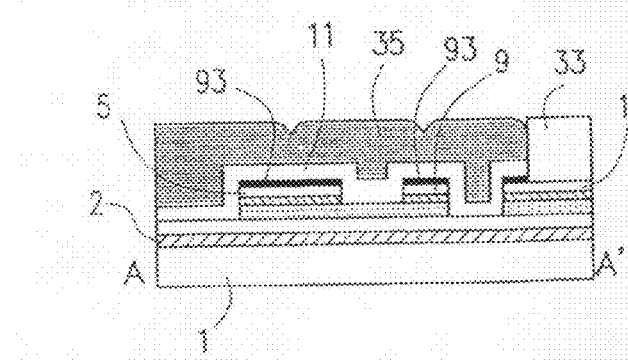
FIGS. 15A and 15B are cross-sectional views of the substrate 200 respectively taken along the lines A-A' and B-B' shown in FIG. 14.
Figure 15B:
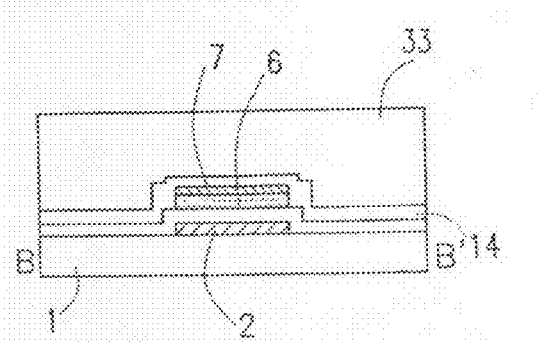

Hereinafter, a second embodiment of the inventive active matrix substrate will be described with reference to FIGS. 14, 15A and 15B. FIG. 14 is a plan view illustrating a layout for an active matrix substrate 200 according to the second embodiment. FIGS. 15A and 15B are cross-sectional views of the substrate 200 respectively taken along the lines A-A' and B-B' shown in FIG. 14.

As is clear from these drawings, the active matrix substrate 200 of the second embodiment basically has the same structure as the counterpart 100 of the first embodiment except for the following features:

1) A black matrix 35 exists where no pixel electrodes 14 exist and each of the pixel electrodes 14 is surrounded with the black matrix 35 as shown in FIG. 14. That is to say, the data lines 5, gate lines 2, TFTs 10, gaps between the data line 5 and drain electrodes 9, gaps between the drain and pixel electrodes 9 and 14, gap between adjacent pixel electrodes 14 and gap between adjacent drain electrodes 9 are all covered with the black matrix 35 to cut the incoming off;
2) The black matrix 35 is made of a negative photosensitive material and has been formed by a patterning process with backside exposure;
3) The color filters 33 exist where no black matrix 35 exists (i.e., on the pixel electrodes 14) as shown in FIGS. 15A and 15B; and
4) A metal film 93 of Ta has been deposited on the data lines 5 and drain electrodes 9 of ITO.

Ta has a resistivity of 25 to 40 µΩm, which is lower than that of ITO. Accordingly, the combination of the metal film 93 of Ta with the data line 5 of ITO serves as a low-resistance line. This is why signal can be transmitted through the low-resistance line faster than the data line obtained by patterning a transparent conductive film of ITO, for example. Thus, the active matrix substrate 200 of the second embodiment may have a greater diagonal size of 10 inches or more.

However, where the incoming light must be cut off using the black matrix 35 but the data lines 5 need not have their resistance reduced, an opaque insulating layer made of a black resin material may be formed instead of the opaque metal film of Ta on the transparent conductive film. The opaque metal film or insulating layer serves as an optical mask necessary for the process step of defining a pattern for the black matrix 35 in the fabrication process to be described below.

Hereinafter, a method of making the active matrix substrate 200 will be described in detail with reference to FIGS. 16A through 16E and FIGS. 17A through 17F. FIGS. 16A through 16E are plan views illustrating two pixel regions in main process steps. FIGS. 17A through 17F illustrate cross-sectional views taken along the lines A-A' and B-B' shown in FIGS. 16A through 16E.

Figure 16A:
FIGS. 16A through 16E are plan views illustrating two pixel regions in main process steps of a method of making the active matrix substrate 200 in accordance with the second embodiment.
Figure 17A:
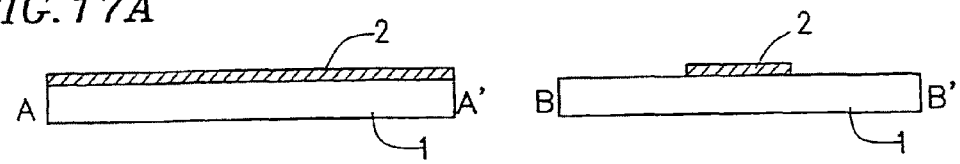
FIGS. 17A through 17F are cross-sectional views taken along the lines A-A' and B-B' shown in FIGS. 16A through 16E.

First, as shown in FIGS. 16A and 17A, multiple gate lines 2 are formed on a plastic substrate 1. The gate lines 2 may be formed by depositing a metal film of aluminum (Al) or Ta, for example, on the plastic substrate 1 by a sputtering process, for instance, and then by patterning the metal film by photolithographic and etching processes. The pattern of the gate lines 2 is defined by a (first) mask for use in the photolithographic process.

Figure 16B:
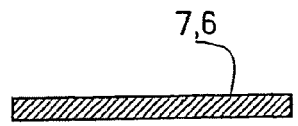
Figure 17B:
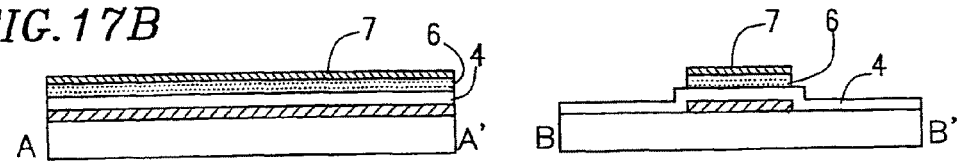

Next, as shown in FIGS. 16B and 17B, an i-semiconductor layer 6 and a doped semiconductor layer 7 are formed over the gate lines 2 with a gate insulating film 4 interposed therebetween so that these layers 6 and 7 are self-aligned with the gate lines 2. In this process step, a backside exposure process is carried out as in the first embodiment. In FIG. 16B, only the doped semiconductor layer 7 is illustrated. Actually, though, the i-semiconductor layer 6 and gate lines 2 are located under the doped semiconductor layer 7.

Figure 17C:
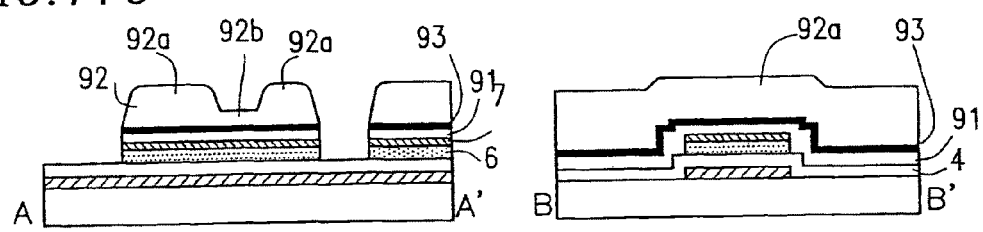
Figure 17D:
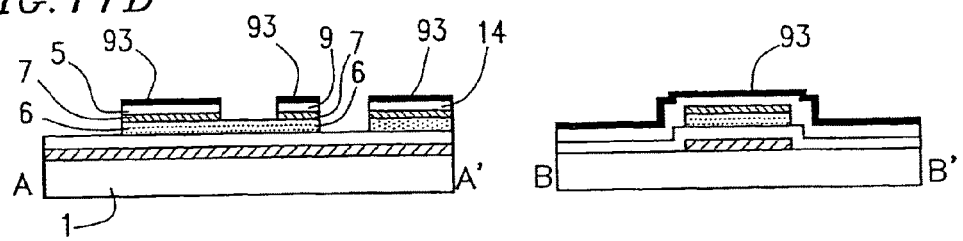

Next, a transparent conductive film 91 and an opaque metal film 93 respectively made of ITO and Ta, for example, are deposited in this order over the plastic substrate 1. Then, as shown in FIG. 17C, a resist mask 92 is defined thereon. As in the first embodiment, the resist mask 92 includes: relatively thick portions 92a defining the data lines 5, drain electrodes 9 and pixel electrodes 14; and relatively thin portions 92b defining the region between the data line 5 and drain electrodes 9.

Figure 16C:
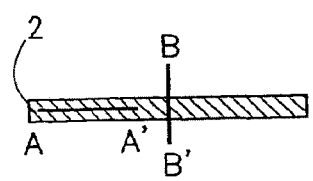
Figure 16C:
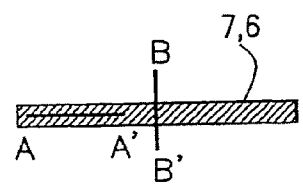
Figure 16C:
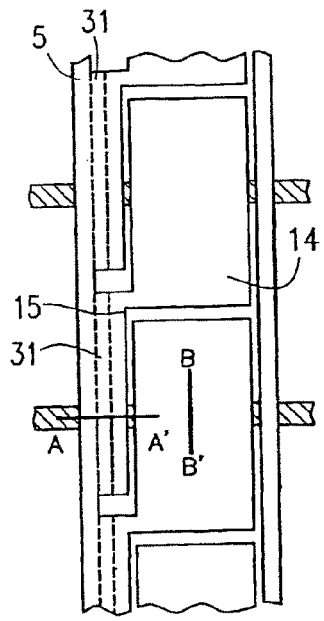
Figure 16D:
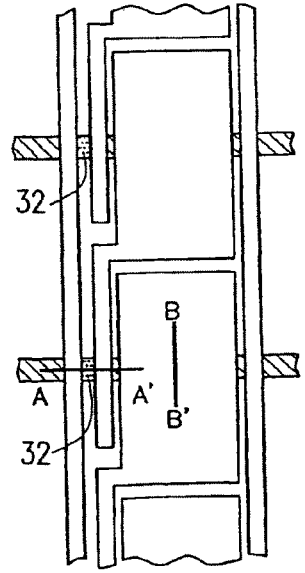

Subsequently, the opaque metal film 93, transparent conductive film 91, doped semiconductor layer 7 and i-semiconductor layer 6 are sequentially etched using the resist mask 92. FIGS. 16C and 17C illustrate a structure of the substrate when this etching process is finished. At this point in time, the channels 31 of the TFTs 10 are covered with the relatively thin portions 92b of the resist mask 92. Accordingly, the respective parts of the metal film 93, transparent conductive film 91 and doped semiconductor layer 7, which are located over the channels 31, are not yet etched at all. That is to say, parts of the transparent conductive film 91 to be the data line 5 and drain electrodes 9, respectively, have not yet been separated from each other.

Next, after the thin resist portions 92b, which have covered the channels 31 of the TFTs 10, have been removed by an oxygen plasma ashing process, for example, the metal film 93, transparent conductive film 91 and doped semiconductor layer 7 are etched again. As a result, the structure shown in FIGS. 16D and 17D can be obtained. At this point in time, the metal film 93 exists not only over the data lines 5 and drain electrodes 9 but also over the pixel electrodes 14. To make a transmission-type display device, parts of the opaque metal film 93 located over the pixel electrodes 14 should be removed selectively. Those parts of the opaque metal film 93 on the pixel electrodes 14 will be removed after a black matrix has been formed in the following manner.

Figure 17E:
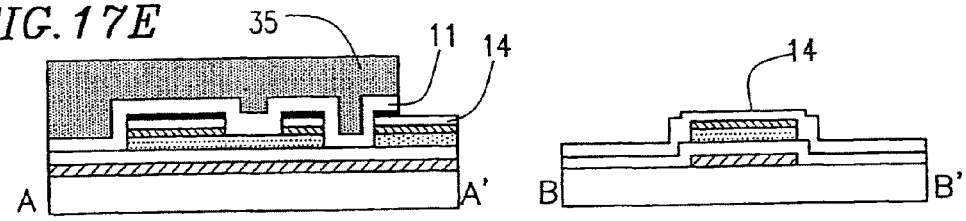
Figure 17F:
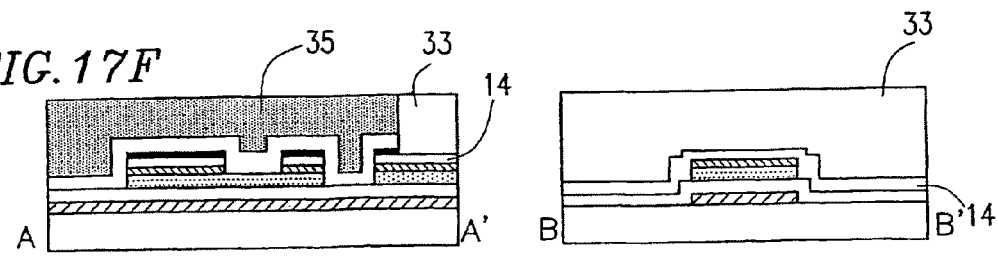

Specifically, a transparent passivation film 11 is deposited over the plastic substrate 1 and then coated with a negative photosensitive black matrix film as shown in FIG. 17E. Then, a backside exposure process is carried out. That is to say, this photosensitive black matrix film is exposed to light through the backside of the substrate 1. In this process step, the pattern of the opaque metal film 93 functions as a sort of optical mask. Accordingly, parts of the photosensitive black matrix film with relatively wide areas over the pixel electrodes 14 are hardly exposed to the light. However, other parts of the opaque metal film 93, which cover the data lines 5 and drain electrodes 9, have small line widths and exposed to the light due to diffraction of the light incoming through the backside of the substrate.

Figure 16E:
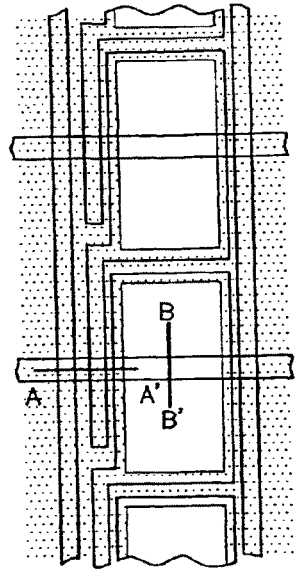

After this backside exposure process has been carried out, the photosensitive black matrix film is developed to remove the non-exposed parts thereof. As a result, a black matrix 35 is defined as shown in FIGS. 16E and 17E to have a plurality of openings, which are of almost the same shape as the pixel electrodes 14, over the pixel electrodes 14.

Thereafter, using this black matrix 35 as an etching mask, parts of the passivation film 11 and opaque metal film 93, which have been exposed through the openings of the black matrix 35, are etched away. As a result, no opaque metal film 93 exists on the pixel electrodes 14 anymore. Then, color filters 33 are electrodeposited to complete the structure shown in FIG. 17F.

In the second embodiment, the upper surface of the data lines 5 made of a transparent conductive film is backed with a metal film that has a resistivity lower than that of the transparent conductive film. Accordingly, the data lines, including the metal film formed thereon, can have their electrical resistance (i.e., interconnect resistance) reduced as a whole, thus realizing a large-scale liquid crystal display device with a diagonal size of 5 inches or more.

Also, the second embodiment greatly improves the resultant display performance because a black matrix is formed on the active matrix substrate. More specifically, the TFTs in the display area are covered with the black matrix. Accordingly, the TFTs can have their OFF-state leakage current much reduced even when exposed to the externally incident light. As a result, the decrease in contrast due to the leakage current is suppressible. In addition, the black matrix can also reduce the unwanted leakage of the backlight, thus preventing the decrease in contrast due to the light leakage, too.

Embodiment 3

Figure 18:
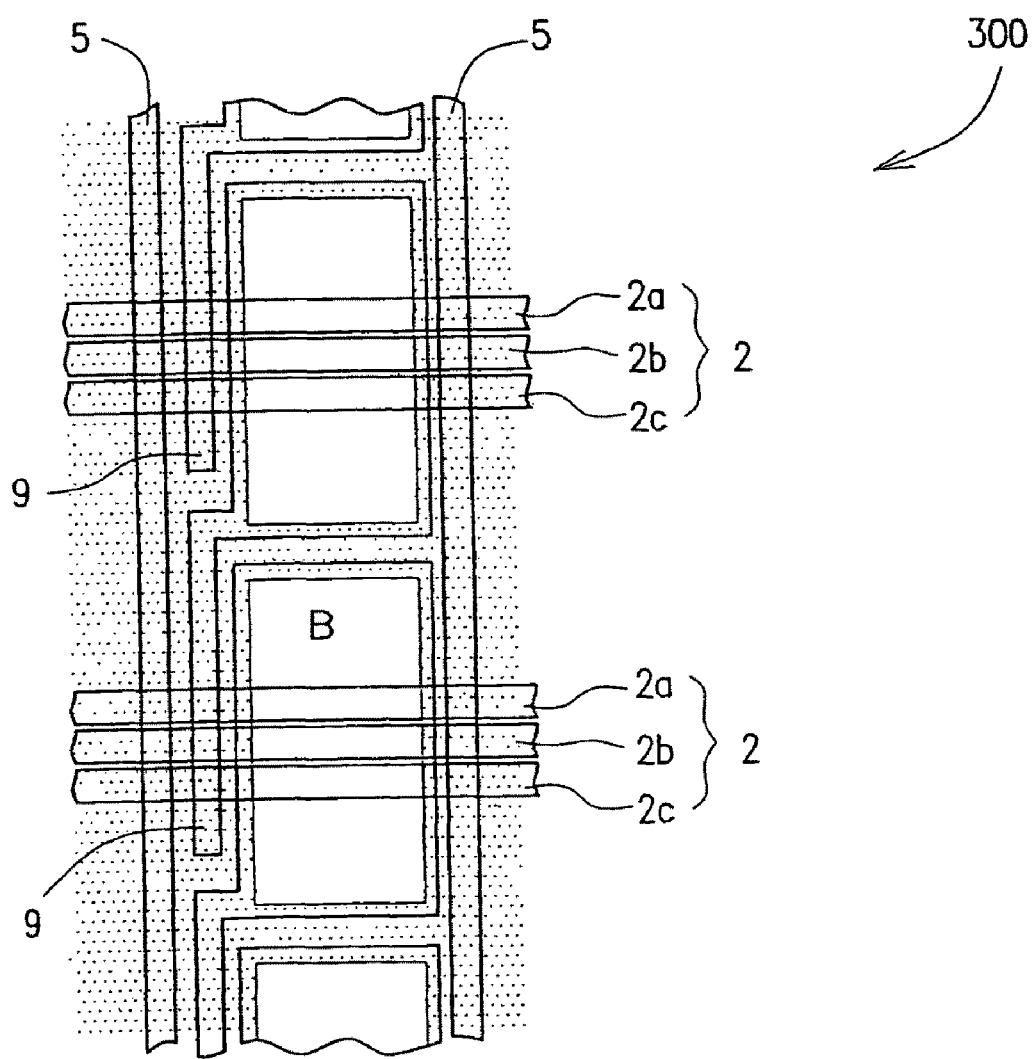
FIG. 18 is a plan view schematically illustrating a layout for an active matrix substrate 300 according to a third embodiment of the present invention.

Hereinafter, a third embodiment of the inventive active matrix substrate will be described with reference to FIG. 18 and FIGS. 19A through 19D. FIG. 18 is a plan view schematically illustrating a layout for an active matrix substrate 300 according to the third embodiment. FIGS. 19A through 19D illustrate how the pattern of a black matrix is defined by a backside exposure process.

As can be seen from FIG. 18, the active matrix substrate 300 of the third embodiment has basically the same structure as the counterpart 200 of the second embodiment except for the arrangement of the gate lines 2.

The third embodiment of the present invention is characterized by dividing each of the gate lines 2 into a plurality of line portions 2a, 2b and 2c, each having a width of 6 to 7 μm. The semiconductor layer 6 for the TFTs 10 is self-aligned with the gate line 2, and is also divided into three portions corresponding to the line portions 2a through 2c, respectively. Thus, according to the third embodiment, three TFTs are disposed for each pixel and are connected in parallel to each other between the associated data line 5 and drain electrode 9. The same scan signal is input to the three line portions 2a through 2c of each gate line 2. In response, the three TFTs perform a switching operation in a similar manner.

Following is the reason why each gate line is divided into multiple line portions.

When the backside exposure process, adopted for the first and second embodiments, is carried out, the width of the gate lines 2 defines the channel width of the TFTs 10. Generally speaking, the amount of ON-state current flowing through a transistor is proportional to the channel width thereof. Accordingly, to obtain an ON-state current in a required amount, the gate lines 2 sometimes need to have a relatively large width. The amount of ON-state current required differs depending on the size of the pixel electrodes 14 and the addressing method adopted. Typically, where the pixel electrodes 14 have a size of about 300 μm×100 μm, the channel width should be set to 10 to 20 μm.

Figure 19A:
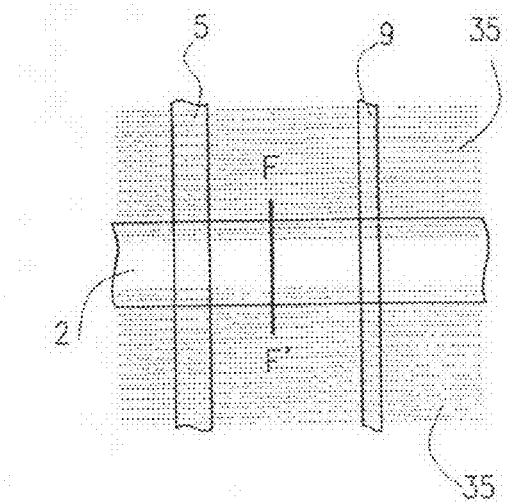
FIGS. 19A and 19B are plan views illustrating the shapes of a black matrix 35 in a region where a TFT will be formed.
Figure 19B:
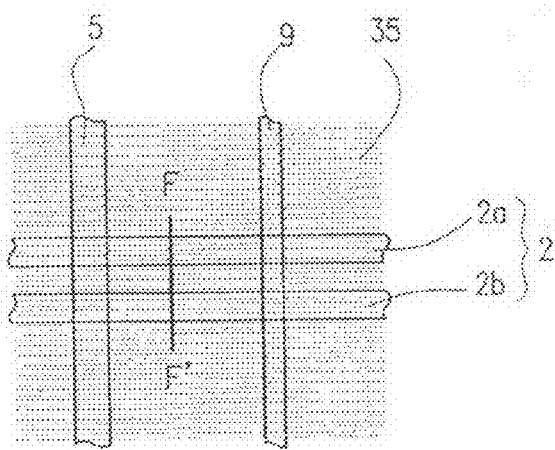
Figure 19C:
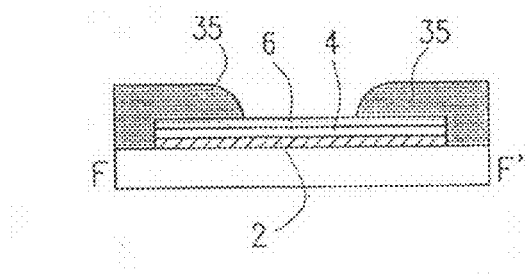
FIGS. 19C and 19D are cross-sectional views respectively taken along the lines F-F' shown in FIGS. 19A and 19B.
Figure 19D:
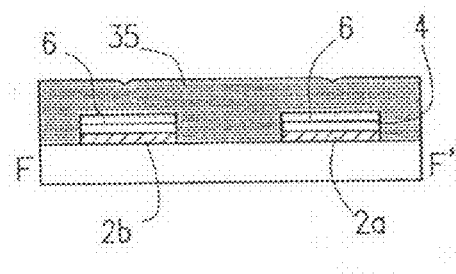

However, if the gate lines 2 have a width of 10 μm or more, then the center portion of the gate lines 2 cannot be exposed to the diffracted light sufficiently while the pattern of the black matrix film 35 is being defined by the backside exposure process. This point will be further discussed with reference to FIGS. 19A and 19C. FIGS. 19A and 19B are plan views illustrating the shapes of the black matrix 35 in a region where TFT(s) is/are formed; and FIGS. 19C and 19D are cross-sectional views respectively taken along the lines F-F' shown in FIGS. 19A and 19B.

If the width of the gate line 2 is too broad, then the diffracted part of the light, incoming through the backside of the substrate, cannot reach the portion of the negative photosensitive black matrix film located over the center of the gate line 2. That is to say, a non-exposed part of the black matrix film will exist on the gate line 2. For that reason, even after the black matrix film has been developed, the gate line 2 will be covered with the black matrix 35 only partially and the center portion thereof cannot be covered with the black matrix 35. Specifically, just both side portions of the gate line 2 will be covered with the black matrix 35 as shown in FIGS. 19A and 19C. The width of the covered portions is typically on the order of several μm. The black matrix 35 in such a shape cannot cut off the light externally incident onto the TFTs 10, thus adversely increasing the OFF-state leakage current of the TFTs 10.

In contrast, in the example illustrated in FIG. 19B, the gate line 2 has been divided into two line portions 2a and 2b. In such a layout, the gap between the line portions 2a and 2b can serve as a slit-like opening and allows the light and its diffracted parts to pass therethrough during the backside exposure process. In this manner, a greater area on the gate line 2 can be exposed to the light. As a result, the gate line 2 can be entirely covered with the black matrix 35 as shown in FIGS. 19B and 19D.

Normally, as for a photosensitive resin film on an opaque pattern, even parts of the film about 4 μm inside from the edges of the opaque pattern are also exposed to the diffracted light. Accordingly, where the gate line 2 has a width of about 8 μm or less, the gate line 2 does not have to be divided into multiple portions. However, considering the line width is changeable due to variations in fabrication process parameters, the line width would preferably be at most about 6 to 7 μm.

Referring back to FIG. 18, each gate line 2 shown in FIG. 18 has been divided into the three line portions 2a through 2c. When these line portions 2a through 2c each have a width of 6 to 7 μm, the effective width of the gate line 2 (i.e., the channel width of the TFTs 10) will be 18 to 21 μm.

In this embodiment, the semiconductor layer 6 and 7 are also self-aligned with the gate line 2. So the semiconductor layer 7 has also been divided into three portions corresponding to the three line portions 2a through 2c of the gate line 2. Accordingly, three TFTs are disposed for each pixel and are connected in parallel to each other between the data line 5 and drain electrode 9. The same scan signal is input to the line portions 2a through 2c of the gate line 2 and the TFTs each perform a similar switching operation in response to the scan signal. As a result, an increased amount of ON-state current can flow through these TFTs.

In the example illustrated in FIG. 18, the gate line 2 is divided into three line portions. However, the present invention is not limited to this specific example. Alternatively, each gate line receiving the same signal may be divided into either two portions or four or more portions. Also, the line portions of the gate line may be combined together in the areas other than the display area. For example, in an area where the gate line is connected to a driver circuit, the multiple line portions of the gate line are preferably combined into one to receive the same signal.

It should be noted that the gate line 2 only needs to be divided into multiple line portions at least in the regions where the semiconductor layer 6 for the TFTs 10 exists. Thus, the gate line 2 does not have to be divided in the regions where the pixel electrodes 14 exist, for example. However, when the plastic substrate 1 expands or shrinks, misalignment should occur in the X-axis direction. For that reason, the gate lines 2 preferably have a uniform planar shape anywhere inside the display area.

As can be seen, according to this embodiment, even if the effective line width of the gate line 2 is increased, the black matrix 35 can be formed to cover the TFTs 10 entirely.

The black matrix 35 is made of an optically amplified photosensitive material in the illustrated embodiment, but may also be made of a chemically amplified photosensitive material. Using a chemically amplified photosensitive material, even if some part is not directly exposed to light, that part will also react eventually after an exposed part has reacted. Accordingly, it would be easier for the black matrix 35 to cover a wider area on an opaque pattern.

Embodiment 4

Hereinafter, a fourth embodiment of the inventive active matrix substrate will be described with reference to FIGS. 20A through 21F. FIGS. 20A through 20E are plan views illustrating two pixel regions in main process steps for making the active matrix substrate 400. FIGS. 21A through 21F illustrate cross-sectional views taken along the lines A-A' and B-B' shown in FIGS. 20A through 20E.

In the foregoing first through third embodiments, the doped semiconductor layer 7 is deposited directly on the i-semiconductor layer 6. And to separate the data line 5 to be source electrodes from the drain electrodes 9, not only the doped semiconductor layer 7 but also the surface region of the i-semiconductor layer 6 are etched away partially. In the fourth embodiment on the other hand, a channel protective layer is interposed between the i- and doped semiconductor layers 6 and 7 to prevent the channel regions in the i-semiconductor layer 6 from being etched.

Figure 20A:
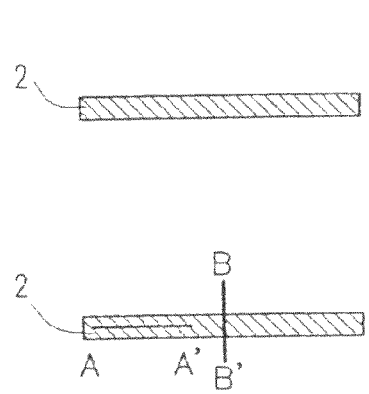
FIGS. 20A through 20E are plan views illustrating two pixel regions in main process steps of a method of making an active matrix substrate 400 in accordance with a fourth embodiment of the present invention.
Figure 20B:
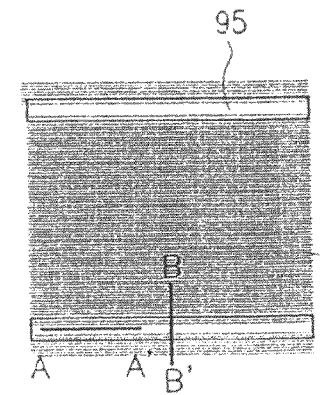
Figure 20C:
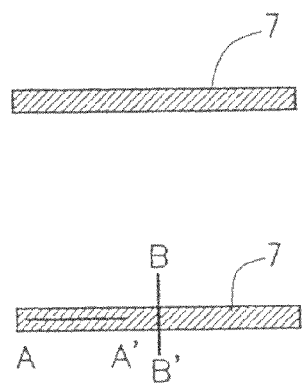
Figure 20D:
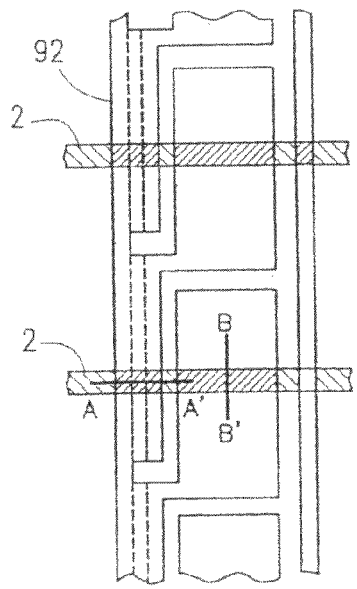
Figure 20E:
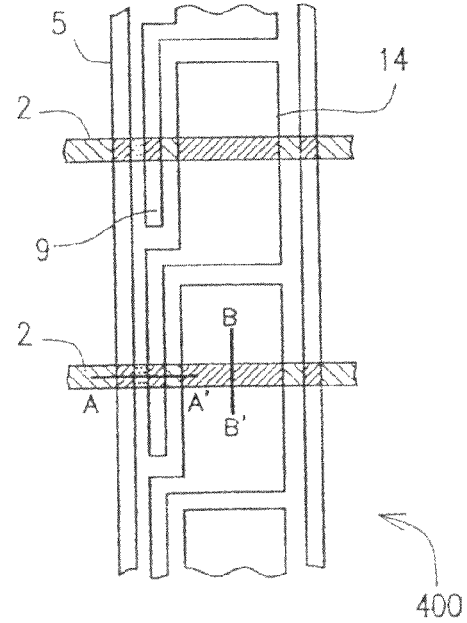
Figure 21A:
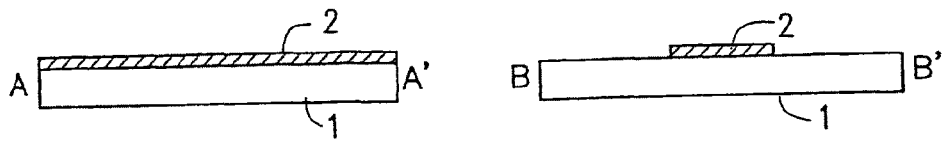
FIGS. 21A through 21F are cross-sectional views taken along the lines A-A' and B-B' shown in FIGS. 20A through 20E.
Figure 21B:
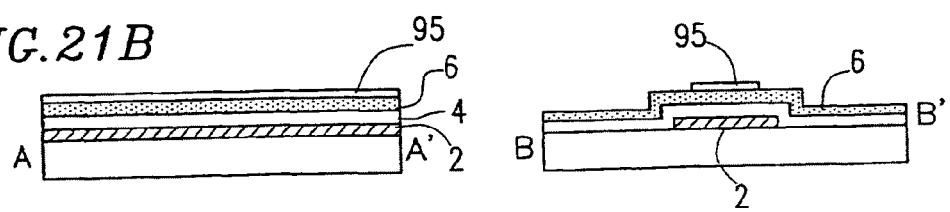
Figure 21C:
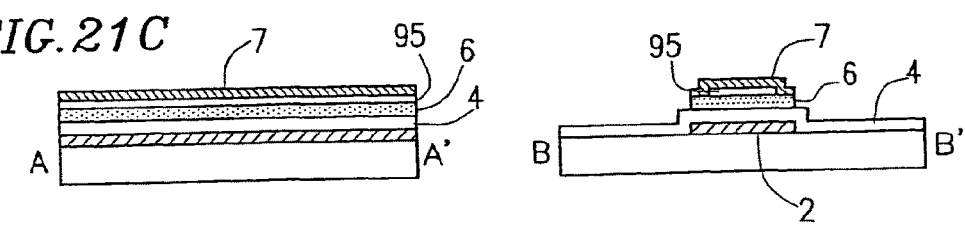
Figure 21D:
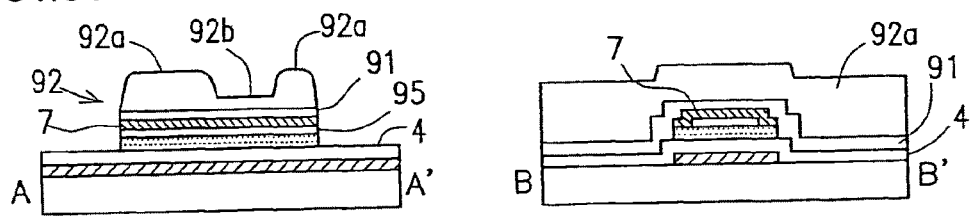
Figure 21E:
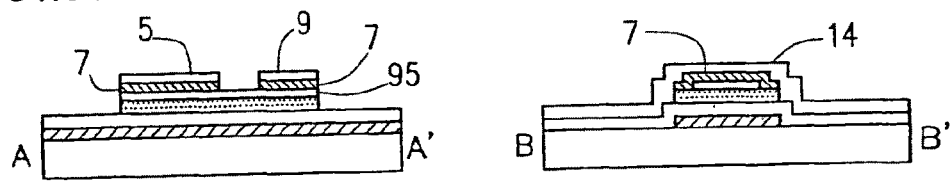
Figure 21F:
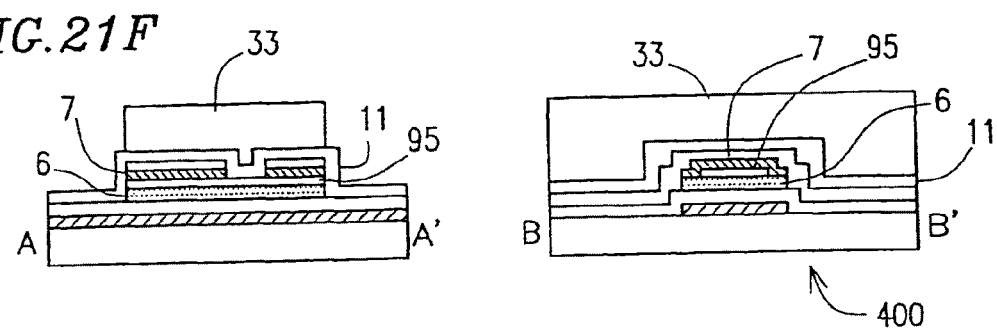

As shown in FIGS. 20E and 21F, the structure of the active matrix substrate 400 of the fourth embodiment is basically the same as that of the substrate 100 of the first embodiment except that the channel protective layer 95 is interposed between the i- and doped semiconductor layers 6 and 7. However, it is during the fabrication process that the channel protective layer 95 works. So it will be described in detail how to make the active matrix substrate 400 in accordance with the fourth embodiment.

First, as shown in FIGS. 20A and 21A, multiple gate lines 2 are formed on a plastic substrate 1. The gate lines 2 may be formed by depositing a metal film of AlNd or Ta, for example, on the plastic substrate 1 by a sputtering process, for instance, and then by patterning the metal film by photolithographic and etching processes. The pattern of the gate lines 2 is defined by a (first) mask for use in the photolithographic process.

Next, as shown in FIGS. 20B and 21B, an i-semiconductor layer 6 and a channel protective layer 95 are deposited in this order over the substrate 1 with a gate insulating film 4 interposed therebetween. Then, the channel protective layer 95 is patterned by a backside exposure process and self-aligned with the gate lines 2. In this process step, only the channel protective layer 95 is patterned without etching the i-semiconductor layer 6. The channel protective layer 95 is preferably formed out of an $SiN_x$ film with a thickness of about 200 μm. In the illustrated embodiment, the exposure and etching conditions are controlled in such a manner that the line width of the channel protective layer 95 is narrower than that of the gate lines 2 by about 1 to 4 μm. As a result, each edge of the channel protective layer 95 is located inside the associated edge of the gate line 2 by about 0.5 to 2 μm. Alternatively, the line width of the channel protective layer 95 may be even narrower than that of the gate lines 2. In that case, the channel protective layer 95 should be side-etched more deeply by performing an isotropic etching process such as wet etching.

Next, a doped semiconductor layer 7 is deposited over the channel protective layer 95 and i-semiconductor layer 6 by a CVD process. Then, the doped and i-semiconductor layers 7 and 6 are patterned by a backside exposure process again and self-aligned with the gate lines 2. In FIG. 20C, only the doped semiconductor layer 7 is illustrated. Actually, though, the channel protective layer 95, i-semiconductor layer 6 and gate lines 2 are located under the doped semiconductor layer 7. In this case, however, the line width of the channel protective layer 95 is narrower than that of the i-semiconductor layer 6 or gate lines 2. As used herein, the "line width" of the channel protective layer 95 means the distance between two of the four side faces of the channel protective layer 95 that are parallel to the direction in which the gate lines 2 extend.

Next, a transparent conductive film 91 of ITO, for example, is deposited over the plastic substrate 1. Then, as shown in FIG. 21D, a resist mask 92 is defined. As in the first embodiment, the resist mask 92 includes: relatively thick portions 92a defining the data lines 5, drain electrodes 9 and pixel electrodes 14; and relatively thin portions 92b defining the region between the data line 5 and drain electrodes 9.

Subsequently, the transparent conductive film 91, doped semiconductor layer 7, channel protective layer 95 and i-semiconductor layer 6 are sequentially etched using the resist mask 92. FIGS. 20D and 21D illustrate a structure of the substrate when this etching process is finished. At this point in time, the channels of the TFTs 10 are covered with the relatively thin portions 92b of the resist mask 92. Accordingly, the respective parts of the transparent conductive film 91, doped semiconductor layer 7, channel protective layer 95 and i-semiconductor layer 6, which are located over the channel regions, are not yet etched at all.

Next, after the thin resist portions 92b, which have covered the channels of the TFT 10, have been removed by an oxygen plasma ashing process, for example, the transparent conductive film 91 and doped semiconductor layer 7 are etched again. In this etching process step, the channel protective layer 95, located under the doped semiconductor layer 7, serves as an etch stop layer, or protects the channel regions in the i-semiconductor layer 6 from etching-induced damage. As a result, the structure shown in FIGS. 20E and 21E can be obtained. Thereafter, a passivation film 11 is deposited over the plastic substrate 1 and then color filters 33 are electrodeposited thereon to complete the structure shown in FIG. 21F.

In the fourth embodiment, each stripe of the channel protective layer 95, located over the gate line 2, is divided into multiple portions for respective pixels using the mask for defining a pattern for the data lines 5 and drain electrodes 9. Accordingly, the channel protective layer 95 can be self-aligned with not only the gate lines 2 but also the data lines 5 and drain electrodes 9. More specifically, two out of the four side faces of the channel protective layer 95, which are parallel to the direction in which the data line 5 and drain electrodes 9 extend, are aligned with the outer side faces of the data line 5 and drain electrodes 9.

Accordingly, no misalignment should occur between the channel protective layer 95 and the data line 5 or drain electrodes 9. As a result, an array of channel-protected TFTs can be formed over an easily expandable and shrinkable substrate.

As can be seen, according to this embodiment, there is no need to leave a great alignment margin for the channel protective layer 95. In addition, the line width of the channel protective layer 95 as defined between the two side faces thereof, which are parallel to the direction in which the gate lines 2 extend, is narrower than the line width of the gate lines 2. Accordingly, contact regions can be defined on the semiconductor layer 6 where the channel protective layer 95 does not exist.

Embodiment 5

Hereinafter, a fifth embodiment of the inventive active matrix substrate will be described with reference to FIGS. 22 through 25, in which each member already described for any of the foregoing embodiments is identified by the same reference numeral as that used for the embodiment.

Figure 22:
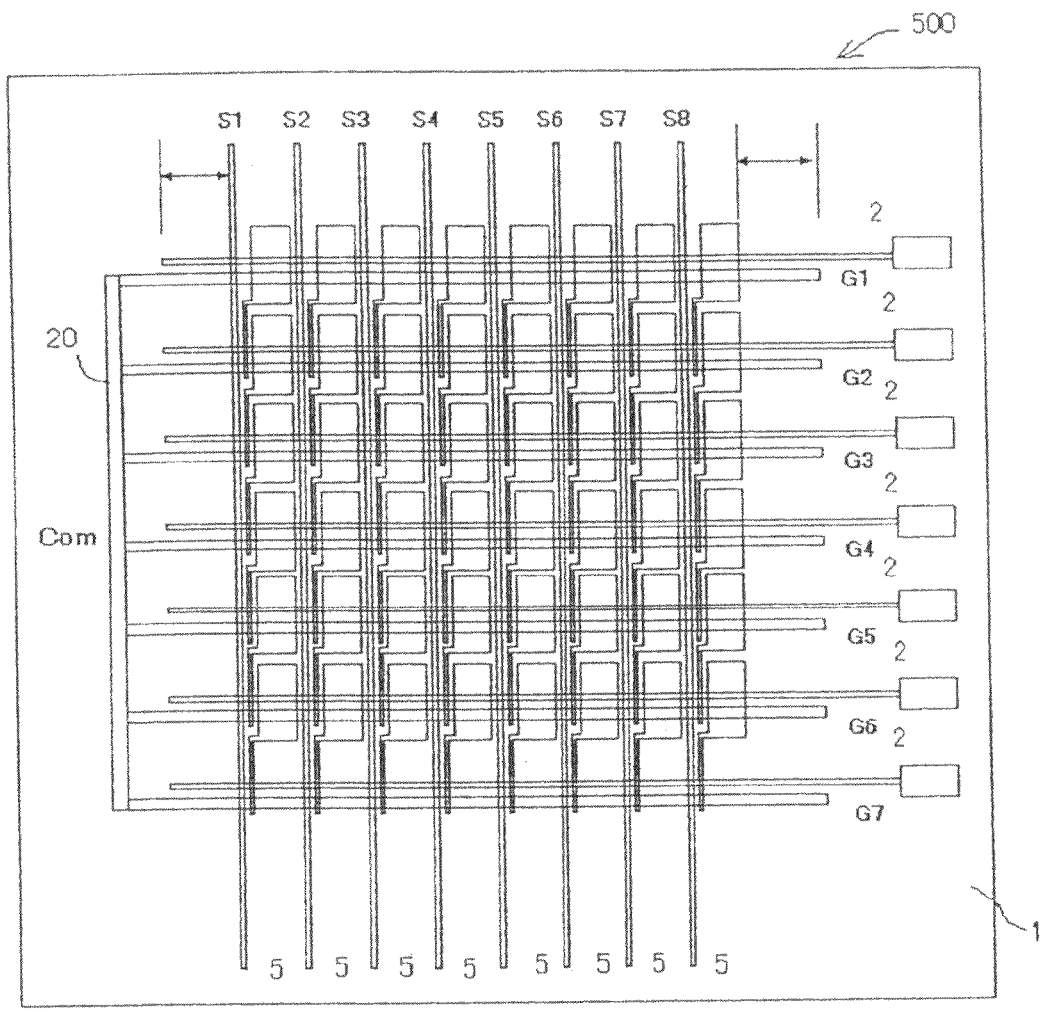
FIG. 22 is a plan view schematically illustrating a layout for an active matrix substrate 500 according to a fifth embodiment of the present invention.

First, referring to FIG. 22, illustrated schematically is a layout for an active matrix substrate 500 according to the fifth embodiment. Unlike the first through fourth embodiments, a storage capacitance line (Com) 20 is disposed between each adjacent pair of gate lines 2 (e.g., between G1 and G2) on the substrate 500 and extends parallel to the gate lines 2. The storage capacitance lines 20 and gate lines 2 belong to the same layer and are made of the same material. Throughout the pixel regions on the active matrix substrate 500, the storage capacitance lines 20, as well as the gate lines 2, extend in stripes and have no protrusions in their planar layout. FIG. 22 illustrates just seven gate lines 2, seven storage capacitance lines 20 and eight data lines 5 for the sake of simplicity. Actually, though, a huge number of gate lines 2, storage capacitance lines 20 and data lines 5 are arranged to form a matrix.

Figure 23:
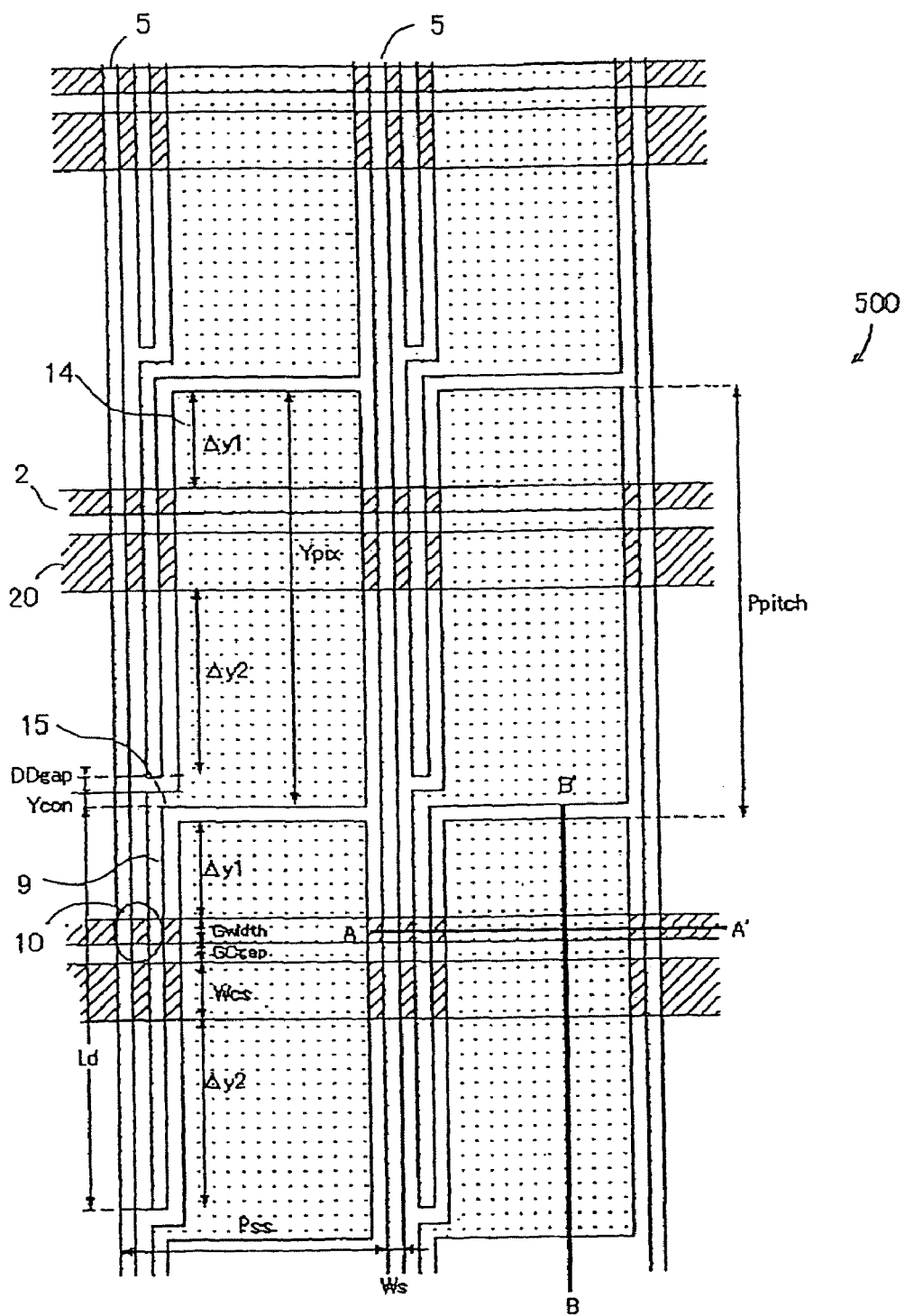
FIG. 23 is a plan view illustrating part of the display area of the active matrix substrate 500 to a larger scale.

Next, referring to FIG. 23, illustrated is part of the display area of the active matrix substrate 500 to a larger scale.

As shown in FIG. 23, a conductive member 9 has been long extended parallel to the data lines 5 from the associated pixel electrode 14 that extends across one of the gate lines 2 and one of the storage capacitance lines 20. The direction in which the conductive member 9 extends is Y-direction in FIG. 23. The conductive member 9 serves as a drain electrode for the associated TFT 10 and electrically connects the associated pixel electrode 14 and the TFT 10 together.

In the illustrated embodiment, a semiconductor layer for the TFTs 10 has been patterned and self-aligned with the gate lines 2, and the data lines 5 and conductive members (or drain electrodes) 9 are arranged to extend across the semiconductor layer. The semiconductor layer has also been patterned and self-aligned with the storage capacitance lines 20. Thus, parasitic TFTs are formed physically by each storage capacitance line 20 and the semiconductor layer. However, a signal at such a level as turning OFF those parasitic TFTs is always input to the storage capacitance lines 20. For that reason, the parasitic TFTs do not operate as switching elements.

As shown in FIG. 23, the drain electrode 9, connected to an arbitrary one of the TFTs 10, crosses one of the gate lines 2 and one of the storage capacitance lines 20, while the pixel electrode 14, connected to the drain electrode 9, crosses another one of the gate lines 2 and another one of the storage capacitance lines 20. And the former and latter gate lines 2 or storage capacitance lines 20 are vertically adjacent to each other.

Generally speaking, when an active matrix substrate is applied to a liquid crystal display device, for example, any variation in pixel potential caused by the gate-drain capacitance $C_{gd}$ of a TFT should preferably be suppressed to improve the display performance and reduce the power dissipation. The variation $\Delta V$ in pixel potential caused by $C_{gd}$ is given by $$\Delta V = C_{gd}/(C_{gd}+C_{cs}+C_{lc}) \cdot V_{gpp}$$

where $C_{cs}$ is the storage electrode capacitance (i.e., capacitance formed between the gate and storage capacitance lines 2, and the pixel electrode 14), $C_{lc}$ is the liquid crystal capacitance and $V_{gpp}$ is the potential difference created on the gate line 2 between the ON and OFF states. $V_{gpp}$ and $C_{lc}$ are determined by the materials used or the basic device characteristics. Accordingly, to decrease ΔV, the storage capacitance $C_{cs}$ may be increased. Where an alignment free structure is adopted, however, ΔV should not be controlled by increasing the width of the gate lines 2. This is because when the storage capacitance $C_{cs}$ is increased by broadening the gate lines 2, $C_{gd}$ also increases. For example, suppose the gate lines 2 have had their width $G_{width}$ increased by K times to raise the storage capacitance $C_{cs}$. In that case, $C_{cs}'=K \cdot C_{cs}$ since the storage capacitance $C_{cs}$ is proportional to the width $G_{width}$ of the gate lines. On the other hand, the gate-drain capacitance $C_{gd}$ is also proportional to the width $G_{width}$ of the gate lines and $C_{gd}'=K \cdot C_{gd}$. Accordingly, the dynamic voltage shift ΔV' of pixel electrodes is given by:

$$\Delta V' = K \cdot C_{gd}/(K \cdot C_{gd} + K \cdot C_{cs} + C_{lc}) = C_{gd}/(C_{gd} + C_{cs} + C_{lc}/K) \quad (7)$$

As is clear from this Equation (7), the greater the constant K, the greater the voltage shift ΔV'. Stated otherwise, if K is decreased, then the voltage shift ΔV' also decreases. In the actual fabrication process, however, the line width of the gate lines 2 cannot be reduced to less than a predetermined minimum value due to various process-related constraints. Accordingly, it is difficult to reduce the voltage shift ΔV' sufficiently by setting K as small as possible.

Thus, according to the fifth embodiment, the storage capacitance is formed between the storage capacitance line 20 and pixel electrode 14 in addition to the capacitance between the gate line 2 and pixel electrode 14. And by adjusting the width of the storage capacitance line 20, the voltage shift ΔV can be reduced.

In the fifth embodiment, the gap between the gate and storage capacitance lines 2 and 20, crossing the pixel electrodes 14 on the same row, should preferably be as narrow as possible to increase the margin left for the expansion and shrinkage of the substrate.

Figure 24:
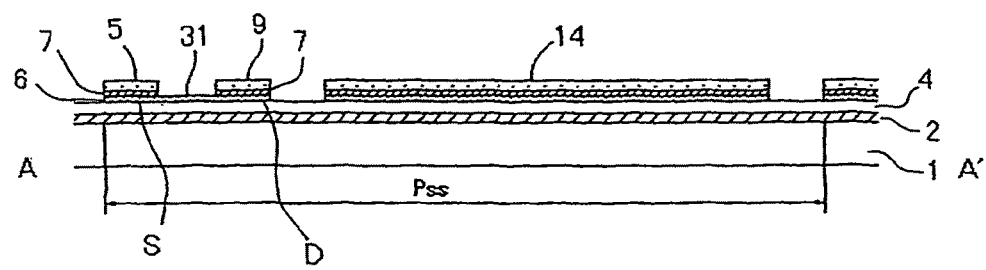
FIG. 24 is a cross-sectional view of the substrate 500 taken along the line A-A' shown in FIG. 23.
Figure 25:
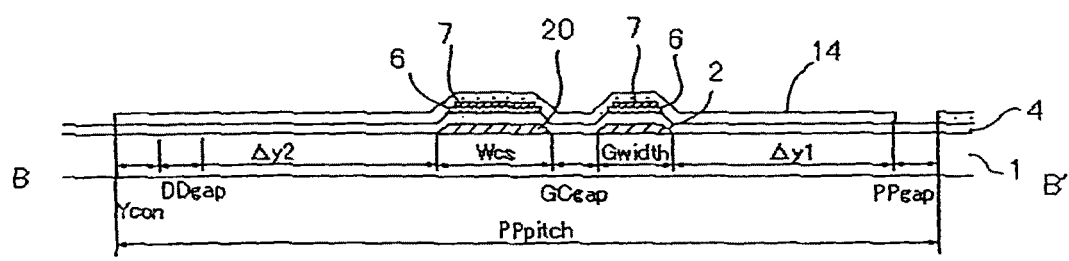
FIG. 25 is a cross-sectional view of the substrate 500 taken along the line B-B' shown in FIG. 23.

Next, turning to FIGS. 24 and 25, illustrated are cross-sectional views of the substrate 500 respectively taken along the lines A-A' and B-B' shown in FIG. 23.

As shown in FIG. 24, the TFT 10 of the fifth embodiment has a multilayer structure including the gate line 2 (serving as its gate electrode), gate insulating film 4, i-semiconductor layer 6 and doped semiconductor layer 7 that have been stacked in this order on the substrate 1. In the illustrated embodiment, the i-semiconductor layer 6 is made of non-doped amorphous silicon, while the doped semiconductor layer 7 is made of $n^+$-type microcrystalline silicon that has been heavily doped with an n-type dopant such as phosphorus (P). The data line 5 and drain electrode 9 are electrically connected to source/drain regions in the semiconductor layer 6 by way of the doped semiconductor layer 7 serving as a contact layer. As can be easily understood, part of the data line 5 extending linearly (i.e., that part crossing the gate line 2) functions as a source electrode 8 for the TFT 10.

As shown in FIG. 24, part 31 of the semiconductor layer 6 located between the source/drain regions S and D thereof serves as a channel region, over which no doped semiconductor layer 7 exists. In the illustrated embodiment, the TFT 10 is implemented as a channel-etched bottom-gate thin-film transistor. The upper surface of the channel region in the semiconductor layer 6 is etched shallow when that part of the doped semiconductor layer 7 is removed.

It can also be seen that the semiconductor layers 6 and 7 also exist over the gate line 2 even in a region where the pixel electrode 14 has been formed. However, as shown in FIG. 24, part of the semiconductor layers 6 and 7 in the region where the pixel electrode 14 exists is spaced apart from another part of the semiconductor layers 6 and 7 for the TFT 10. Thus, the former part of the semiconductor layers 6 and 7 does not constitute any parasitic transistor. Accordingly, no crosstalk will be observable between a pair of pixels belonging to the same row (or gate line).

The storage capacitance line 20 and its associated components also have the same cross section as that of the gate line 2 and its associated components shown in FIG. 24. On the storage capacitance line 20, the semiconductor layer 6 also exists between the data line 5 and drain electrode 9, thus forming a parasitic TFT. However, this parasitic transistor does not turn ON because the storage capacitance line 20 is always supplied with a voltage of about −8 to 15 V. Accordingly, the data line 5 and drain electrode 9 on the storage capacitance line 20 are electrically isolated from each other.

In the illustrated embodiment, the data lines 5, drain electrodes 9 and pixel electrodes 14 are all made of a conductive layer obtained by patterning a single reflective electrode film, and all belong to the same layer. The data lines 5, drain electrodes 9 and pixel electrodes 14 are covered with a passivation film 11.

The alignment margin ΔY allowed between the gate and storage capacitance lines 2, 20 and drain electrodes 9 (or pixel electrodes 14) is given by $$\Delta Y = L_d - PP_{gap} - G_{width} - W_{cs} - GC_{gap} \quad (8)$$
$$= P_{pitch} - G_{width} - PP_{gap} - W_{cs} - GC_{gap} - DD_{gap} - Y_{con}$$

where $G_{width}$ is the width of the gate lines 2, $W_{cs}$ is the width of the storage capacitance lines 20 and $GC_{gap}$ is the gap between the gate and storage capacitance lines 2, 20.

As can be seen, even if the gate line pitch has increased or decreased due to the expansion or shrinkage of the plastic substrate, the layout of this embodiment still allows an alignment margin great enough to cope with the variation. Accordingly, properly operable TFTs can be formed everywhere on the substrate and the variation in transistor characteristic or parasitic capacitance within the substrate plane is suppressible. In addition, the data lines 5, drain electrodes 9 and pixel electrodes 14 are all formed by patterning a single transparent conductive film or reflective electrode film as described above. Accordingly, there is no concern about misalignment among the data lines 5, drain electrodes 9 and pixel electrodes 14.

Example

As an example of the present invention, an active matrix substrate was modeled using a plastic substrate of PES with a thickness of about 0.2 mm and a diagonal size of 5 inches. The panel obtained by using the active matrix substrate had a diagonal size of 3.9 inches and a resolution of ¼ VGA (i.e., 320×RGB×240). In this example, the unit pixel regions had a size of 82 μm×246 μm, the gate lines 2 had a width $G_{width}$ of 8 μm, the pixel electrode gap $PP_{gap}$ was 5 μm, the connection had a width $Y_{con}$ of 5 μm, the storage capacitance lines 20 had a width $W_{cs}$ of 25 μm, the gap $GC_{gap}$ between the storage capacitance and gate lines 20 and 2 was 10 μm and the drain electrode gap $DD_{gap}$ was 5 μm. Then, ΔY=246−8−5−25−10−5−5=188 μm.

In this example, to cope with either expansion or shrinkage of the plastic substrate, the respective components were arranged to meet $\Delta Y1=\Delta Y2$ in the center surface region of the plastic substrate. As a result, the alignment margin $\Delta Y$ allowed between the gate line layer and the source line/pixel electrode layer by this example was ±91 μm ($\Delta Y=\Delta Y/2-dY$, where dY is the accuracy of the aligner and was 3 μm).

The length of the display area in the $\Delta Y$ direction was 240 lines×246 μm=59040 μm, so a substrate expansion/shrinkage margin of 1541 ppm was allowed between the two layers. In this active matrix substrate actually modeled, the plastic substrate expanded or shrunk by about 500 to 700 ppm. However, a sufficient alignment margin was allowed in this example. Accordingly, properly operable TFTs could be formed in every pixel region on the substrate. That is to say, the expansion or shrinkage did not affect the performance of the active matrix substrate at all.

The following Table 3 shows substrate expansion/shrinkage margins for various pixel pitches for the inventive and known structures:

TABLE 3

| Pixel Pitch (μm) | Prior Art | | This invention | |
|---|---|---|---|---|
| | Alignment Margin (μm) | Expansion or Shrinkage (ppm) | Alignment Margin (μm) | Expansion or Shrinkage (ppm) |
| 350 | 19 | 234 | 143 | 2344 |
| 300 | 14 | 172 | 118 | 1934 |
| 250 | 9 | 110 | 93 | 1524 |
| 200 | 4 | 49 | 68 | 1114 | where the display area had a size of 4 inches diagonally (i.e., 81.2 mm×61 mm), the gate line terminals were arranged along the shorter sides and the exposure system had an alignment accuracy of ±3 μm.

Embodiment 6

The foregoing first through fifth embodiments can increase the alignment margin because the pixel electrodes 14 and data lines 5 belong to the same layer. However, since the pixel electrodes 14 are laid out along with the data lines 5, the size of the pixel electrodes 14 should not exceed a certain limit. Accordingly, the aperture ratio (i.e., the area ratio of a pixel electrode to a unit pixel region in a reflective liquid crystal display device) cannot be increased sufficiently.

Generally speaking, a liquid crystal display device using a plastic substrate is expected to be implemented as a reflective liquid crystal display device to make full use of the lightweight and thin substrate. It is said, however, that a reflective liquid crystal display device cannot attain a good viewing characteristic unless the device has an aperture ratio of 70% or more. For that purpose, a known reflective liquid crystal display device using a glass substrate realizes an aperture ratio of 80 to 90% by placing the pixel electrodes 14 and data lines 5 in mutually different layers and eliminating the gap usually needed between them.

The structures of the first through fifth embodiments can attain an aperture ratio as low as about 30 to 50%. Thus, to increase the aperture ratio, the pixel electrode 14 has a two-layer structure in the sixth embodiment shown in FIG. 26. Specifically, the pixel electrode 14 of this embodiment includes: an upper-level pixel electrode 14A functioning as a reflective electrode; and a lower-level pixel electrode 14B forming a storage capacitance. The upper-level pixel electrodes 14A are placed in a layer overlying the data lines 5 with an insulating film interposed therebetween, while the lower-level pixel electrodes 14B and data lines 5 belong to the same layer. Then, the alignment margin can be increased without decreasing the aperture ratio.

Figure 26:
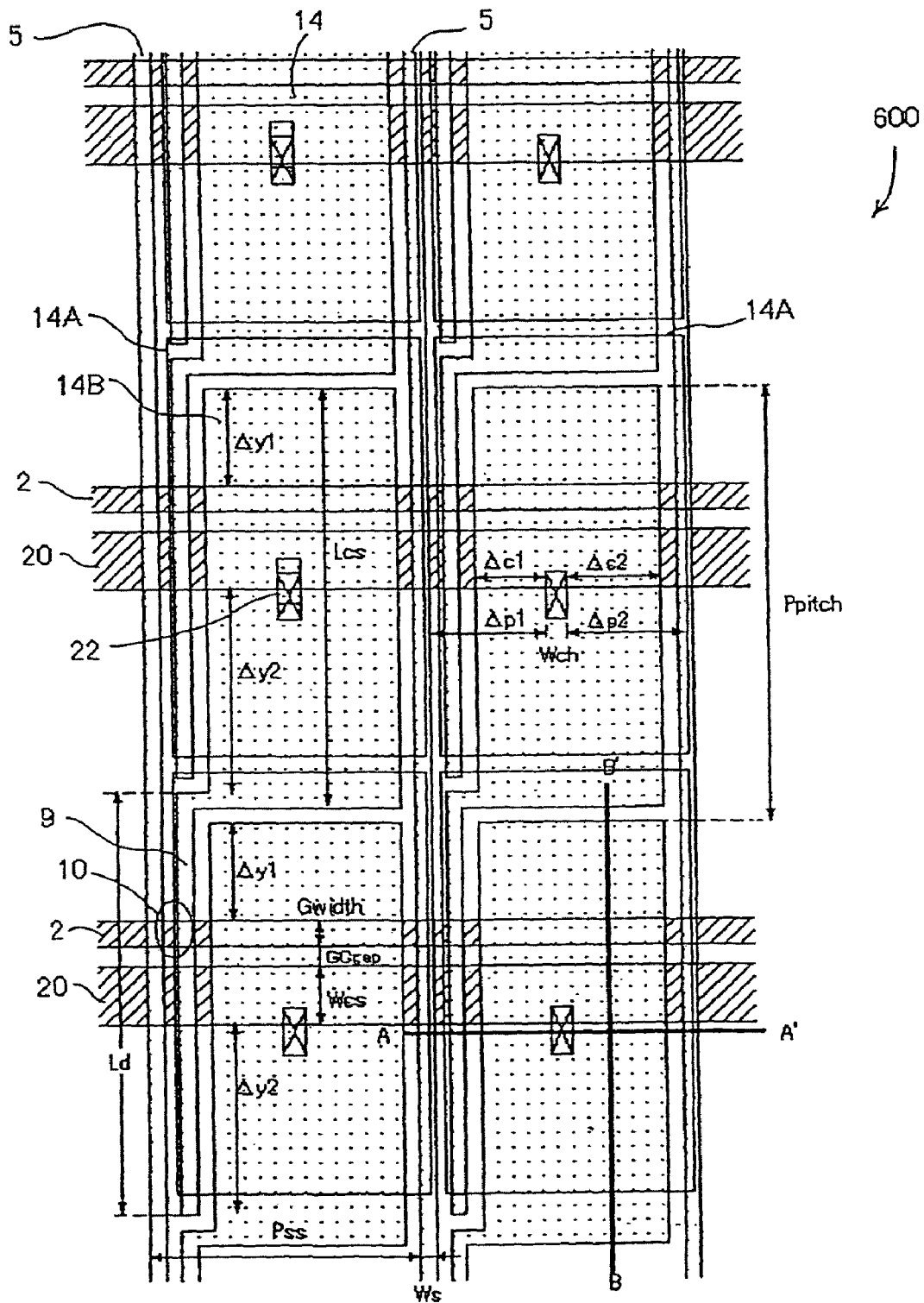
FIG. 26 is a plan view illustrating, to a larger scale, part of the display area of an active matrix substrate 600 according to a sixth embodiment of the present invention.
Figure 27:
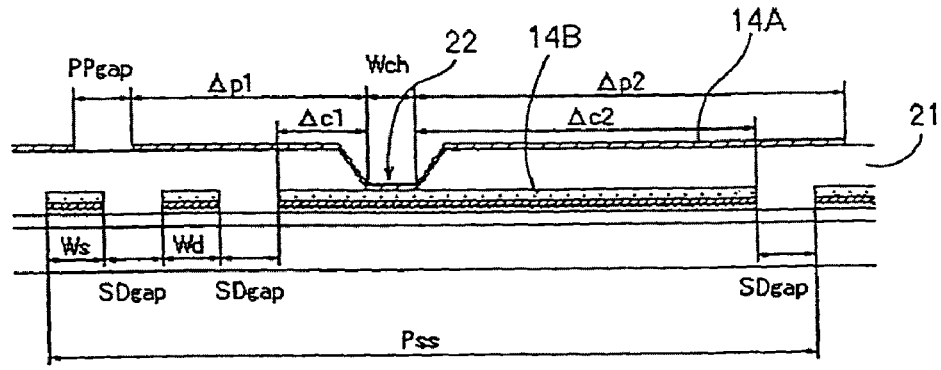
FIG. 27 is a cross-sectional view of the substrate 600 taken along the line A-A' shown in FIG. 26.
Figure 28:
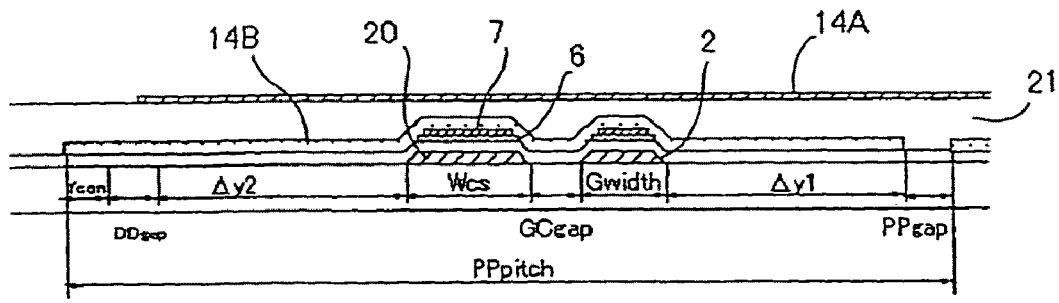
FIG. 28 is a cross-sectional view of the substrate 600 taken along the line B-B' shown in FIG. 26.

Hereinafter, the sixth embodiment of the present invention will be described with reference to FIGS. 26 through 28. FIG. 26 is a plan view illustrating a layout for an active matrix substrate 600 according to the sixth embodiment. FIGS. 27 and 28 are cross-sectional views of the substrate 600 respectively taken along the lines A-A' and B-B' shown in FIG. 26.

As can be seen from FIGS. 27 and 28, part of the active matrix substrate 600 of the sixth embodiment for the lower level pixel electrode 14B and its underlying layers has the same structure as the counterpart of the active matrix substrate 500 of the fifth embodiment.

As shown in FIGS. 27 and 28, an interlevel dielectric film 21 has been deposited over the lower-level pixel electrode 14B, drain electrode 9 and data line 5. The upper-level pixel electrode 14A is made of a reflective electrode material (e.g., Al). A contact hole 22 has been formed over a part of the lower-level pixel electrode 14B to electrically connect the lower- and upper-level pixel electrodes 14B and 14A together. The upper-level pixel electrode 14A is greater in area than the lower-level pixel electrode 14B, thus increasing the aperture ratio. A storage capacitance is formed between the lower-level pixel electrode 14B and the storage capacitance line 20 or gate line 2, so the upper-level pixel electrodes 14A do not have to be aligned with the gate lines 2.

Accordingly, the alignment margin $\Delta Y$ allowed by the sixth embodiment between the first mask defining the gate lines 2 and the second mask defining the source lines (i.e., data lines) 5 and lower-level pixel electrodes 14B is equal to the the margin allowed by the fifth embodiment. That is to say, the alignment margin $\Delta Y$ is also given by $$\Delta Y = P_{pitch} - G_{width} - PP_{gap} - W_{cs} - GC_{gap} - DD_{gap} - Y_{con}$$

The contact holes 22 and upper-level pixel electrodes 14A are formed over the lower-level pixel electrodes 14B. Accordingly, the alignment margin should also be defined for these layers.

The contact holes 22 must be located over the lower-level pixel electrodes 14B. Supposing the contact holes 122 have a width $W_{ch}$, the alignment margin $\Delta C$ allowed between the third mask defining the contact holes 22 and the second mask defining the lower-level pixel electrodes 14B is given by $$\Delta C = P_{ss} - W_s - W_d - 3 \cdot SD_{gap} - W_{ch}$$

where $P_{ss}$ is the source line pitch, $W_s$ is the width of the source lines, $W_d$ is the width of the drain electrodes and $SD_{gap}$ is the source-drain gap.

The substrate also expands or shrinks in the $\Delta Y$ direction. Accordingly, the alignment margin between the second and third masks should also be defined in the $\Delta Y$ direction. However, this alignment margin is much greater than $\Delta C$ and will not be described herein. The vertical shrinkage or expansion of a plastic substrate should be almost equal to the horizontal shrinkage or expansion thereof. Accordingly, if the horizontal shift is not greater than margin $\Delta C$, then the vertical shift (i.e., in the $\Delta Y$ direction) cannot exceed the vertical margin.

The upper-level pixel electrodes 14A must also be located over the contact holes 22. Accordingly, the alignment margin $\Delta P$ allowed between the third mask defining the contact holes 22 and the fourth mask defining the upper-level pixel electrodes 14A is given by $$\Delta P = P_{ss} - PP_{tgap}$$

where $PP_{tgap}$ is the gap between the upper-level pixel electrodes 14A.

Next, it will be described how to make the active matrix substrate 600 of the sixth embodiment.

As can be easily seen from FIGS. 26 through 28, the same fabrication process as that adopted for the foregoing first through fifth embodiments may be performed until the data lines 5, drain electrodes 9 and lower-level pixel electrodes 14B are formed. The TFTs 10 may be covered with the channel protective layer or have their channels partially etched away. In the illustrated embodiment, the channels of the TFTs have been etched as shown in FIG. 27.

Then, an interlevel dielectric film 21, which may be either inorganic or organic insulating film, is deposited over the TFTs 10. Thereafter, contact holes 22 are opened through the interlevel dielectric film 21 by performing a photolithographic process. The interlevel dielectric film 21 may have a thickness of 0.5 to 3 μm, for example.

The interlevel dielectric film 21 should be made of such a material, or deposited by such a method, as allowing the substrate to expand or shrink to a lesser degree. Normally, an organic insulating film allows a substrate to expand or shrink less than an inorganic insulating film. Thus, the interlevel dielectric film 21 is made of an organic insulator in the illustrated embodiment.

Next, a film of a reflective electrode material, e.g., Al, Al alloy or silver alloy, is deposited to a thickness of about 50 to 100 nm, for example, over the interlevel dielectric film 21. Then, by performing a photolithographic process thereon, the upper-level pixel electrodes 14A (i.e., reflective electrodes) are formed out of the reflective electrode material film. Strictly speaking, the lower-level electrodes 14B do not actually function as pixel electrodes. However, the electrodes 14B still function as lower-level electrodes for the upper-level pixel electrodes 14A and are herein referred to as "lower-level pixel electrodes".

In making the active matrix substrate 600 for a transmission-type liquid crystal display device, the data lines 5 must be made of a transparent conductive material. On the other hand, in making the active matrix substrate 600 for a reflective liquid crystal display device, the data lines 5 may be made of either opaque conductor or transparent conductor. Anyway, the data lines 5 should be made of such a material as making a low-resistance contact with the upper-level pixel electrodes 14A. In the illustrated embodiment, the upper-level pixel electrodes 14A are made of Al. So Ti is selected in this embodiment as a material for the lower-level pixel electrodes 14B, data lines 5 and drain electrodes 9.

Example

As an example of the present invention, an active matrix substrate was modeled using a plastic substrate of PES with a thickness of about 0.2 mm and a diagonal size of 5 inches. A panel having a diagonal size of 3.9 inches and a resolution of ¼ VGA (i.e., 320×RGB×240) was made for a reflective device. In this example, the unit pixel regions had a size of 82 μm×246 μm, the gate lines 2 had a width $G_{width}$ of 8 μm, the lower-level pixel electrode gap $PP_{gap}$ was 5 μm, the connection had a width $Y_{con}$ of 5 μm, the storage capacitance lines 20 had a width $W_{cs}$ of 25 μm, the gap $GC_{gap}$ between the storage capacitance and gate lines 20 and 2 was 10 μm and the drain electrode gap $DD_{gap}$, was 5 μm. Then, ΔY=246−8−5−25−10−5−5=188 μm.

In this example, to cope with either expansion or shrinkage of the plastic substrate, the respective components were arranged to meet ΔY1=ΔY2 in the center surface region of the plastic substrate. As a result, the alignment margin ΔY allowed between the gate line layer (i.e., the first mask layer) and the source line/lower-level pixel electrode layer (i.e., the second mask layer) by this example was ±91 μm (ΔY=ΔY/2−dY, where dY is the accuracy of the aligner and was 3 μm).

The length of the display area in the ΔY direction was 240 lines×246 μm=59040 μm, so a substrate expansion/shrinkage margin of 1541 ppm was allowed between the first and second masks. In the active matrix substrate actually modeled, the plastic substrate expanded or shrunk by about 500 to 700 ppm. However, a sufficient alignment margin was allowed in this example. Accordingly, TFTs and storage capacitance lines could be formed just as originally designed in all pixel regions.

On the other hand, the third mask defining the contact holes has only to be aligned with the second mask. Where the source lines had a width $W_s$ of 8 μm, the drain electrodes had a width $W_d$ of 8 μm, the source-drain gap $SD_{gap}$ was 5 μm and the contact holes had a width of 5 μm, ΔC=82−8−8−3×5−5=46 μm.

To cope with either expansion or shrinkage of the plastic substrate, the respective components were arranged to meet Δc1=Δc2 in the center surface region of the plastic substrate. As a result, the alignment margin Δc allowed between the second and third masks by this example was ±20 μm (Δc=ΔC/2−dY).

The mask alignment was also carried out in the Y-axis direction so that each of the contact holes 22 was located approximately at the center of the associated lower-level pixel electrode 14B in the center surface region of the substrate.

The length of the display area as measured parallel to ΔC was 320×82×3=78720 μm and the maximum allowable substrate expansion/shrinkage margin was just 254 ppm. However, unlike between the photolithographic process steps of defining the first and second mask layers, a CVD process, which causes the substrate to expand or shrink considerably, does not have to be performed between the photolithographic process steps for defining the second and third mask layers. For that reason, in the active matrix substrate actually modeled, the plastic substrate expanded or shrunk by at most about 1500 ppm. So in the structure of this example, the third mask can be aligned with the second mask sufficiently.

Furthermore, the fourth mask defining the upper-level pixel electrodes 14A has only to be aligned with the third mask. Where the upper-level pixel electrode gap $PP_{tgap}$ was 5 μm, ΔP=82−5=77 μm.

To cope with either expansion or shrinkage of the plastic substrate, the respective components were arranged to meet Δp1=Δp2 in the center surface region of the plastic substrate. As a result, the alignment margin Δp allowed between the third and fourth masks by this example was ±35.5 μm (Δp=ΔP/2−dY).

The length of the display area as measured parallel to ΔP was 320×82×3=78720 μm and the maximum allowable substrate expansion/shrinkage margin was just 451 ppm. However, a CVD process, which causes the substrate to expand or shrink considerably, does not have to be performed in the interval between the photolithographic process steps for defining the third and fourth masks. For that reason, the third and fourth masks can be aligned with each other relatively easily.

In the illustrated embodiment, the reflective electrodes (i.e., the upper-level pixel electrodes) 14A are laid out in a layer different from the layer where the data lines 5 belong. As a result, the aperture ratio (i.e., the area ratio of each reflective electrode to the associated unit pixel region) can be increased to 92%.

In a known structure, components belonging to each pair of layers should be aligned with each other at an alignment accuracy of several μm or even less. Accordingly, where the alignment margin is 9 μm, the maximum allowable substrate shrinkage or expansion will be 150 ppm. For that reason, according to the known technique, no active matrix substrate can be made using a plastic substrate.

To realize TFT performance required for an active matrix substrate by utilizing a currently available fabrication technique, the gate insulating film and semiconductor layers should be formed by a CVD process with the substrate heated to 100 to 200° C. Accordingly, to make an active matrix substrate using a plastic substrate, a pixel structure, allowing a great alignment margin between the first and second masks as in this embodiment, is preferred.

Figure 29:
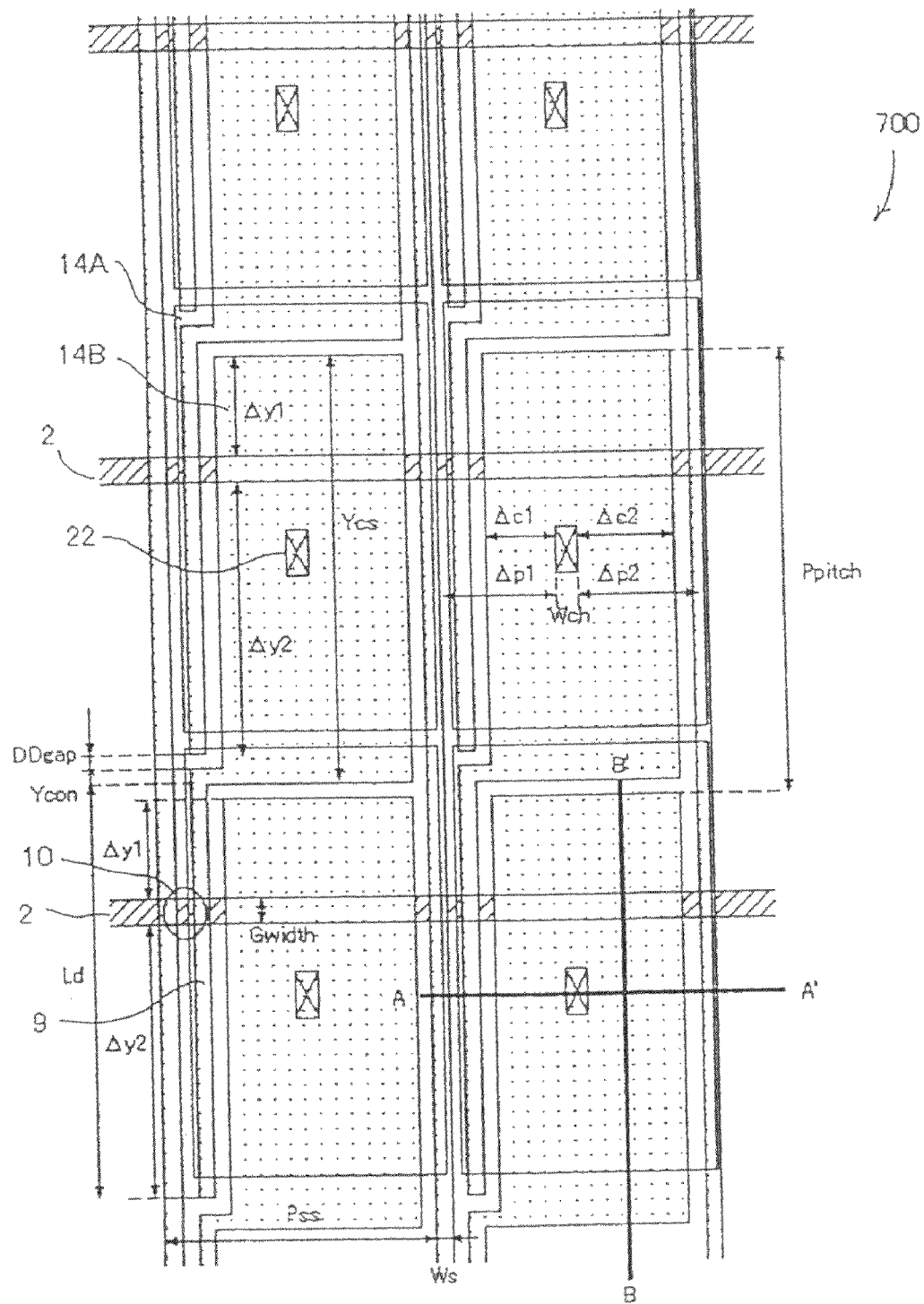
FIG. 29 is a plan view illustrating, to a larger scale, part of the display area of an active matrix substrate 700 according to a modified example of the sixth embodiment.
Figure 30:
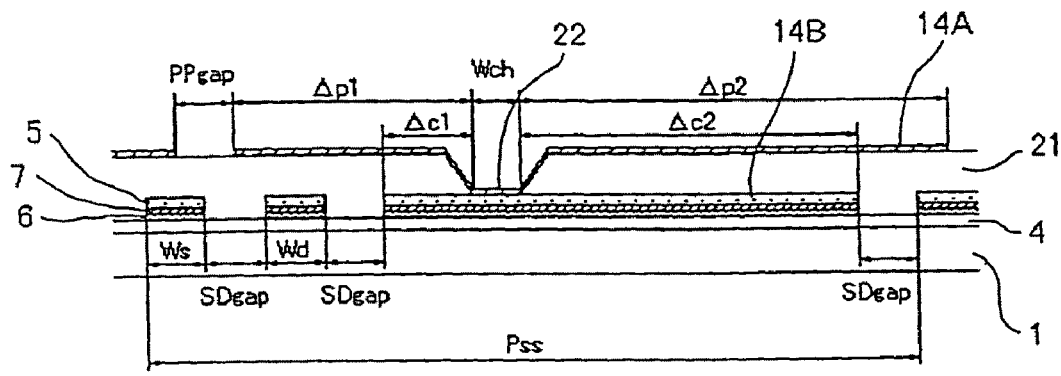
FIG. 30 is a cross-sectional view of the substrate 700 taken along the line A-A' shown in FIG. 29.
Figure 31:
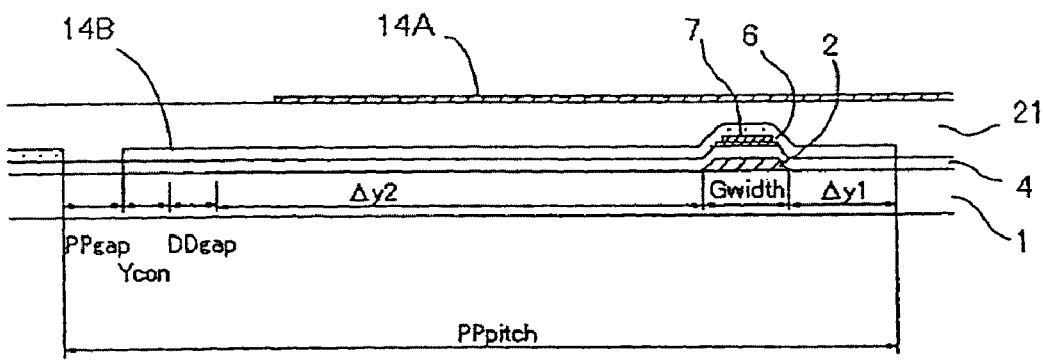
FIG. 31 is a cross-sectional view of the substrate 700 taken along the line B-B' shown in FIG. 29.

The sixth embodiment relates to a "Cs on Common" structure including storage capacitance lines. However, the same effects are also achievable without the storage capacitance lines. FIGS. 29 through 31 illustrate an active matrix substrate 700 having a "Cs on Gate" structure according to a modified example of the sixth embodiment. The active matrix substrate 700 is obtained by removing the storage capacitance lines 20 from the structure of the sixth embodiment. The substrate 700 allows an even greater alignment margin ΔY.

Embodiment 7

By adopting the structure of the sixth embodiment, a 3.9-inch ¼ VGA reflective liquid crystal display device can be fabricated using a plastic substrate. However, the sixth embodiment might not be applicable so effectively to a device with an even smaller pixel size or an even greater panel size. That is to say, the alignment margin ΔC allowed by the sixth embodiment for the contact holes might be insufficient. Also, in view of mass productivity, the alignment margin should preferably be further increased even for the 3.9-inch ¼ VGA liquid crystal panels. Thus, this seventh embodiment is specially designed to further increase the alignment margin ΔC for contact holes.

Figure 32:
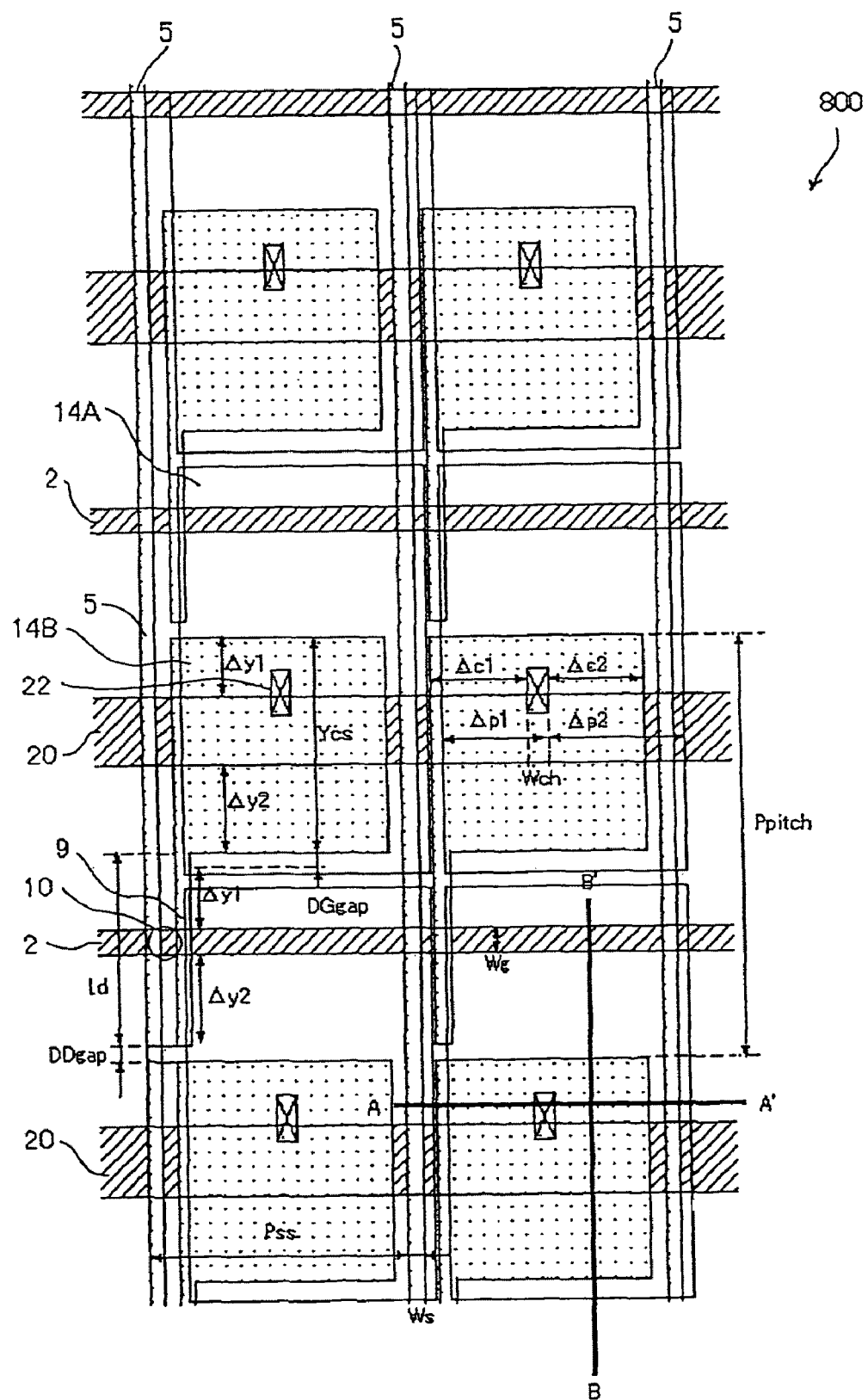
FIG. 32 is a plan view illustrating, to a larger scale, part of the display area of an active matrix substrate 800 according to a seventh embodiment of the present invention.
Figure 33:
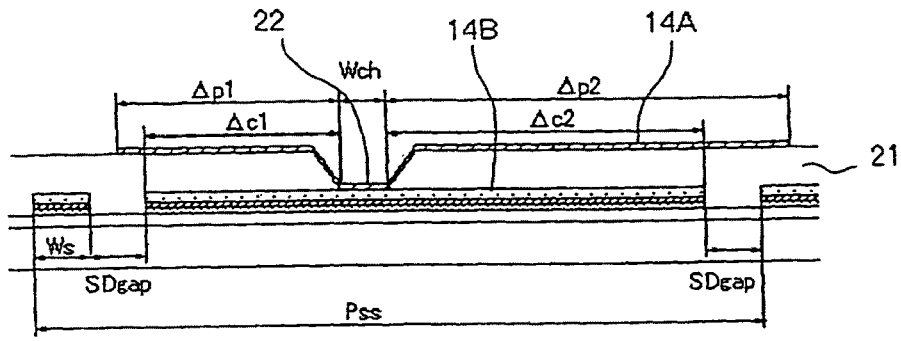
FIG. 33 is a cross-sectional view of the substrate 800 taken along the line A-A' shown in FIG. 32.
Figure 34:
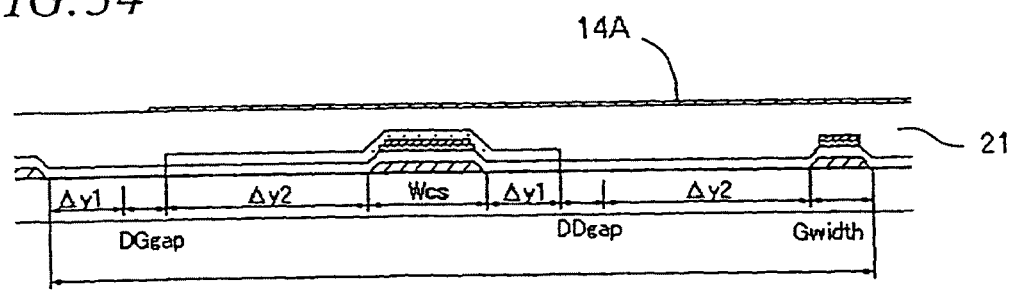
FIG. 34 is a cross-sectional view of the substrate 800 taken along the line B-B' shown in FIG. 32.

Hereinafter, the seventh embodiment of the present invention will be described with reference to FIGS. 32 through 34. FIG. 32 is a plan view illustrating a layout for an active matrix substrate 800 according to the seventh embodiment. FIGS. 33 and 34 are cross-sectional views of the substrate 800 respectively taken along the lines A-A' and B-B' shown in FIG. 32.

In the active matrix substrate 800 shown in FIGS. 32 through 34, each lower-level pixel electrode 14B crosses the associated storage capacitance line 20, while the gate line 2, paired with the storage capacitance line 20, is overlapped by the drain electrode 9 extending from the lower-level pixel electrode 14B. Accordingly, in the X-axis direction, no drain electrodes 9 exist in the gap between the lower-level pixel electrodes 14B and the associated data line (i.e., source line) 5. For that reason, the width of the lower-level pixel electrodes 14B (i.e., size as measured along the X-axis) can be increased, so the alignment margin ΔC for contact holes can also be increased. The alignment margin ΔC is given by $$\Delta C = P_{ss} - W_s - 2 \cdot SD_{gap} - W_{ch}$$

where $P_{ss}$ is the source line pitch, $W_s$ is the width of the source lines, $SD_{gap}$ is the gap between the pixel electrodes and the source lines and $W_{ch}$ is the width of the contact hole as measured along the X-axis.

Each drain electrode 9 crosses only the associated gate line 2 but does not overlap with any storage capacitance line 20. On the other hand, each lower-level pixel electrode 14B crosses only the associated storage capacitance line 20 but does not overlap with any gate line 2. Accordingly, the substrate expansion/shrinkage margin ΔY allowed between the first and second mask layers is given by $$\Delta Y = (P_{pitch} - G_{width} - W_{cs} - DD_{gap} - DG_{gap})/2$$

Although the margin ΔY allowed by the seventh embodiment halves from that allowed by the sixth embodiment, the seventh embodiment is effectively applicable to a situation where an increased alignment margin should be allowed between the second and third mask layers.

The active matrix substrate 800 of the seventh embodiment can be made by the method of the sixth embodiment for making the active matrix substrate 600.

Example

As an example of the present invention, an active matrix substrate was modeled using a plastic substrate of PES with a thickness of about 0.2 mm and a diagonal size of 5 inches. A panel having a diagonal size of 2.5 inches and a resolution of ¼ VGA (i.e., 320×RGB×240) was made for a reflective device. In this example, the unit pixel regions had a size of 53 μm×159 μm, the gate lines 2 had a width $G_{width}$ of 8 μm, the storage capacitance lines 20 had a width $W_{cs}$ of 10 μm, the gap $DD_{gap}$ between the drain and lower-level pixel electrodes was 5 μm and the minimum gap between the lower-level pixel electrodes and gate line was 3 μm. Then, ΔY=(159−8−10−5−3)/2=133 μm.

In this example, to cope with either expansion or shrinkage of the plastic substrate, the respective components were arranged to meet ΔY1=ΔY2 in the center surface region of the plastic substrate. As a result, the alignment margin ΔY allowed between the gate line layer (i.e., the first mask layer) and the source line/lower-level pixel electrode layer (i.e., the second mask layer) by this example was ±63.5 μm (ΔY=ΔY/2−dY, where dY is the accuracy of the aligner and was 3 μm).

The length of the display area in the ΔY direction was 240 lines×159 μm=38160 μm, so a substrate expansion/shrinkage margin of 1664 ppm was allowed between the first and second mask layers.

The alignment margin ΔC allowed between the contact hole layer (i.e., the third mask layer) and the lower-level pixel electrode layer (i.e., the second mask layer) was ΔC=53−8−2×5−5=30 μm. To cope with either expansion or shrinkage of the plastic substrate, the respective components were arranged to meet Δc1=Δc2 in the center surface region of the plastic substrate. As a result, the alignment margin Δc allowed between the second and third mask layers by this example was ±12 μm (Δc=ΔC/2−dY). The length of the display area as measured parallel to ΔC was 320×53×3=50880 μm and the maximum allowable substrate expansion/shrinkage margin was 590 ppm, which is an alignment margin sufficiently great for the interval between the photolithographic process steps for the defining the second and third mask layers. This is because no CVD process has to be carried out in this interval.

In the structure of the sixth embodiment on the other hand, where the source line width $W_s$ is 6 μm, the drain electrodes have a width $W_d$ of 6 μm, the source-drain gap $SD_{gap}$ is 5 μm and the contact holes have a width of 5 μm, ΔC=53−8−8−3×5−5=17 μm and Δc=ΔC/2−dY=only ±5.5 μm. In that case, the substrate expansion/shrinkage margin is just 108 ppm and the fabrication margin allowed is insufficient.

Thus, according to the seventh embodiment, the photo-alignment margin can be increased sufficiently in forming the contact holes 22 that connect the upper- and lower-level pixel electrodes 14A and 14B together. As a result, a high-definition (e.g., more than 150 PPI) active matrix substrate for 2.5-inch ¼ VGA liquid crystal display device is realized using a plastic substrate.

The upper-level pixel electrodes 14A have the same structure as the counterparts of the sixth embodiment, thus realizing a sufficiently high aperture ratio. In this example, an aperture ratio of 88% was realized.

Embodiment 8

Figure 35:
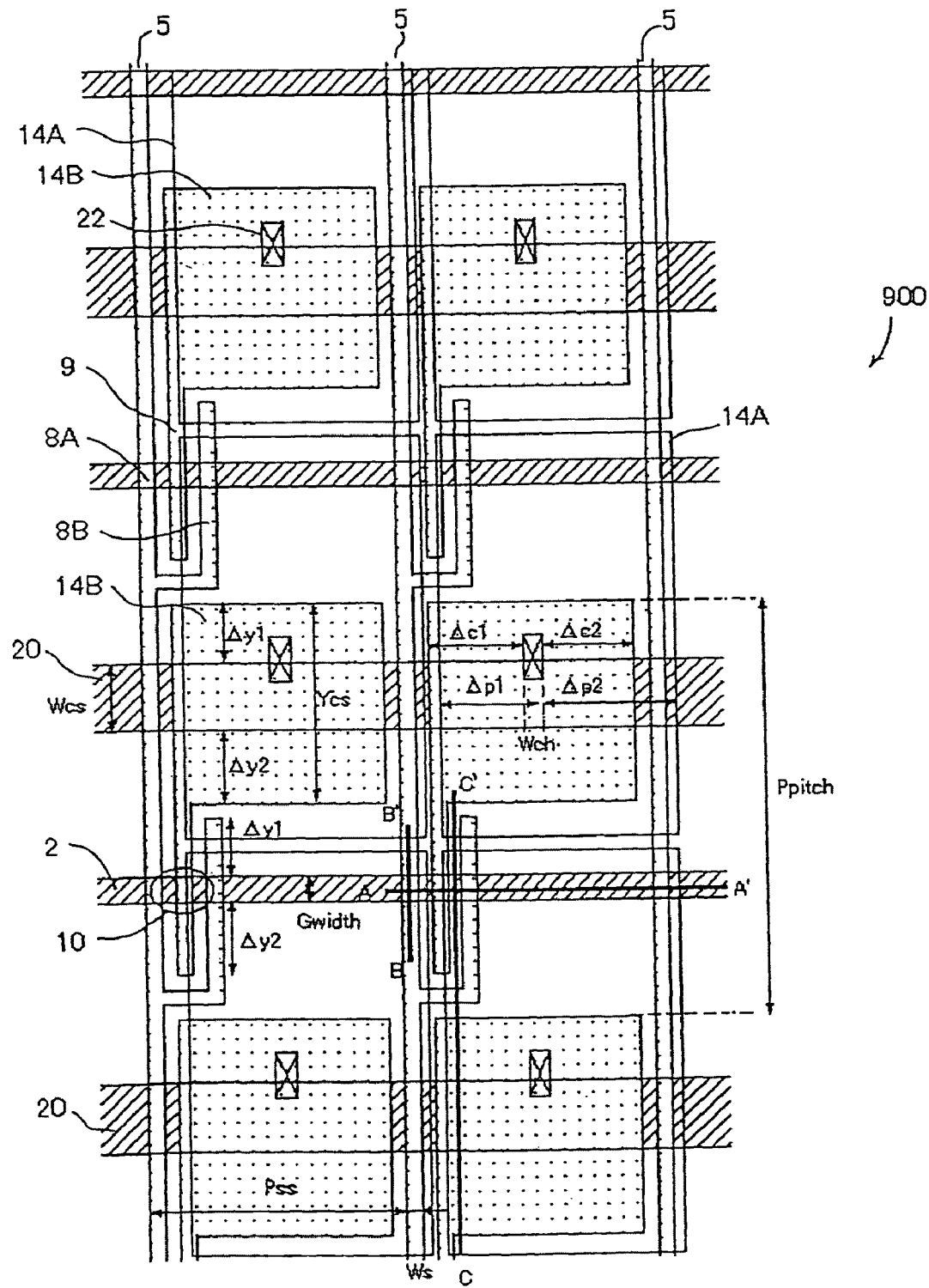
FIG. 35 is a plan view illustrating, to a larger scale, part of the display area of an active matrix substrate 900 according to an eighth embodiment of the present invention.
Figure 36:
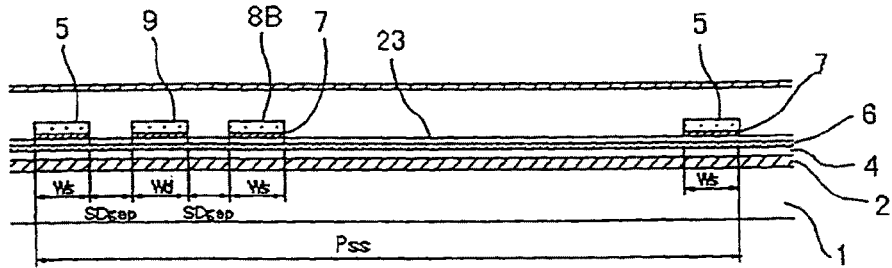
FIG. 36 is a cross-sectional view of the substrate 900 taken along the line A-A' shown in FIG. 35.
Figure 37:
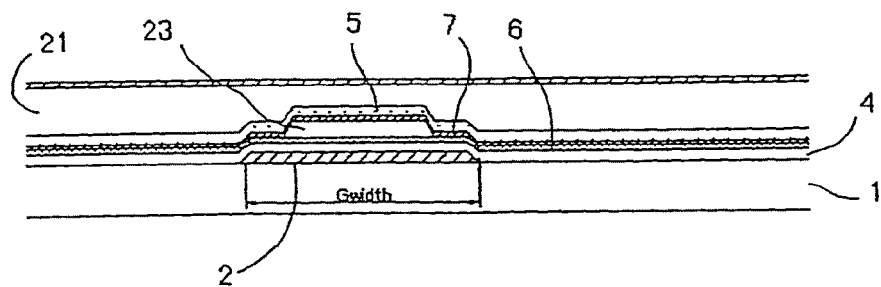
FIG. 37 is a cross-sectional view of the substrate 900 taken along the line B-B' shown in FIG. 35.
Figure 38:
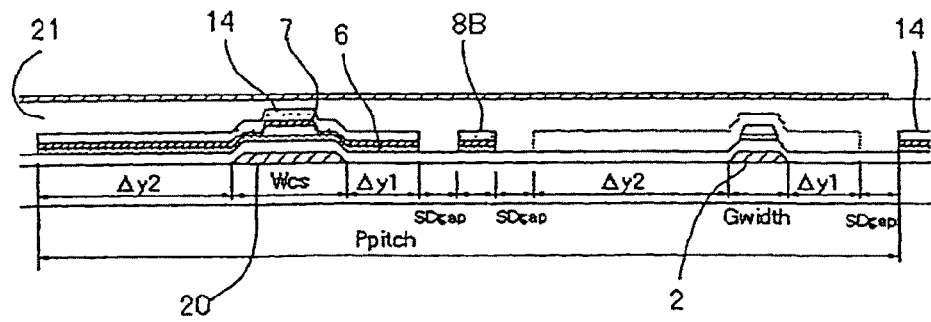
FIG. 38 is a cross-sectional view of the substrate 900 taken along the line C-C' shown in FIG. 35.

Hereinafter, an eighth embodiment of the present invention will be described with reference to FIGS. 35 through 38. FIG. 35 is a plan view illustrating a layout for an active matrix substrate 900 according to the eighth embodiment. FIGS. 36, 37 and 38 are cross-sectional views of the substrate 900 respectively taken along the lines A-A', B-B' and C-C' shown in FIG. 35.

The active matrix substrate 900 of the eighth embodiment is different in the shape of the TFTs from the counterpart of any of the foregoing first through seventh embodiments.

In the eighth embodiment, a source electrode 8B branches from the associated data line 5, passes near the lower end of the associated drain electrode 9 and then bends at right angles to the left (i.e., the direction parallel to the data lines 5). That is to say, the source electrode 8B, along with the data line 5, surrounds the drain electrode 9. And the data line 5 (i.e., source electrode 8A), source electrode 8B and drain electrode 9 are all laid out to extend across the gate line 2 and its overlying semiconductor layer 6.

As shown in FIG. 36, the semiconductor layer 6 is left over the entire upper surface of the gate line 2. Accordingly, the components located over the gate line 2 and between the data line 5 (source electrode 8A) and drain electrode 9 can function as a TFT. In addition, the components located over the gate line 2 and between the source and drain electrodes 8B and 9 can also function as a TFT.

On the other hand, the semiconductor layer 6 also exists between the source electrode 8B and an adjacent data line 5 (source electrode 8A), and the components in this intermediate region might function as a parasitic TFT. However, signal on the adjacent data line 5 is shielded by the source electrode 8B and does not affect the potential level of the pixel electrode 14B by way of the drain electrode 9.

As can be seen from FIG. 38, the alignment margin ΔY allowed by the eighth embodiment is given by $\Delta Y=(P_{pitch}-G_{width}-W_{cs}-W_{s}-3 \cdot SD_{gap})/2$ According to this embodiment, there is no need to perform the process step of removing the semiconductor layer entirely, except the respective channels of the TFTs, by a half exposure technique. As a result, the fabrication process can be carried out in a shorter time and the yield of the active matrix substrates can be increased.

Embodiment 9

Figure 39:
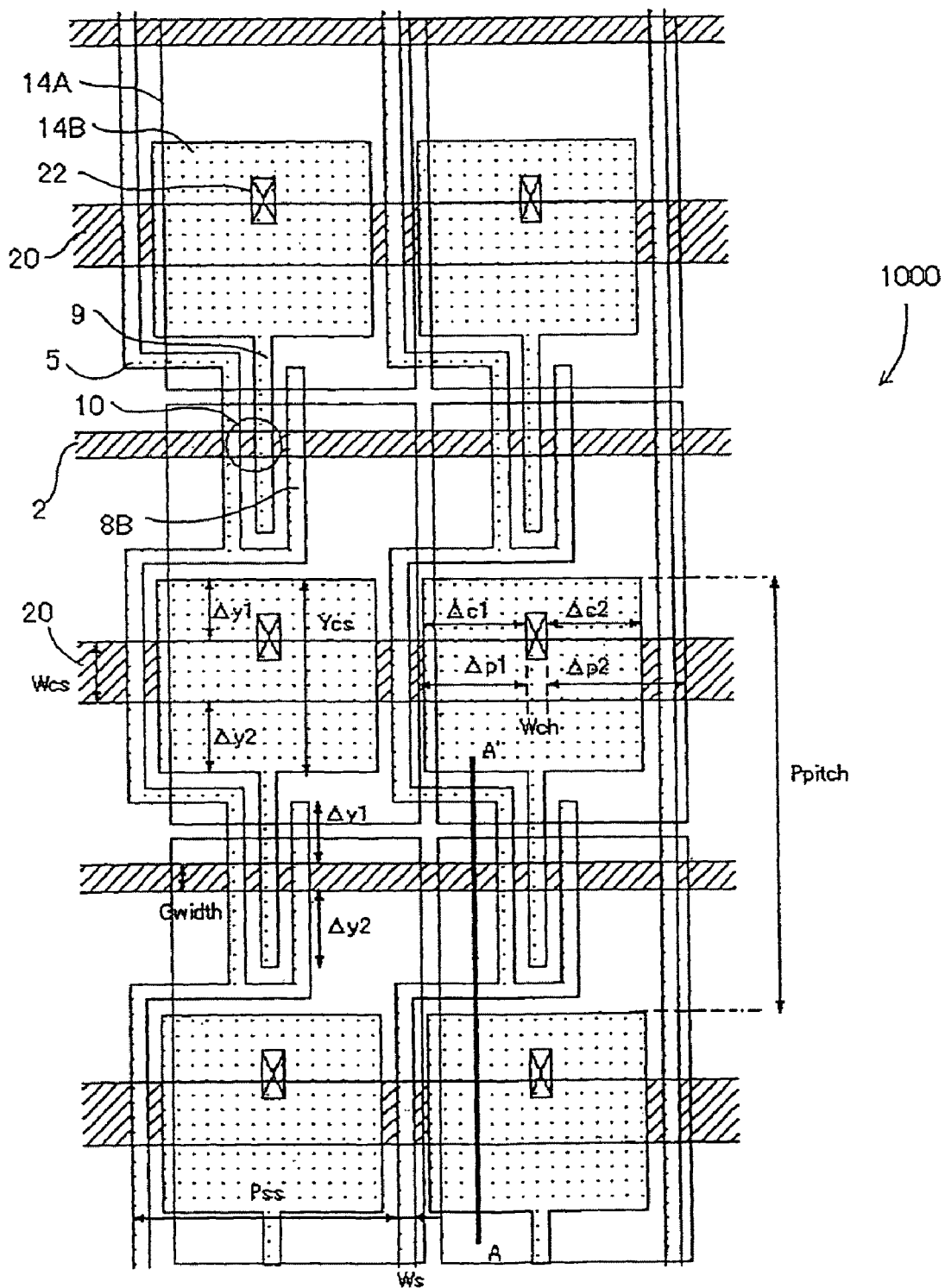
FIG. 39 is a plan view illustrating, to a larger scale, part of the display area of an active matrix substrate 1000 according to a ninth embodiment of the present invention.
Figure 40:
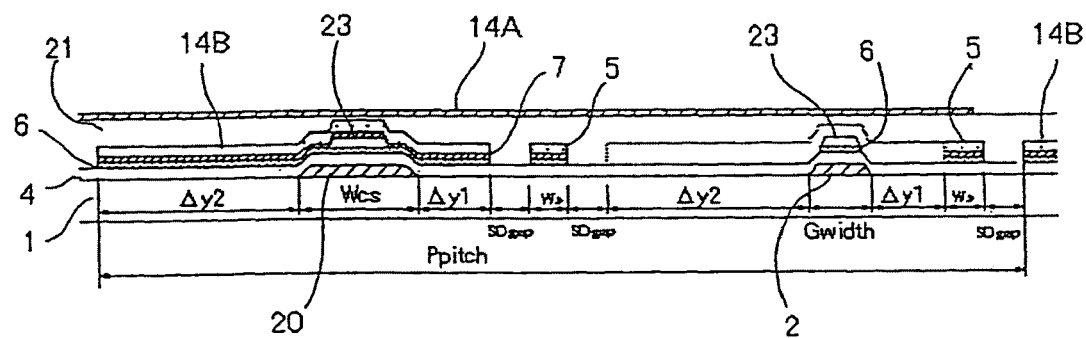
FIG. 40 is a cross-sectional view of the substrate 1000 taken along the line A-A' shown in FIG. 39.

Hereinafter, a ninth embodiment of the present invention will be described with reference to FIGS. 39 and 40. FIG. 39 is a plan view illustrating a layout for an active matrix substrate 1000 according to the ninth embodiment. FIG. 40 is a cross-sectional view of the substrate 1000 taken along the line A-A' shown in FIG. 39.

The active matrix substrate 1000 of the ninth embodiment has a structure similar to that of the active matrix substrate 900 of the eighth embodiment. The active matrix substrate 1000 is characterized by disposing each drain electrode 9 almost in the middle of two mutually adjacent data lines 5.

The substrate 1000 is also characterized by getting the channel of each TFT covered with the upper-level pixel electrode 14A completely. In other words, the drain electrode 9 is laid out at such a position as getting the channel of each TFT covered with the upper-level pixel electrode 14A completely. In the other respects, the structure of the active matrix substrate 1000 is the same as that of the active matrix substrate 900.

This structure can greatly reduce optical leakage currents flowing through the TFTs 10, thus increasing the resultant contrast when the active matrix substrate 1000 is applied to a liquid crystal display device.

As can be seen from FIG. 40, the alignment margin ΔY allowed by this embodiment is given by $\Delta Y=(P_{pitch}-G_{width}-W_{cs}-2 \cdot W_{s}-3 \cdot SD_{gap})/2$ In the illustrated embodiment, respective parts of the data line 5, drain electrode 9 and source electrode 8B extend parallel to each other and cross the associated gate line 2 at right angles. However, those parallel parts do not have to cross the gate line 2 at right angles, but may cross the line 2 at any angles other than 90 degrees. This is because the effects of the ninth embodiment are still attainable in that case.

Also, the drain electrode 9 may somewhat shift horizontally from the centerline between two adjacent data lines 5. However, the horizontal shift of the drain electrode 9 from the line, extending through the center of the lower-level pixel electrode 14B along the Y-axis, is preferably no greater than ±25% of the pixel pitch as measured along the X-axis.

In this embodiment, there is no need to perform the process step of removing the semiconductor layer entirely, except the respective channels of the TFTs, by a half exposure technique as in the eighth embodiment. As a result, the fabrication process can be carried out in a shorter time and the yield of the active matrix substrates can be increased.

Embodiment 10

In the active matrix substrate of any of the foregoing embodiments, the gate lines are formed as the lowermost layer and the semiconductor layer for TFTs is formed over the gate lines. A transistor with such a structure is called a transistor of bottom-gate type (or inverted staggered transistor), because the associated part of the gate line, functioning as the gate electrode of the transistor, is located at the lower-most level. Conversely, the active matrix substrate of the tenth embodiment includes transistors of top-gate type (or staggered transistors). That is to say, in this active matrix substrate, the gate lines, functioning as the gate electrodes of the transistors, are located at the uppermost level.

Figure 41A:
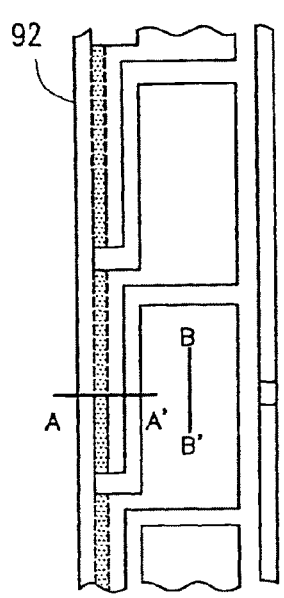
FIGS. 41A, 41B and 41C are plan views illustrating two pixel regions in main process steps of a method of making an active matrix substrate 1100 according to a tenth embodiment of the present invention.
Figure 41B:
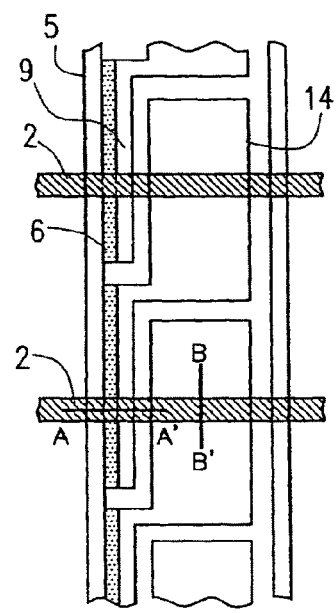
Figure 41C:
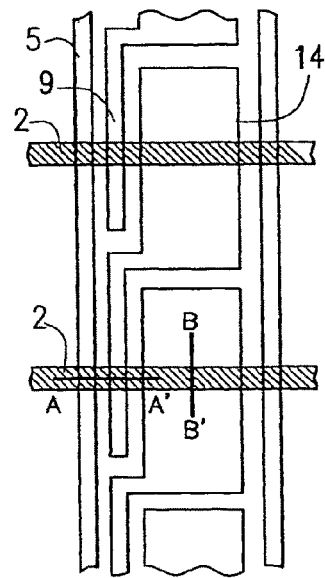
Figure 42A:
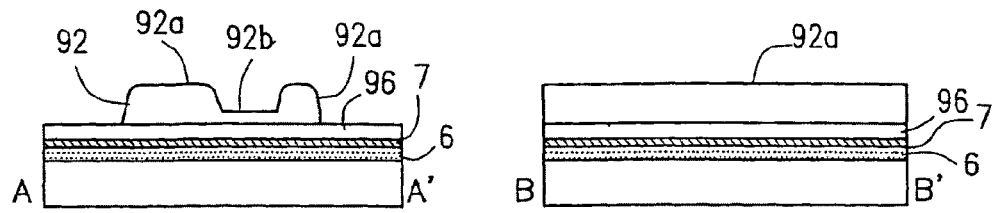
FIGS. 42A through 42E are cross-sectional views of the substrate 1100 taken along the lines A-A' and B-B' shown in FIGS. 41A through 41C.
Figure 42B:
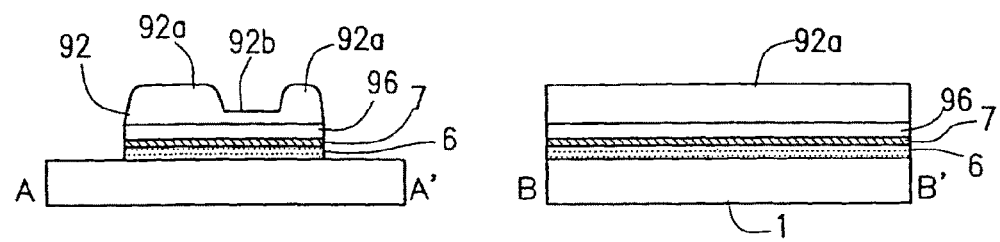
Figure 42C:
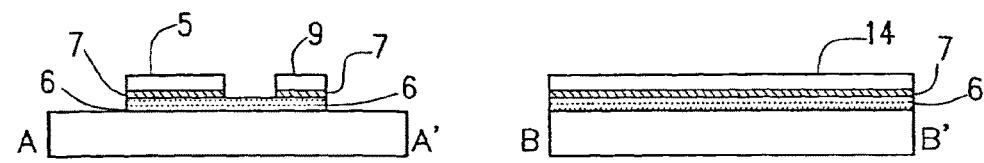
Figure 42D:
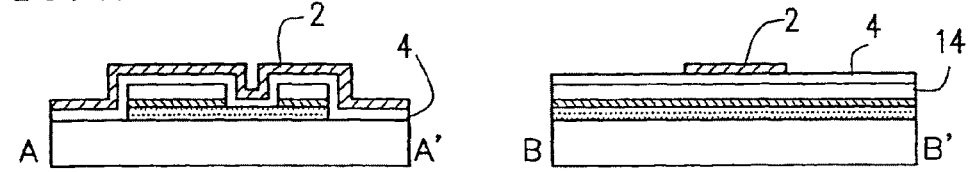
Figure 42E:
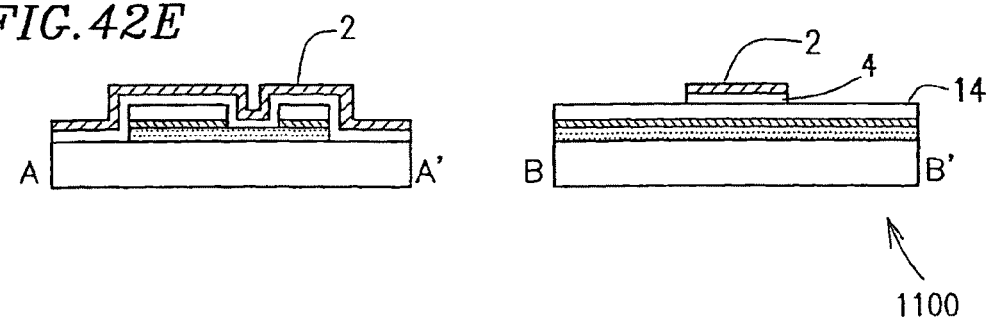
Figure 43:
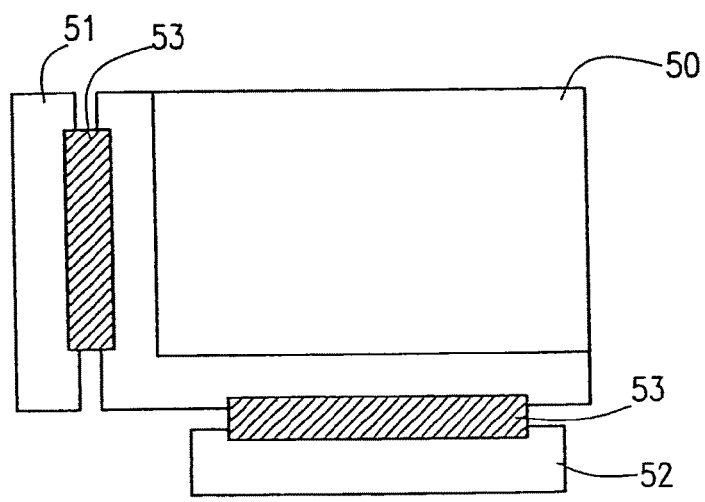
FIG. 43 is a plan view illustrating a known active-matrix-addressed liquid crystal display device.
Figure 44:
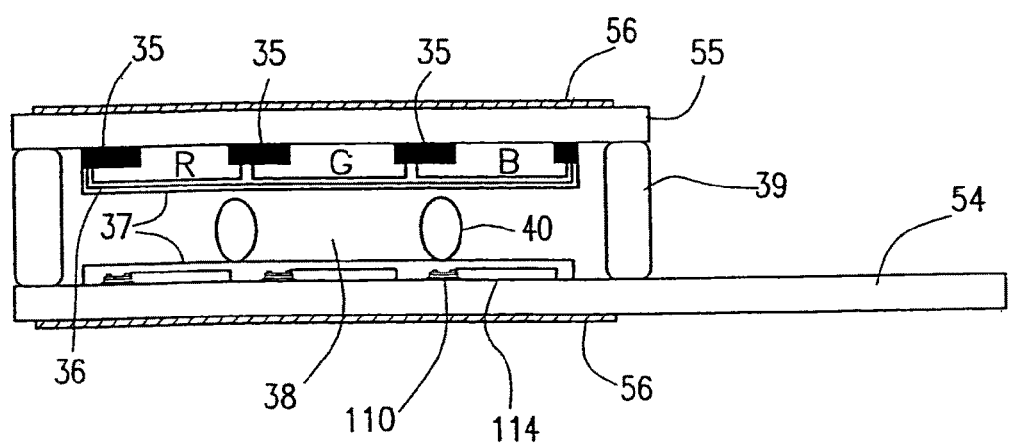
FIG. 44 is a cross-sectional view illustrating a known liquid crystal display panel.
Figure 45A:
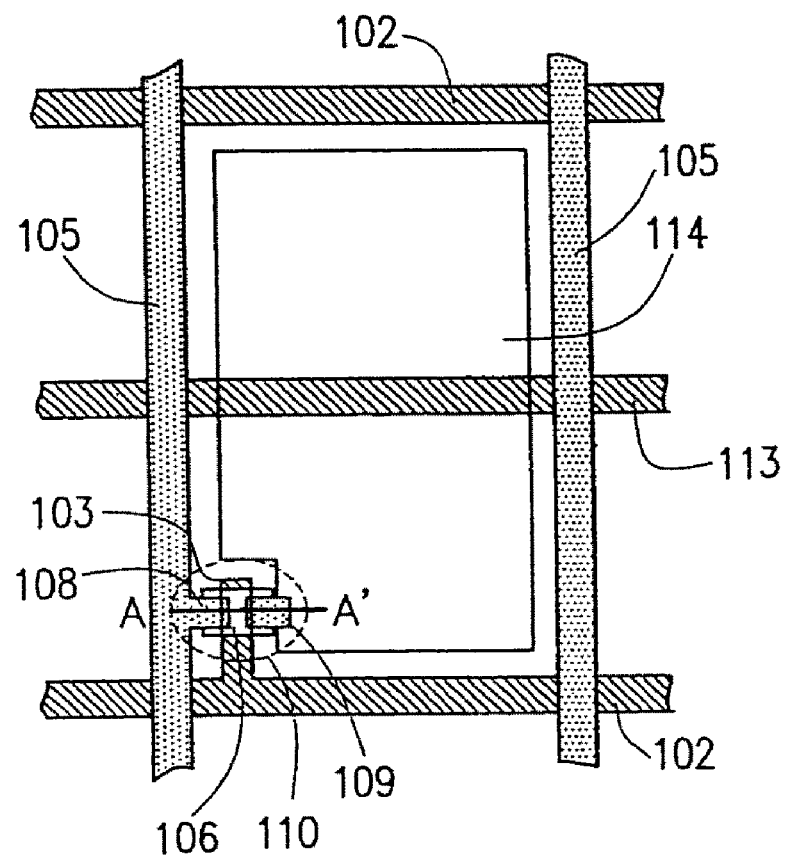
FIG. 45A is a plan view illustrating a layout for a unit pixel region defined on a known active matrix substrate.
Figure 45B:
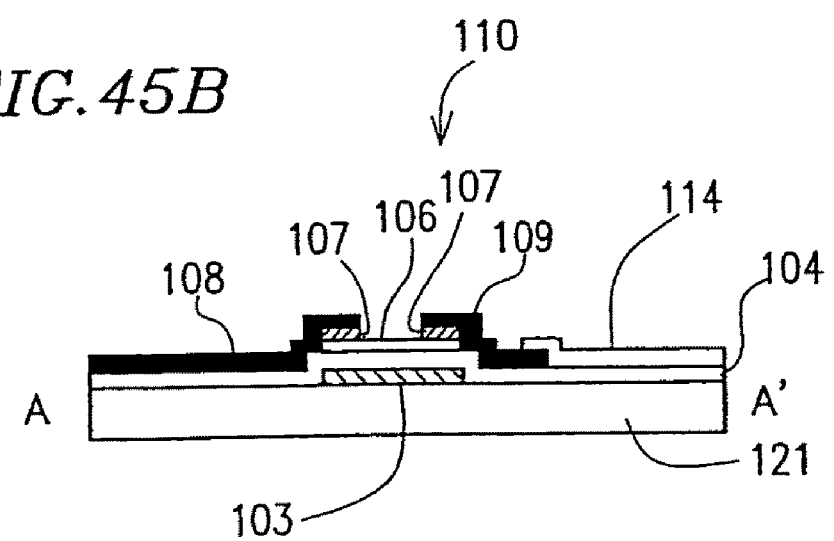
FIG. 45B is a cross-sectional view of the pixel region taken along the line A-A' shown in FIG. 45A.

In the active matrix substrate 1100 of the tenth embodiment, the gate lines 2 exist over, and intersect with, the data lines 5, drain electrodes 9 and pixel electrodes 14 as shown in FIGS. 41C and 42D.

Also, the semiconductor layer 6 is located under, and covered with, the data lines 5, drain electrodes 9 and pixel electrodes 14. The gate insulating film 4 exists under each and every gate line 2. And a storage capacitance is formed between the gate line 2 and the pixel electrode 14.

Hereinafter, a method of making the active matrix substrate 1100 of the tenth embodiment will be described with reference to FIGS. 41A through 41C and FIGS. 42A through 42E.

First, as shown in FIG. 42A, i-semiconductor layer 6 of non-doped amorphous silicon, semiconductor layer 7 doped with phosphorus (P), for example, and reflective metal film 96 of APC (i.e., a silver alloy containing Ag, Pd and Cu) are stacked in this order over a plastic substrate 1. Then, a resist mask 92 is defined on this stack. The i- and doped semiconductor layers 6 and 7 and reflective metal film 96 may be deposited to thicknesses of 150 nm, 50 nm and 150 nm, respectively. As in the first embodiment, the resist mask 92 includes: relatively thick portions 92a defining the data lines 5, drain electrodes 9 and pixel electrodes 14; and relatively thin portions 92b defining the region between the data line 5 and drain electrodes 9.

Subsequently, the reflective metal film 96, doped semiconductor layer 7 and i-semiconductor layer 6 are sequentially etched using the resist mask 92. FIGS. 41A and 42B illustrate a structure of the substrate when this etching process is finished. At this point in time, the channels of the TFTs 10 are covered with the relatively thin portions 92b of the resist mask 92. Accordingly, the respective parts of the reflective metal film 96 and doped semiconductor layer 7, which are located over the channels, are not yet etched at all. That is to say, parts of the reflective metal film 96 to be the data line 5 and drain electrodes 9 have not yet been separated from each other.

Next, after the thin resist portions 92b, which have covered the channels of the TFTs 10, have been removed by an oxygen plasma asking process, for example, the reflective metal film 96 and doped semiconductor layer 7 are etched again. Thereafter, when the resist mask 92 is removed, the structure shown in FIG. 42C is obtained. At this point in time, the i-semiconductor layer 6 located under the data lines 5 and drain electrodes 9 is partially exposed through the gap between the data line 5 and drain electrodes 9 as shown in FIG. 41B.

Thereafter, a gate insulating film 4 of $SiN_x$ and an AlNd film are deposited by a CVD process to thicknesses of 400 nm and 200 nm, respectively, over the structure shown in FIG. 42C and then the AlNd film is patterned using a second mask. In this manner, gate lines 2 are formed as shown in FIGS. 41B and 42D.

Subsequently, using the gate lines 2 as a mask, parts of the gate insulating film 4 and i-semiconductor layer 6, which are not covered with the gate lines 2, are removed. In this manner, the structure shown in FIGS. 41C and 42E can be obtained. As a result of this etching process, the part of the i-semiconductor layer 6, which existed between the data line 5 and drain electrode 9, is removed entirely except the parts for the TFTs. In the end, the semiconductor layers 6 and 7 in the same shapes as the overlying pixel electrodes 14 and drain electrodes 9 exist under the pixel electrodes 14 and drain electrodes 9. Also, the semiconductor layers 6 and 7 in the same shapes as the overlying data lines 5 exist under the data lines 5.

The active matrix substrate 1100 of the tenth embodiment includes reflective pixel electrodes 14, and can be used to fabricate a reflective liquid crystal display device. In accordance with the method of the tenth embodiment, parts of the semiconductor layers 6 and 7 are left under the pixel electrodes 14. Accordingly, even if the pixel electrodes 14 are made of a transparent conductive film, this active matrix substrate 1100 is not applicable to a transmission-type liquid crystal display device.

It should be noted that the gate lines 2 do not have to be made of AlNd. Alternatively, the gate lines 2 may be made of any other conductive material so long as the gate lines 2 can be used as a mask for etching the gate insulating film 4 and semiconductor layers 6 and 7. Examples of other materials for the gate lines 2 include Ta, Mo, W, Ti, Al, an alloy thereof, APC and ITO. Also, multiple layers of these materials may be stacked to form the gate lines 2.

The reflective metal film 96 does not have to be made of APC, but may be made of Ag, Al, Au or an alloy thereof.

The material of the gate insulating film 4 is not limited to $SiN_x$, either. Alternatively, the gate insulating film 4 may be made of either an inorganic insulator like $SiO_2$ or an organic insulator such as BZT. The gate insulating film 4 may also be a stack of these materials.

As described above, in the active matrix substrate of the tenth embodiment, the pixel electrodes 14 are formed by patterning a reflective metal film. Accordingly, a display device to be obtained using this substrate is reflective. In contrast, the active matrix substrate of any of the first through fourth embodiments is applicable to a transmission-type display device. Stated otherwise, to apply the first, second, third or fourth embodiment to a reflective device, the transparent conductive film should be replaced with a reflective metal film and then the data lines 5, drain electrodes 9 and pixel electrodes 14 should be formed by patterning the reflective metal film. In that case, the semiconductor layers 6 and 7 may be left under the pixel electrodes 14. For that reason, in forming a reflective device, there is no need to pattern the semiconductor layers 6 and 7 into the shapes of the gate lines 2 before the pixel electrodes 14 are formed. Instead, a striped channel protective layer may be formed on the gate lines as in the fourth embodiment. In that case, when the data lines 5, drain electrodes 9 and pixel electrodes 14 are formed by patterning the contact layer and reflective metal film deposited thereon, the channel protective layer can be used as part of the etching mask after the relatively thin portions 92b of the resist mask 92 have been removed. Accordingly, even after the unnecessary parts of the semiconductor layer, located between the data line 5 and drain electrodes 9, have been etched away, the semiconductor layer is still left under the channel protective layer. As a result, parts of the semiconductor layer that function as respective semiconductor regions for the TFTs can be arranged appropriately on the gate lines.

Optionally, the structure of any of the sixth through ninth embodiments may be combined with the transistors of top-gate type according to the tenth embodiment. That is to say, storage capacitance lines may be formed additionally or upper-level pixel electrodes may be arranged on an insulating film deposited over the substrate.

Embodiment 11

In the first through fourth embodiments, the gate and data lines 2 and 5 extend in thin stripes and have no parts protruding or depressed in the direction parallel to the principal surface of the substrate 1. Accordingly, even if the data lines 5 have misaligned with the gate lines 2 in the direction parallel to the gate lines 2, the layout of each pixel does not change. On the other hand, the shift of the data lines 5 in the direction vertical to the gate lines 2 should not exceed the alignment margin ΔY, which is smaller than the pixel pitch.

For that reason, if the substrate expands or shrinks non-uniformly depending on the direction, then the data lines 5 are preferably arranged parallel to the direction in which the expansion or shrinkage of the substrate is small. Thus, according to this embodiment, the direction of the data lines 5 is determined with respect to the substrate 1 so that the expandability of the substrate 1 in the direction parallel to the data lines 5 is smaller than that of the substrate 1 in the direction vertical to the data lines 5. In this manner, the shift in the direction parallel to the data lines 5 can be reduced so much as not to exceed the alignment margin ΔY.

On the other hand, to allow a sufficient alignment margin in the direction parallel to the gate lines 2, the gate lines 2 should be long enough to extend way beyond the display area (pixel regions) straight as shown in FIG. 1. By providing each of the gate lines 2 with such extended portions, even if the data lines 5 or pixel electrodes 14 have misaligned in the direction parallel to the gate lines 2, the data lines 5 or pixel electrodes 14 still can cross the gate lines 2 with certainty. The alignment margin ΔX allowed in the direction parallel to the gate lines 2 is defined by the lengths of the extended portions of the gate lines 2.

In this embodiment, the respective members are so arranged as to allow the substrate to expand or shrink relatively greatly in the direction parallel to the gate lines 2 as described above. Accordingly, the alignment margin ΔX for the direction parallel to the gate lines 2 should preferably be set greater than the alignment margin ΔY for the direction vertical to the gate lines 2. For that reason, in this embodiment, each extension of the gate lines 2 has a length greater than the gate line pitch.

For the foregoing embodiments, the present invention has been described as being applied to making an active matrix substrate using a plastic substrate. However, the application of the present invention is not limited thereto. It is true that the present invention achieves remarkable effects when applied to a fabrication process that uses an expandable and shrinkable substrate like a plastic substrate. However, the present invention is also applicable sufficiently effectively to a non-plastic (e.g., glass) substrate. This is because even in such a situation, the present invention weakens the unwanted effects of misalignment among other things. For example, the present invention is applicable particularly effectively to fabricating a large-size display panel using an exposure system with low alignment accuracy.

It should be noted that the active matrix substrate of the present invention is also applicable very effectively to various other types of display devices (including a display device that utilizes organic electroluminescence (EL)), not just LCDs.

Also, a drain electrode 9 "crossing" its underlying gate line 2 herein refers to not only a situation where the drain electrode 9 extends totally across the gate line 2 but also a situation where the edge 9E of the drain electrode 9 matches with the lower side edge of the gate line 2 as shown in FIG. 4A.

In an active matrix substrate according to the present invention, a conductive member for connecting a pixel electrode to a thin-film transistor extends so far as to cross a gate line located distant from the pixel electrode. Accordingly, an alignment margin allowed between the gate line and the conductive member increases so much that a greatly expandable and shrinkable substrate, like a plastic substrate, can be used.

In an embodiment where a semiconductor layer for thin-film transistors has been self-aligned with a gate line (or gate electrodes), no mask alignment is needed between the semiconductor layer and gate line (or gate electrodes) in the fabrication process. Accordingly, even if the substrate has expanded or shrunk greatly, the semiconductor layer for thin-film transistors will not be misaligned with the gate line (or gate electrodes).

In another embodiment where a channel protective layer has been formed over the semiconductor layer for thin-film transistors, the channel regions in the semiconductor layer are not etched in the fabrication process, thus suppressing the variation in transistor characteristic. Also, in an embodiment where the channel protective layer has been self-aligned with the gate line (or gate electrodes), no mask alignment is needed between the channel protective layer and gate line (or gate electrodes) in the fabrication process. Accordingly, even if the substrate has expanded or shrunk greatly, the channel protective layer will not be misaligned with the gate line (or gate electrodes).

In an embodiment where the gate line (gate electrodes) is made of an opaque metal, the semiconductor layer or channel protective layer can be formed by a backside exposure process.

In an embodiment where the thin-film transistors are covered with a black matrix, the amount of OFF-state leakage currents, flowing through the thin-film transistors exposed to externally incoming light, can be reduced.

According to an inventive method of making an active matrix substrate, thin-film transistors can be formed over, and self-aligned with, a gate line by a backside exposure process. Thus, even if the substrate has expanded or shrunk, there is no need to concern about the misalignment between the thin-film transistors and the gate line. Also, in the layout adopted for the present invention, data lines and conductive members, functioning as source and drain electrodes, respectively, can cross the gate lines easily. For that reason, even if the substrate has expanded or shrunk greatly, properly operable thin-film transistors still can be formed. As a result, an active matrix substrate can be made using a plastic substrate although it has been considered difficult to do so.

An inventive display device includes the active matrix substrate of the present invention, and can perform a display operation using a lightweight plastic substrate with excellent shock resistance.

What is claimed is:

1. A method of making an active matrix substrate, comprising the steps of:
   a) depositing a semiconductor film over a base substrate;
   b) depositing a first conductive film over the semiconductor film;
   c) patterning the first conductive and semiconductor films, thereby forming a plurality of data lines, a plurality of pixel electrodes and a plurality of conductive members so that parts of the semiconductor film, located between each said data line and associated ones of the conductive members, are not removed but left, wherein each said conductive member extends from associated one of the pixel electrodes along associated one of the data lines;
   d) depositing an insulating film over the base substrate;
   e) depositing a second conductive film over the insulating film; and
   f) patterning the second conductive film, thereby forming a plurality of gate lines, which cross the data lines, the pixel electrodes and the conductive members, and etching away the parts of the semiconductor film located between each said data line and the associated conductive members entirely except some of the parts of the semiconductor film that are located under the gate lines.

2. The method of claim 1, wherein the step c) comprises:
   defining a resist mask, which includes: relatively thick portions that will define the data lines, the pixel electrodes and the conductive members; and relatively thin portions, each of which will define a region between associated one of the data lines and associated ones of the conductive members;
   etching away parts of the first conductive and semiconductor films that are not covered with the resist mask;
   removing the relatively thin portions from the resist mask; and
   etching away other parts of the first conductive film, which have been covered with the relatively thin portions of the resist mask.

* * * * *

UNITED STATES PATENT AND TRADEMARK OFFICE
CERTIFICATE OF CORRECTION

PATENT NO. : 7,829,391 B2  
APPLICATION NO. : 12/658555  
DATED : November 9, 2010  
INVENTOR(S) : Yoshihiro Okada et al.

Page 1 of 1

It is certified that error appears in the above-identified patent and that said Letters Patent is hereby corrected as shown below:

Title Page, Item (62) Related U.S. Application Data should read,

-- Related U.S. Application Data

(62) Division of application No. 12/283,893, filed Sep. 16, 2008, now Pat. No. 7,696,516; which is a division of application No. 11/450,810, filed June 8, 2006, now Pat No. 7,459,723; which is a division of application No. 10/921,620, filed Aug. 19, 2004, now Pat. No. 7,126,157; which is a division of application No. 09/939,479, filed Aug. 24, 2001, now Pat. No. 6,797,982 --.

Signed and Sealed this  
Tenth Day of May, 2011

David J. Kappos  
*Director of the United States Patent and Trademark Office*